United States Patent
Brown et al.

(10) Patent No.: US 7,239,219 B2
(45) Date of Patent: Jul. 3, 2007

(54) MINIATURE RF AND MICROWAVE COMPONENTS AND METHODS FOR FABRICATING SUCH COMPONENTS

(75) Inventors: Elliott R. Brown, Glendale, CA (US); John D. Evans, Arlington, VA (US); Christopher A. Bang, San Diego, CA (US); Adam L. Cohen, Los Angeles, CA (US); Michael S. Lockard, Lake Elizabeth, CA (US); Dennis R. Smalley, Newhall, CA (US); Morton Grosser, Menlo Park, CA (US)

(73) Assignee: Microfabrica Inc., Van Nuys, CA (US)

( * ) Notice: Subject to any disclaimer, the term of this patent is extended or adjusted under 35 U.S.C. 154(b) by 98 days.

(21) Appl. No.: 10/607,931

(22) Filed: Jun. 27, 2003

(65) Prior Publication Data

US 2004/0140862 A1    Jul. 22, 2004

Related U.S. Application Data

(63) Continuation-in-part of application No. 10/434,519, filed on May 7, 2003, and a continuation-in-part of application No. 10/434,497, filed on May 7, 2003, and a continuation-in-part of application No. 10/434,295, filed on May 7, 2003, and a continuation-in-part of application No. 10/434,103, filed on May 7, 2003, and a continuation-in-part of application No. 10/309,521, filed on Dec. 3, 2002.

(60) Provisional application No. 60/476,554, filed on Jun. 6, 2003, provisional application No. 60/464,504, filed on Apr. 21, 2003, provisional application No. 60/430,809, filed on Dec. 3, 2002, provisional application No. 60/415,374, filed on Oct. 1, 2002, provisional application No. 60/392,531, filed on Jun. 27, 2002, provisional application No. 60/379,184, filed on May 7, 2002, provisional application No. 60/379,182, filed on May 7, 2002, provisional application No. 60/379,133, filed on May 7, 2002, provisional application No. 60/379,130, filed on May 7, 2002, provisional application No. 60/340,372, filed on Dec. 6, 2001, provisional application No. 60/338,638, filed on Dec. 3, 2001.

(51) Int. Cl.
*H01P 9/00* (2006.01)
*H01P 3/00* (2006.01)
*H01P 3/06* (2006.01)

(52) U.S. Cl. ............... 333/156; 333/243; 333/160
(58) Field of Classification Search ........... 333/237, 333/243, 160, 156; 29/828; 174/75 C, 71 C, 174/88 C See application file for complete search history.

(56) References Cited

U.S. PATENT DOCUMENTS

| | | | |
|---|---|---|---|
| 2,976,534 A * | 3/1961 | Kampinsky | 343/756 |
| 3,160,826 A * | 12/1964 | Marcatili | 330/61 A |
| 3,729,740 A * | 4/1973 | Nakahara et al. | 343/713 |
| 3,963,999 A * | 6/1976 | Nakajima et al. | 333/237 |
| 4,021,789 A | 5/1977 | Furman et al. | 365/182 |
| 4,127,831 A | 11/1978 | Riblet | 333/10 |
| 4,647,878 A * | 3/1987 | Landis et al. | 333/115 |
| 4,673,904 A * | 6/1987 | Landis | 333/238 |
| 4,776,087 A * | 10/1988 | Cronin et al. | 29/828 |
| 4,816,618 A * | 3/1989 | Bongianni | 174/102 R |
| 4,958,222 A | 9/1990 | Takakura et al. | 357/84 |
| 5,190,637 A | 3/1993 | Guckel | 205/118 |
| 5,426,399 A | 6/1995 | Matsubayashi et al. | 333/1 |
| 5,455,545 A * | 10/1995 | Garcia | 333/26 |
| 5,652,557 A | 7/1997 | Ishikawa | 333/243 |
| 6,008,102 A | 12/1999 | Alford et al. | 438/381 |
| 6,027,630 A | 2/2000 | Cohen | 205/135 |
| 6,417,742 B1* | 7/2002 | Enokuma | 333/21 A |
| 6,480,163 B1* | 11/2002 | Knop et al. | 343/770 |
| 6,523,252 B1* | 2/2003 | Lipponen | 29/828 |
| 6,572,742 B1 | 6/2003 | Cohen | 204/297.5 |
| 6,724,277 B2* | 4/2004 | Holden et al. | 333/125 |
| 2003/0127336 A1 | 7/2003 | Cohen et al. | 205/118 |
| 2003/0221968 A1 | 12/2003 | Cohen et al. | 205/118 |
| 2003/0222738 A1 | 12/2003 | Brown et al. | 333/160 |
| 2003/0234179 A1 | 12/2003 | Bang | 205/118 |

| | | | |
|---|---|---|---|
| 2004/0000489 A1 | 1/2004 | Zhang et al. | 205/118 |
| 2004/0004001 A1 | 1/2004 | Cohen et al. | 205/118 |
| 2004/0004002 A1 | 1/2004 | Thompson et al. | 205/118 |
| 2004/0007468 A1 | 1/2004 | Cohen et al. | 205/118 |
| 2004/0020782 A1 | 2/2004 | Cohen et al. | 205/220 |
| 2004/0065550 A1 | 4/2004 | Zhang | 205/135 |
| 2004/0065555 A1 | 4/2004 | Zhang | 205/118 |
| 2004/0263290 A1* | 12/2004 | Sherrer et al. | 333/243 |

FOREIGN PATENT DOCUMENTS

| | | |
|---|---|---|
| EP | 0313058 | 4/1989 |
| JP | 1-125956 | 5/1989 |
| JP | 6-232217 | 8/1994 |
| JP | 8-274167 | 10/1996 |
| RU | 2046469 | 10/1995 |
| WO | WO 00/39854 | 7/2000 |
| WO | WO 03/049514 | 6/2003 |

OTHER PUBLICATIONS

Cohen, et al., "EFAB: Batch Production of Functional, Fully-Dense Metal Parts with Micron-Scale Features", Proc. 9th Solid Freeform Fabrication, The University of Texas at Austin, Aug. 1998, p. 161.

Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 1999, p. 244.

"Microfabrication—Rapid Prototyping's Killer Application", Rapid Prototyping Report, CAD/CAM Publishing, Inc., Jun. 1999, pp. 1-5.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999.

Adam L. Cohen, "Electrochemical Fabrication (EFABTM)", Chapter 19 of the MEMS Handbook, edited by Mohamed Gad-El-Hak, CRC Press, 2002, pp. 19/1-19/23.

J. A. Bishop, et al., "Monolithic Coaxial Transmission Lines for mm-wave ICs", High Speed Semiconductor Devices and Circuits, 1991., Proceeding IEEE/Cornell Conference on Advanced Concepts in Ithaca, NY, USA Aug. 5-7, 1991, pp. 252-260.

Jeong Inho, et al., "Monolithic Implementation of Air-Filled Rectangular Coaxial Line", Electronics Letters, IEE Stevenage, GB, vol. 36, No. 3, Feb. 3, 2000, pp. 228-230.

* cited by examiner

*Primary Examiner*—Robert Pascal
*Assistant Examiner*—Kimberly E Glenn
(74) *Attorney, Agent, or Firm*—Dennis R. Smalley

(57) ABSTRACT

RF and microwave radiation directing or controlling components are provided that may be monolithic, that may be formed from a plurality of electrodeposition operations and/or from a plurality of deposited layers of material, that may include switches, inductors, antennae, transmission lines, filters, hybrid couplers, antenna arrays and/or other active or passive components. Components may include non-radiation-entry and non-radiation-exit channels that are useful in separating sacrificial materials from structural materials. Preferred formation processes use electrochemical fabrication techniques (e.g. including selective depositions, bulk depositions, etching operations and planarization operations) and post-deposition processes (e.g. selective etching operations and/or back filling operations).

34 Claims, 62 Drawing Sheets

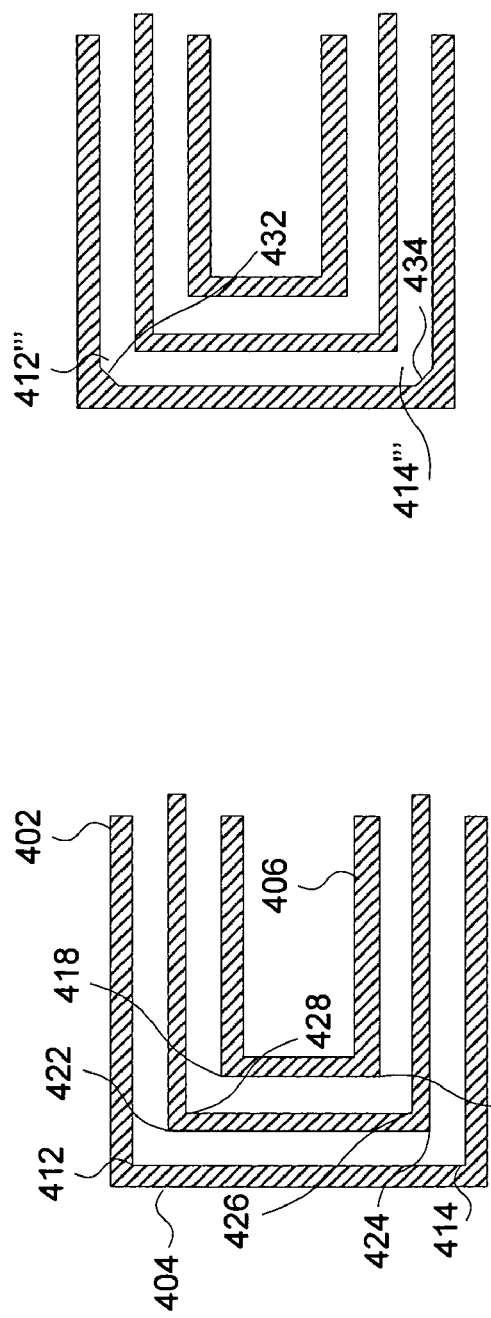
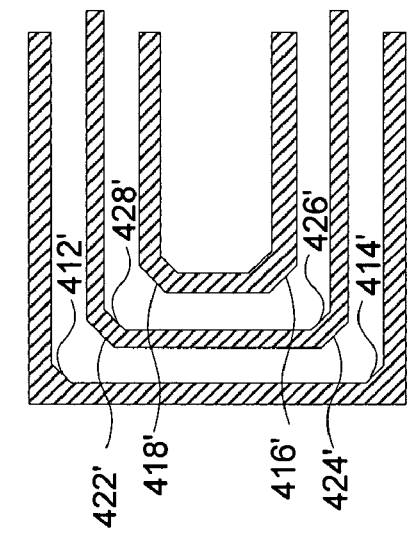
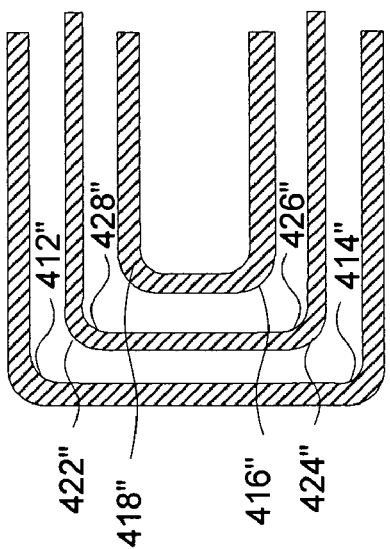
Figure 10(a)
Figure 10(b)
Figure 10(c)
Figure 10(d)

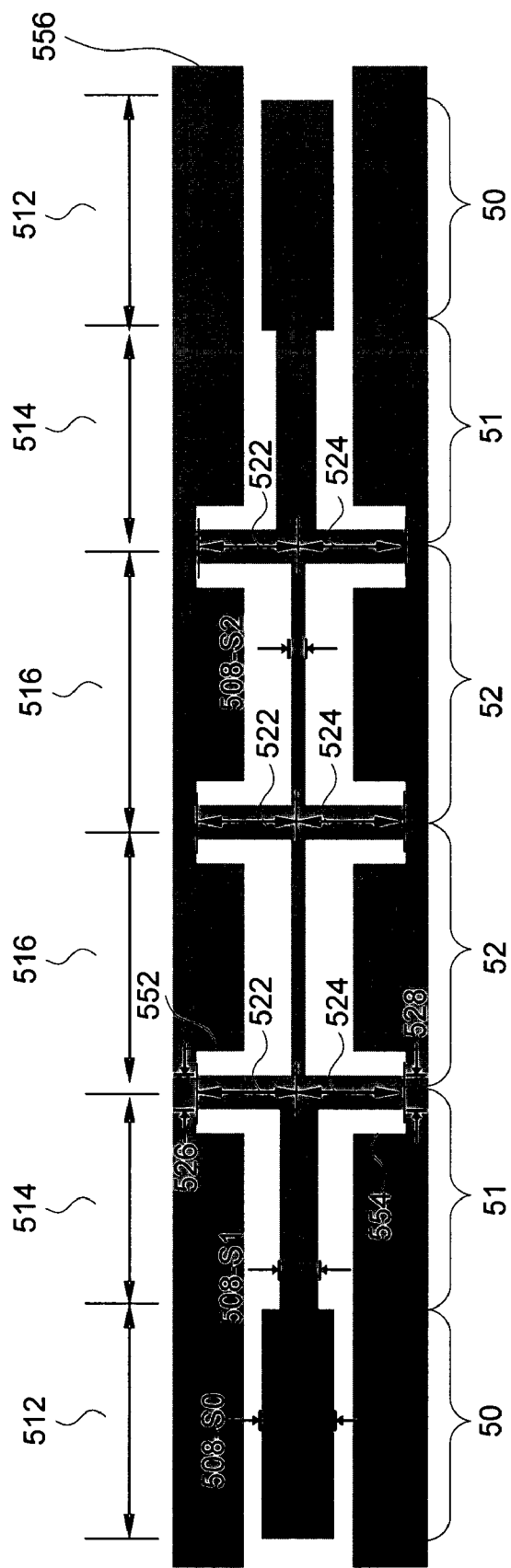
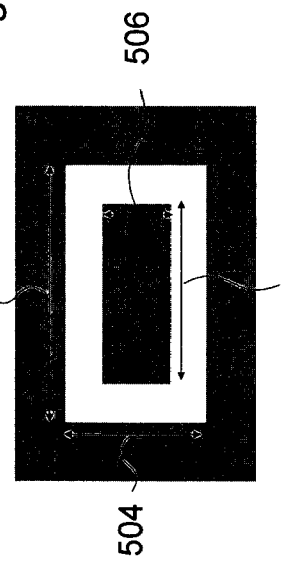
Figure 12(a)
Figure 12(b)

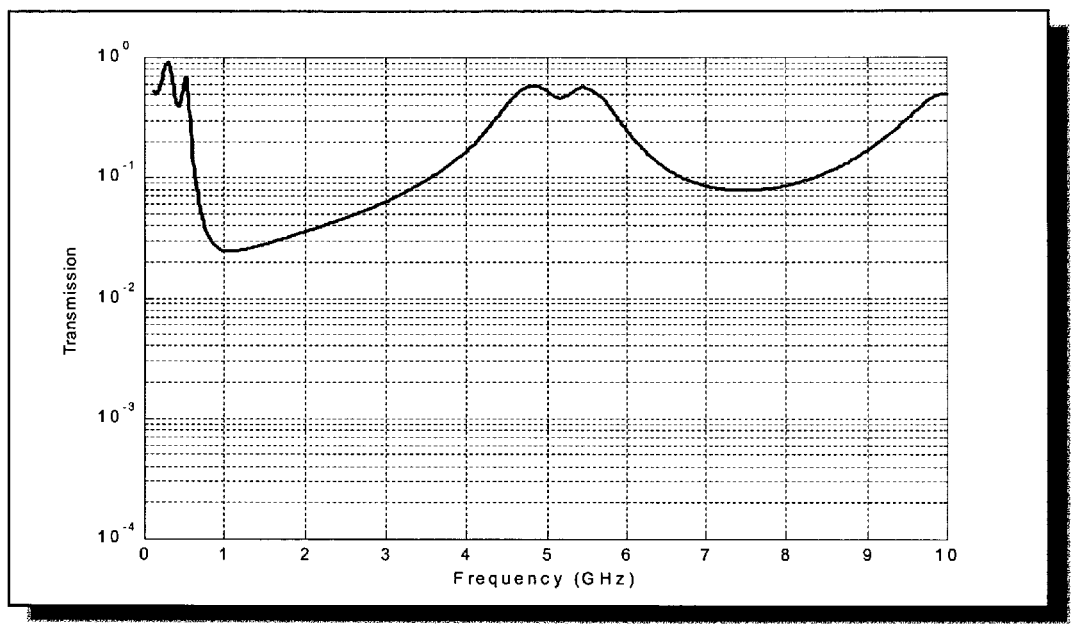
Ideal conductor
Figure 15(b)  Rinner1 = 0.01 mm
Rinner2 = 0.11 mm
Router = 0.12 mm

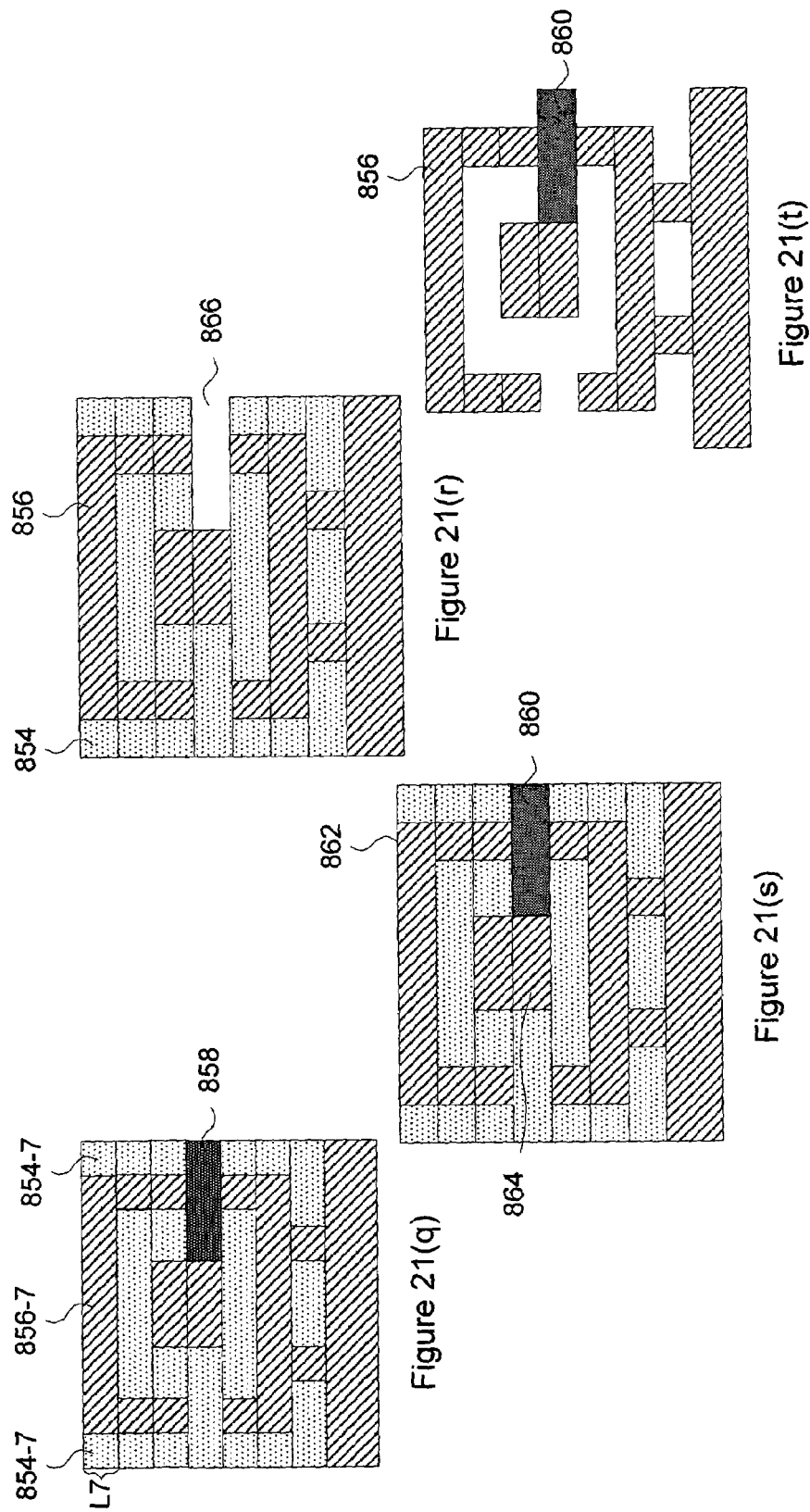

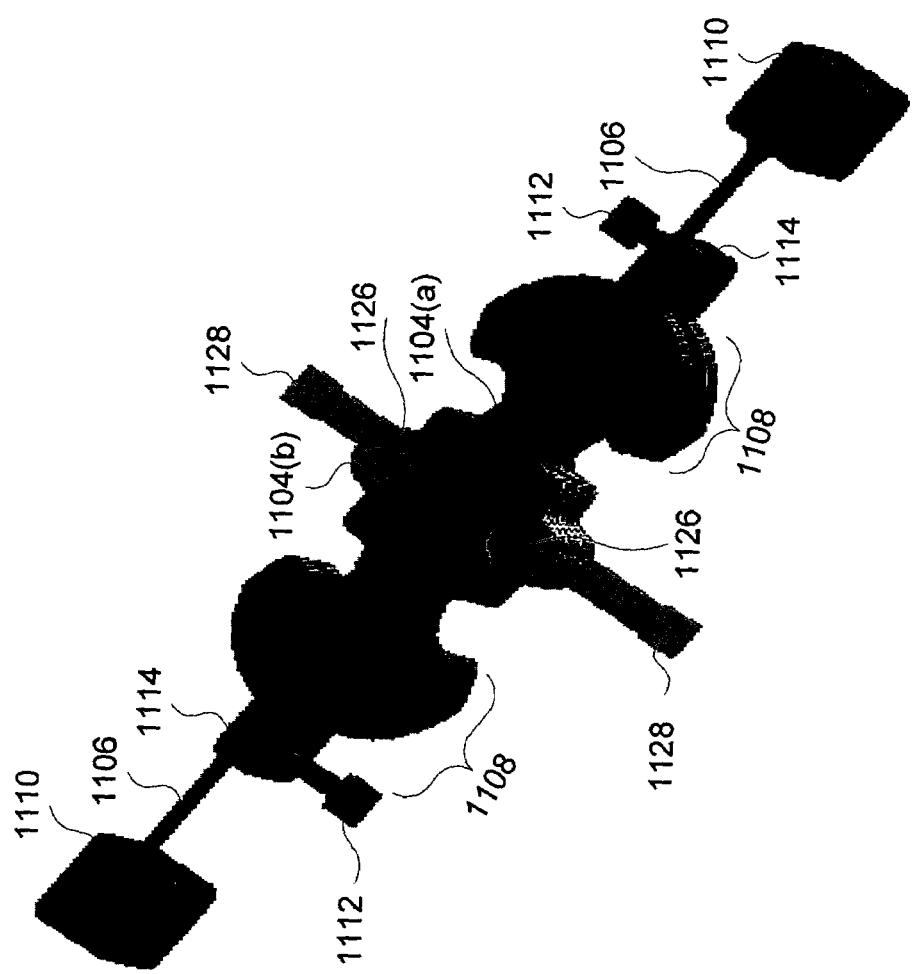

$R_1$ = 200 micron
$R_2$ = 280 micron*
$R_3$ = 399 micron
$R_4$ = 561 micron
$R_5$ = 680 micron
$R_6$ = 760 micron

MINIATURE RF AND MICROWAVE COMPONENTS AND METHODS FOR FABRICATING SUCH COMPONENTS

RELATED APPLICATIONS

This application claims benefit of U.S. Provisional Patent Application Nos. 60/392,531, filed Jun. 27, 2002; 60/415,374, filed Oct. 1, 2002; 60/464,504, filed Apr. 21, 2003; and 60/476,554, filed on Jun. 6, 2003; it is also a continuation-part of U.S. patent application Ser. No. 10/309,521 filed on Dec. 3, 2002; and Ser. Nos. 10/434,497, 10/434,103, 10/434,295, and 10/434,519 each filed on May 7, 2003. U.S. patent application Ser. No. 10/309,521 in turn claims benefit of U.S. Provisional Patent Application Nos. 60/338,638 filed on Dec. 3, 2001; 60/340,372 filed on Dec. 6, 2001; 60/379,133 filed on May 7, 2002; 60/379,182 filed on May 7, 2002; 60/379,184 filed on May 7, 2002; 60/415,374 filed on Oct. 1, 2002; 60/379,130 filed on May 7, 2002 and 60/392,531 filed on Jun. 27, 2002. U.S. patent application Ser. No. 10/434,497 in turn claims benefit of U.S. Provisional Patent Application Nos. 60/379,184, filed May 7, 2002; and 60/392,531, filed Jun. 27, 2002. U.S. patent application Ser. No. 10/434,103 in turn claims benefit of U.S. Provisional Patent Application Nos. 60/379,182, filed May 7, 2002; and 60/430,809, filed Dec. 2, 2002. U.S. patent application Ser. No. 10/434,295 in turn claims benefit of U.S. Provisional Patent Application No. 60/379,133, filed May 7, 2002. U.S. patent application Ser. No. 10/434,519 in turn claims benefit of U.S. Provisional Patent Application No. 60/379,130, filed May 7, 2002. Each of these above applications is incorporated herein by reference as if set forth in full.

FIELD OF THE INVENTION

Embodiments of this invention relate to the field of electrical devices and their manufacture while specific embodiments relate to RF and microwave devices and their manufacture. More particularly embodiments of this invention relate to miniature passive RF and microwave devices (e.g. filters, transmission lines, delay lines, and the like) which may be manufactured using, at least in part, a multi-layer electrodeposition technique known as Electrochemical Fabrication.

BACKGROUND

A technique for forming three-dimensional structures (e.g. parts, components, devices, and the like) from a plurality of adhered layers was invented by Adam L. Cohen and is known as Electrochemical Fabrication. It is being commercially pursued by MEMGen® Corporation of Burbank, Calif. under the name EFAB™. This technique was described in U.S. Pat. No. 6,027,630, issued on Feb. 22, 2000. This electrochemical deposition technique allows the selective deposition of a material using a unique masking technique that involves the use of a mask that includes patterned conformable material on a support structure that is independent of the substrate onto which plating will occur. When desiring to perform an electrodeposition using the mask, the conformable portion of the mask is brought into contact with a substrate while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of MEMGen® Corporation of Burbank, Calif. such masks have come to be known as INSTANT MASKS™ and the process known as INSTANT MASKING™ or INSTANT MASK™ plating. Selective depositions using conformable contact mask plating may be used to form single layers of material or may be used to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

1. A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p 161, August 1998.
2. A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p 244, January 1999.
3. A. Cohen, "3-D Micromachining by Electrochemical Fabrication", Micromachine Devices, March 1999.
4. G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.
5. F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST '99), June 1999.
6. A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.
7. F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November 1999.
8. A. Cohen, "Electrochemical Fabrication (EFAB™)", Chapter 19 of The MEMS Handbook, edited by Mohamed Gad-El-Hak, CRC Press, 2002.
9. "Microfabrication—Rapid Prototyping's Killer Application", pages 1–5 of the Rapid Prototyping Report, CAD/CAM Publishing, Inc., June 1999.

The disclosures of these nine publications are hereby incorporated herein by reference as if set forth in full herein.

The electrochemical deposition process may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate.
2. Then, blanket depositing at least one additional material by electrodeposition so that the additional deposit covers both the regions that were previously selectively deposited onto, and the regions of the substrate that did not receive any previously applied selective depositions.

3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to the immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated. At least one CC mask is needed for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of the substrate (or onto a previously formed layer or onto a previously deposited portion of a layer) on which deposition is to occur. The pressing together of the CC mask and substrate occur in such a way that all openings, in the conformable portions of the CC mask contain plating solution. The conformable material of the CC mask that contacts the substrate acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1(a)–1(c). FIG. 1(a) shows a side view of a CC mask 8 consisting of a conformable or deformable (e.g. elastomeric) insulator 10 patterned on an anode 12. The anode has two functions. FIG. 1(a) also depicts a substrate 6 separated from mask 8. One is as a supporting material for the patterned insulator 10 to maintain its integrity and alignment since the pattern may be topologically complex (e.g., involving isolated "islands" of insulator material). The other function is as an anode for the electroplating operation. CC mask plating selectively deposits material 22 onto a substrate 6 by simply pressing the insulator against the substrate-then electrodepositing material through apertures 26a and 26b in the insulator as shown in FIG. 1(b). After deposition, the CC mask is separated, preferably non-destructively, from the substrate 6 as shown in FIG. 1(c). The CC mask plating process is distinct from a "through-mask" plating process in that in a through-mask plating process the separation of the masking material from the substrate would occur destructively. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Another example of a CC mask and CC mask plating is shown in FIGS. 1(d)–1(f). FIG. 1(d) shows an anode 12' separated from a mask 8' that comprises a patterned conformable material 10' and a support structure 20. FIG. 1(d) also depicts substrate 6 separated from the mask 8'. FIG. 1(e) illustrates the mask 8' being brought into contact with the substrate 6. FIG. 1(f) illustrates the deposit 22' that results from conducting a current from the anode 12' to the substrate 6. FIG. 1(g) illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the fabrication of the substrate on which plating is to occur (e.g. separate from a three-dimensional (3D) structure that is being formed). CC masks may be formed in a variety of ways, for example, a photolithographic process may be used. All masks can be generated simultaneously, prior to structure fabrication rather than during it. This separation makes possible a simple, low-cost, automated, self-contained, and internally-clean "desktop factory" that can be installed almost anywhere to-fabricate 3D structures, leaving any required clean room processes, such as photolithography to be performed by service bureaus or the like.

An example of the electrochemical fabrication process discussed above is illustrated in FIGS. 2(a)–2(f). These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2(*a*), illustrates that the passing of current causes material 2 within the plating solution and material 2 from the anode 12 to be selectively transferred to and plated on the cathode 6. After electroplating the first deposition material 2 onto the substrate 6 using CC mask 8, the CC mask 8 is removed as shown in FIG. 2(*b*). FIG. 2(*c*) depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2(*d*). After repetition of this process for all layers, the multi-layer structure 20 formed of the second material 4 (i.e. structural material) is embedded in first material 2 (i.e. sacrificial material) as shown in FIG. 2(*e*). The embedded structure is etched to yield the desired device, i.e. structure 20, as shown in FIG. 2(*f*).

Various components of an exemplary manual electrochemical fabrication system 32 are shown in FIGS. 3(*a*)–3(*c*). The system 32 consists of several subsystems 34, 36, 38, and 40. The substrate holding subsystem 34 is depicted in the upper portions of each of FIGS. 3(*a*) to 3(*c*) and includes several components: (1) a carrier 48, (2) a metal substrate 6 onto which the layers are deposited, and (3) a linear slide 42 capable of-moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3(*a*) includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source for driving the CC masking process.

The blanket deposition subsystem 38 is shown in the lower portion of FIG. 3(*b*) and includes several components: (1) an anode 62, (2) an electrolyte tank 64 for holding plating solution 66, and (3) frame 74 on which the feet 68 of subsystem 34 may sit. Subsystem 38 also includes appropriate electrical connections (not shown) for connecting the anode to an appropriate power supply for driving the blanket deposition process.

The planarization subsystem 40 is shown in the lower portion of FIG. 3(*c*) and includes a lapping plate 52 and associated motion and control systems (not shown) for planarizing the depositions.

In addition to teaching the use of CC masks for electrodeposition purposes, the '630 patent also teaches that the CC masks may be placed against a substrate with the polarity of the voltage reversed and material may thereby be selectively removed from the substrate. It indicates that such removal processes can be used to selectively etch, engrave, and polish a substrate, e.g., a plaque.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal layers. This patent teaches the formation of metal structure utilizing mask exposures. A first layer of a primary metal is electroplated onto an exposed plating base to fill a void in a photoresist, the photoresist is then removed and a secondary metal is electroplated over the first layer and over the plating base. The exposed surface of the secondary metal is then machined down to a height which exposes the first metal to produce a flat uniform surface extending across the both the primary and secondary metals. Formation of a second layer may then begin by applying a photoresist layer over the first layer and then repeating the process used to produce the first layer. The process is then repeated until the entire structure is formed and the secondary metal is removed by etching. The photoresist is formed over the plating base or previous layer by casting and the voids in the photoresist are formed by exposure of the photoresist through a patterned mask via X-rays or UV radiation.

Electrochemical Fabrication provides the ability to form prototypes and commercial quantities of miniature objects (e.g. mesoscale and microscale objects), parts, structures, devices, and the like at reasonable costs and in reasonable times. In fact, Electrochemical Fabrication is an enabler for the formation of many structures that were hitherto impossible to produce. Electrochemical Fabrication opens a new design and product spectrum in many industrial fields. Even though electrochemical fabrication offers this new capability and it is understood that Electrochemical Fabrication techniques can be combined with designs and structures known within various fields to produce new structures, certain uses for Electrochemical Fabrication provide designs, structures, capabilities and/or features not known or obvious in view of the state of the art within the field or fields of a specific application.

A need exists in the field of electrical components and systems and particularly within the field of RF and microwave components and systems for devices having reduced size, reduced manufacturing cost, enhanced reliability, application to different frequency ranges, and/or other enhanced features, and the like.

SUMMARY

An object of various aspects of the invention is to provide RF components having reduced size.

An object of various aspects of the invention is to provide RF components producible with decreased manufacturing cost.

An object of various aspects of the invention is to provide RF components with enhanced reliability.

An object of various aspects of the invention is to provide RF components with design features making them applicable for use within more frequency bands.

An object of various aspects of the invention is to provide RF components with features that provide enhanced capability, such as greater bandwidth.

Other objects and advantages of various aspects of the invention will be apparent to those of skill in the art upon review of the teachings herein. The various aspects of the invention, set forth explicitly herein or otherwise ascertained from the teachings herein, may address any one of the above objects alone or in combination, or alternatively may not address any of the objects set forth above but instead address some other object ascertained from the teachings herein. It is not intended that all of these objects be addressed by any single aspect of the invention even though that may be the case with regard to some aspects.

A first aspect of the invention provides a coaxial RF or microwave component that guides or controls radiation, including: at least one RF or microwave radiation entry port in a conductive structure; at least one RF or microwave radiation exit port in the conductive structure; at least one passage substantially bounded on the sides by the conductive structure through which RF or microwave radiation passes when traveling from the at least one entry port to the at least one exit port; a central conductor extending along a length of the at least one passage from the entry port to the exit port; and wherein the conductive structure includes one or more apertures which extend from the passage to an outer region, wherein the apertures have dimensions that are no larger than the greater of 1/10 of the wavelength or 200 microns and which are not intended to pass significant RF radiation.

A second aspect of the invention provides a method of manufacturing a microdevice, including: depositing a plurality of adhered layers of material, wherein the deposition of each layer of material includes, deposition of at least a first material; deposition of at least a second material; and removing of at least a portion of the first or second material after deposition of the plurality of layers; wherein a structure resulting from the deposition and the removal provides at least one structure that can function as an RF or microwave control, guidance, transmission, or reception component, and includes at least one RF or microwave radiation entry port in a conductive structure; at least one RF or microwave radiation exit port in the conductive structure; at least one passage substantially bounded on the sides by the conductive structure through which RF or microwave radiation passes when traveling from the at least one entry port to the at least one exit port; a central conductor extending along a length of the at least one passage from the entry port to the exit port; and wherein the conductive structure includes one or more apertures which extend from the passage to an outer region, wherein the apertures have dimensions that are no larger than the greater of 1/10 of the wavelength or 200 microns and which are not intended to pass significant RF radiation.

A third aspect of the invention provides a four port hybrid coupler including a plurality of adhered layers of material including four microminiature coaxial elements, a first of the four coaxial element extending between two of four ports, and a second of the coaxial elements extending between the other two of the four ports, while the remaining two coaxial elements extend between the first and second coaxial elements, wherein at least a portion of the length of least one of the coaxial elements is arranged in a serpentine form.

A fourth aspect of the invention provides a method of manufacturing a circuit for supplying signals to a passive array of N antenna elements to produce a plurality of beams, including: depositing a plurality of adhered layers of material to form (N/2)log 2N four port hybrid couplers each including four microminiature coaxial elements, each coaxial element extending between a respective pair of ports of the hybrid coupler such that a pair of coaxial elements is coupled to each port; and connecting at least some of the hybrid couplers to other hybrid couplers via phase shifting components to form a Butler matrix.

A fifth aspect of the invention provides a Butler matrix for supplying signals to a passive array of N antenna elements to produce a plurality of beams, including (N/2)log 2N four port hybrid couplers wherein each of the four hybrid couples include four microminiature coaxial elements, a first of the four coaxial elements extending between two of four ports, and a second of the coaxial elements extending between the other two of the four ports; while the remaining two coaxial elements extend between the first and second coaxial elements, wherein at least a portion of the length of least one of the coaxial elements is arranged in a serpentine form.

It is an aspect of the invention to provide a microminiature RF or microwave coaxial component, that includes an inner conductor that has an axis which is substantially coaxial with an axis an outer conductor wherein the inner and outer conductors are spaced from one another by a dielectric gap wherein a minimum cross-sectional sectional dimension from an inside wall of the outer conductor to an opposing inside wall of the outer conductor is less than about 200 µm. In a specific variation of this aspect of the invention the outer conductor has a substantially rectangular cross-sectional configuration.

It is an aspect of the invention to provide a coaxial RF or microwave component that preferentially passes a radiation in a desired frequency band, including: at least one RF or microwave radiation entry port in a conductive structure; at least one RF or microwave radiation exit port in the conductive structure; at least one passage, substantially bounded on the sides by the conductive structure, through which RF or microwave radiation passes when traveling from the at least one entry port to the at least one exit port; a central conductor extending along the at least one passage from the entry port to the exit port; and at least one conductive spoke extending between the central conductor and the conductive structure at each of a plurality of locations where successive locations along the length of the passage are spaced by approximately one-half of a propagation wavelength, or an integral multiple thereof, within the passage for a frequency to be passed by the component, wherein one or more of the following conditions are met (1) the central conductor, the conductive structure, and the conductive spokes are monolithic, (2) a cross-sectional dimension of the passage perpendicular to a propagation direction of the radiation along the passage is less than about 1 mm, more preferably less than about 0.5 mm, and most preferably less than about 0.25 mm, (3) more than about 50% of the passage is filled with a gaseous medium, more preferably more than about 70% of the passage is filled with a gaseous medium, and most preferably more than about 90% of the passage is filled with a gaseous medium, (4) at least a portion of the conductive portions of the component are formed by an electrodeposition process, (5) at least a portion of the conductive portions of the component are formed from a plurality of successively deposited layers, (6) at least a portion of the passage has a generally rectangular shape, (7) at least a portion of the central conductor has a generally rectangular shape, (8) the passage extends along a two-dimensional non-linear path, (9) the passage extends along a three-dimensional path, (10) the passage includes at least one curved region and a side wall of the passage in the curved region has a nominally smaller radius than an opposite side of the passage in the curved region and is provided with a plurality of surface oscillations having smaller radii, (11) the conductive structure is provided with channels at one or more locations where the electrical field at a surface of the conductive structure, if it were there, would have been less than about 20% of its maximum value within the passage, more preferably less than 10% of its maximum value within the passage, even more preferably less than 5% of its maximum value within the passage, and most preferably where the electrical field would have been approximately zero, (12) the conductive structure is provided with patches of a different conductive material at one or more locations where the electrical field at the surface of the conductive structure, if it were there, would have been less than about 20% of its maximum value within the passage more preferably less than about 10% of its maximum value within the passage, even more preferably less than about 5% of its maximum value within the passage, and most preferably where the electrical field would have been approximately zero, (13) mitered corners are used at least some junctions for segments of the passage that meet at angles between 60° and 120°, and/or (14) the conductive spokes are spaced at an integral multiple of one-half the wavelength and bulges on the central conductor or bulges extending from the conductive structure extend into the passage at one or more locations spaced from the conductive spokes by an integral multiple of approximately one-half the wavelength.

It is an aspect of the invention to provide a coaxial RF or microwave component that preferentially passes a radiation in a desired frequency band, including: at least one RF or microwave radiation entry port in a conductive structure; at least one RF or microwave radiation exit port in the conductive structure; at least one passage, substantially bounded on the sides by the conductive structure, through which RF or microwave radiation passes when traveling from the at least one entry port to the at least one exit port; a central conductor extending along the at least one passage from the entry port to the exit port; and at a plurality of locations along a length of the passage, a pair of conductive stubs extending from approximately the same position along a length of the passage, one having an inductive property and the other having a capacitive property, each extending into a closed channel that extends from a side of the passage, wherein the successive locations along the length of the passage are spaced by approximately one-quarter of a propagation wavelength, or an integral multiple thereof, within the passage for a frequency to be passed by the component, wherein one or more of the following conditions are met (1) the central conductor, the conductive structure, and the conductive stubs are monolithic, (2) a cross-sectional dimension of the passage perpendicular to a propagation direction of the radiation along the passage is less than about 1 mm, more preferably less than about 0.5 mm, and most preferably less than about 0.25 mm, (3) more than about 50% of the passage is filled with a gaseous medium, more preferably more than about 70% of the passage is filled with a gaseous medium, and most preferably more than about 90% of the passage is filled with a gaseous medium, (4) at least a portion of the conductive portions of the component are formed by an electrodeposition process, (5) at least a portion of the conductive portions of the component are formed from a plurality of successively deposited layers, (6) at least a portion of the passage has a generally rectangular shape, (7) at least a portion of the central conductor has a generally rectangular shape, (8) the passage extends along a two-dimensional non-linear path, (9) the passage extends along a three-dimensional path, (10) the passage includes at least one curved region and a side wall of the passage in the curved region has a nominally smaller radius than an opposite side of the passage in the curved region and is provided with a plurality of surface oscillations having smaller radii, (11) the conductive structure is provided with channels at one or more locations where the electrical field at a surface of the conductive structure, if it were there, would have been less than about 20% of its maximum value within the passage, more preferably less than 10% of its maximum value within the passage, even more preferably less than 5% of its maximum value within the passage, and most preferably where the electrical field would have been approximately zero, (12) the conductive structure is provided with patches of a different conductive material at one or more locations where the electrical field at the surface of the conductive structure, if it were there, would have been less than about 20% of its maximum value within the passage more preferably less than about 10% of its maximum value within the passage, even more preferably less than about 5% of its maximum value within the passage, and most preferably where the electrical field would have been approximately zero, (13) mitered corners are used at least some junctions for segments of the passage that meet at angles between 60° and 120°, and/or (14) the conductive stubs are spaced at an integral multiple of one-quarter the wavelength and bulges on the central conductor or bulges extending from the conductive structure extend into the passage at one or more locations spaced from the conductive stubs by an integral multiple of approximately one-half the wavelength.

It is an aspect of the invention to provide a coaxial RF or microwave component that guides or controls radiation, including: at least one RF or microwave radiation entry port in a conductive structure; at least one RF or microwave radiation exit port in the conductive structure; at least one passage substantially bounded on the sides by the conductive structure through which RF or microwave radiation passes when traveling from the at least one entry port to the at least one exit port; a central conductor extending along a length of the at least one passage from the entry port to the exit port; and a branch in the passage down which a branch of the central conductor runs and in which the central conductor shorts against the conductive structure, wherein at least one of the following conditions is met (1) the branch of the central conductor, the conductive structure surrounding the branch, and a location of shorting between the central conductor and the conductive structure are monolithic, (2) at least a portion of the central conductor or the conductive structure includes material formed from a plurality of successively deposited layers, and/or (3) at least a portion of the central conductor or the conductive structure includes material formed by a plurality of electrodeposition operations.

It is an aspect of the invention to provide an RF or microwave component that guides or controls radiation, including: at least one RF or microwave radiation entry port in a conductive metal structure; at least one RF or microwave radiation exit port in the conductive metal structure; at least one-passage substantially-bounded on the sides by the conductive metal structure through which RF or microwave energy passes when traveling from the at least one entry port to the at least one exit port; and wherein at least one the following conditions are met: (1) at least a portion of the conductive metal structure includes a metal formed by a plurality of electrodeposition operations, and/or (2) at least a portion of the conductive metal structure includes a metal formed from a plurality of successively deposited layers.

It is an aspect of the invention to provide an RF or microwave component that guides or controls radiation, including: at least one RF or microwave energy entry port in a conductive metal structure; and at least one passage substantially bounded on the sides by the conductive metal structure through which RF or microwave energy passes when traveling from the at least one entry port; and wherein at least a portion of the metal structure includes a metal formed by a plurality of electrodeposition operations and/or from a plurality of successively deposited layers.

It is an aspect of the invention to provide an RF or microwave component that guides or controls radiation, that includes at least one RF or microwave radiation entry port and at least one exit port within a conductive metal structure; and at least one passage substantially bounded on the sides by the conductive metal structure through which RF or microwave energy passes when traveling from the at least one entry port; and at least one branching channel along the at least one passage, wherein the conductive metal structure surrounding the passage and the channel in proximity to a branching region of the channel from the passage is monolithic.

In a specific variation of each aspect of the invention the production includes one or more of the following operations: (1) selectively electrodepositing a first conductive material and electrodepositing a second conductive material, wherein one of the first or second conductive materials is a sacrificial material and the other is a structural material; (2) electrodepositing a first conductive material, selectively etching the first structural material to create at least one void, and electrodepositing a second conductive material to fill the at least one void; (3) electrodepositing at least one conductive material, depositing at least one flowable dielectric material, and depositing a seed layer of conductive material in preparation for formation of a next layer of electrodeposited material, and/or (4) selectively electrodepositing-a first conductive material, then electrodepositing a second conductive material, then selectively etching one of the first or second conductive materials, and then electrodepositing a third conductive material, wherein at least one of the first, second, or third conductive materials is a sacrificial material and at least one of the remaining two conductive materials is a structural material.

In a another specific variation of each aspect of the invention the production includes one or more of the following operations: (1) separating at least one sacrificial material from at least one structural material; (2) separating a first sacrificial material from (a) a second sacrificial material and (b) at least one structural material to create a void, then filling at least a portion of the void with a dielectric material, and thereafter separating the second sacrificial material from the structural material and from the dielectric material; and/or (3) filling a void in a structural material with a magnetic or conductive material embedded in a flowable dielectric material and thereafter solidifying the dielectric material.

In another specific variation of each aspect of the invention the component includes one or more of a microminiature coaxial component, a transmission line, a low pass filter, a high pass filter, a band pass filter, a reflection-based filter, an absorption-based filter, a leaky wall filter, a delay line, an impedance matching structure for connecting other functional components, a directional coupler, a power combiner (e.g., Wilkinson), a power splitter, a hybrid combiner, a magic TEE, a frequency multiplexer, or a frequency demultiplexer, a pyramidal (i.e., smooth wall) feedhorn antenna, and/or a scalar (corrugated wall) feedhorn antenna.

It is an aspect of the invention to provide an electrical device, including: a plurality of layers of successively deposited material, wherein the pattern resulting from the depositions provide at least one structure that is usable as an electrical device.

It is an aspect of the invention to provide a method of manufacturing an RF device, including: depositing a plurality of adhered layers of material, wherein the deposition of each layer of material comprises, selective deposition of at least a first material; deposition of at least a second material; and planarization of at least a portion of the deposited material; removal of at least a portion of the first or second material after deposition of the plurality of layers; wherein a structural pattern resulting from the deposition and the removal provides at least one structure that is usable as an electrical device.

It is an aspect of the invention to provide a method of manufacturing a microdevice, including: depositing a plurality of adhered layers of material, wherein the deposition of each layer of material comprises, deposition of at least a first material; deposition of at least a second material; and removing of at least a portion of the first or second material after deposition of the plurality of layers; wherein a structure resulting from the deposition and the removal provides at least one structure that can function as (1) a toroidal inductor, (2) a switch, (3) a helical inductor, or (4) an antenna.

It is an aspect of the invention to provide an apparatus for manufacturing a microdevice, including: means for depositing a plurality of adhered layers of material, wherein the deposition of each layer of material comprises utilization of, a means for selective deposition of at least a first material; a means for deposition of at least a second material; and means for removing at least a portion of the first or second material after deposition of the plurality of layers; wherein a structure resulting from use of the means for depositing and the means for removing provides at least one structure that can function as (1) a toroidal inductor, (2) a switch, (3) a helical inductor, or (4) an antenna.

It is an aspect of the invention to provide a microtoroidal inductor, including: a plurality of conductive loop elements configured to form at least a portion of a toroidal pattern wherein the toroidal pattern may be construed to have an inner diameter and an outer diameter and wherein at least a portion of the plurality of loops have a larger cross-sectional dimension in proximity to the outer diameter than in proximity to the inner diameter.

It is an aspect of the invention to provide a microantenna, including: an antenna that is at least in part separated from a substrate.

It is an aspect of the invention to provide a method of manufacturing an RF device, including: depositing a plurality of adhered layers of material, wherein the deposition of each layer of material comprises, selective deposition of at least a first material; deposition of at least a second material; and planarization of at least a portion of the deposited material; removing at least a portion of the first or second material after deposition of a plurality of layers; wherein a structural pattern resulting from the deposition and the removal provides at least one structure that is usable as an RF device.

Further aspects of the invention will be understood by those of skill in the art upon reviewing the teachings herein. Other aspects of the invention may involve combinations of the above noted aspects of the invention and/or addition of various features of one or more embodiments. Other aspects of the invention may involve apparatus that can be used in implementing one or more of the above method aspects of the invention. These other aspects of the invention may provide various combinations of the aspects presented above as well as provide other configurations, structures, functional relationships, and processes that have not been specifically set forth above.

BRIEF DESCRIPTION OF THE DRAWINGS

FIGS. 10(a)–10(d) depict plan views of the central portion, along the length of horseshoe-shaped coaxial transmission lines with varying degrees of mitering.

FIG. 12(a) depicts a plan view (from the top) of the central portion, along the length, of a linear three-pole band pass coaxial filter using pairs of stubs to form each pole.

FIG. 12(b) depicts an end view of the filter of FIG. 12(a) illustrating the rectangular configuration of the structure.

FIGS. 15(a)–15(d) illustrate plots of transmission versus frequency according to mathematical models for various filter designs.

FIGS. 35(a) and 35(b) depict a perspective view and a side view, respectively, of an example of a variable capacitor 1102.

DETAILED DESCRIPTION

FIGS. 1(a)–1(g), 2(a)–2(f), and 3(a)–3(c) illustrate various features of one form of electrochemical fabrication that are known. Other electrochemical fabrication techniques are set forth in the '630 patent referenced above, in the various previously incorporated publications, in various other patents and patent applications incorporated herein by reference, still others may be derived from combinations of various approaches described in these publications, patents, and applications, or are otherwise known or ascertainable by those of skill in the art from the teachings set forth herein.

Figure 1A:
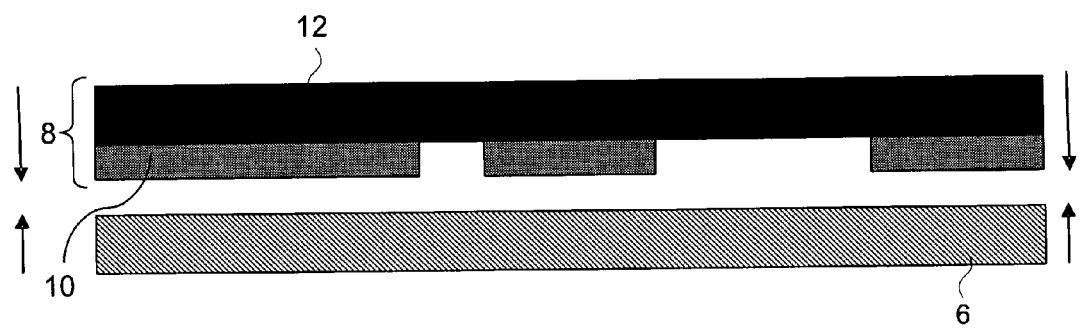
FIGS. 1(a)–1(c) schematically depict side views of various stages of a CC mask plating process, while FIGS. 1(d)–(g) schematically depict a side views of various stages of a CC mask plating process using a different type of CC mask.
Figure 1B:
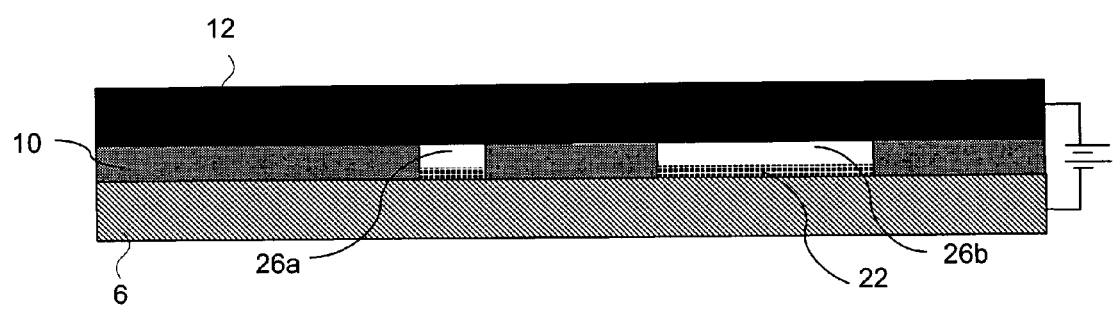
Figure 1C:
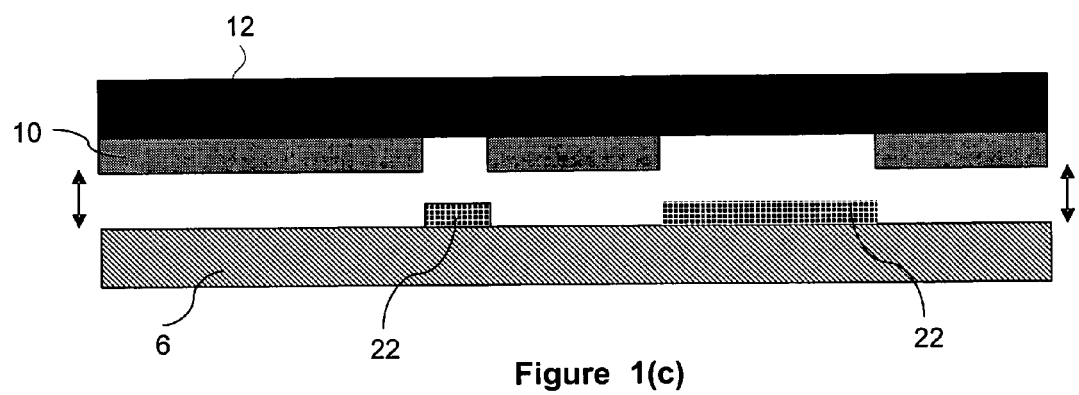
Figure 1D:
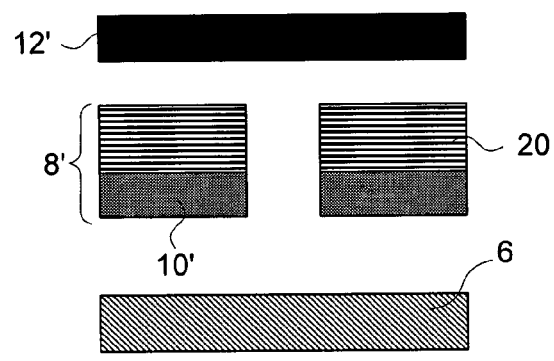
Figure 1E:
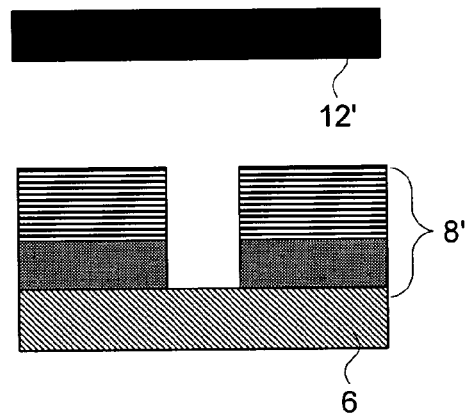
Figure 1F:
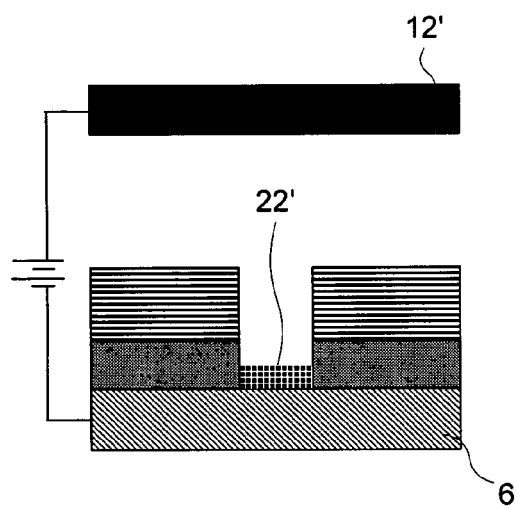
Figure 1G:
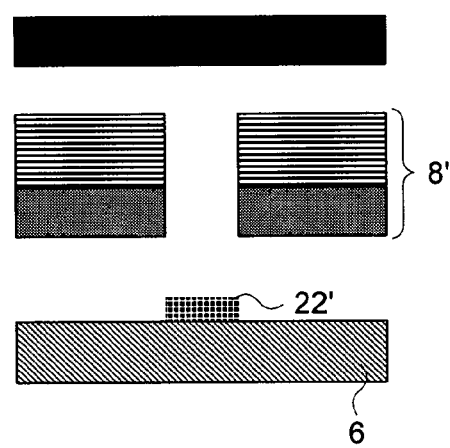
Figure 2A:
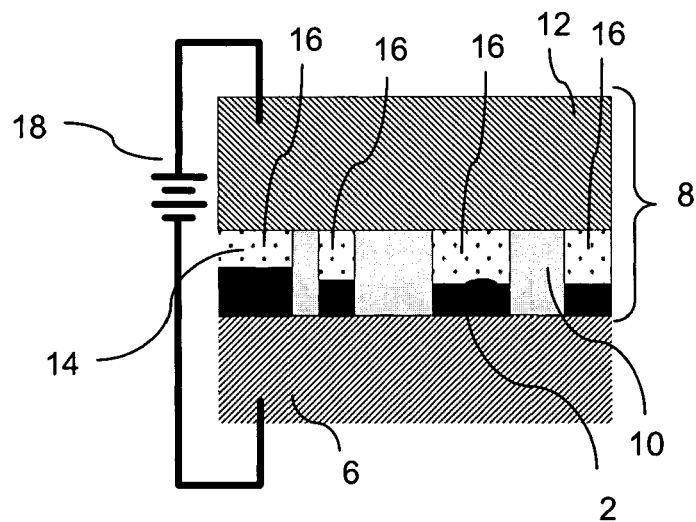
FIGS. 2(a)–2(f) schematically depict side views of various stages of an electrochemical fabrication process as applied to the formation of a particular structure where a sacrificial material is selectively deposited while a structural material is blanket deposited.
Figure 2B:
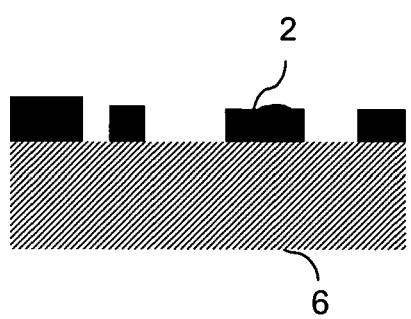
Figure 2C:
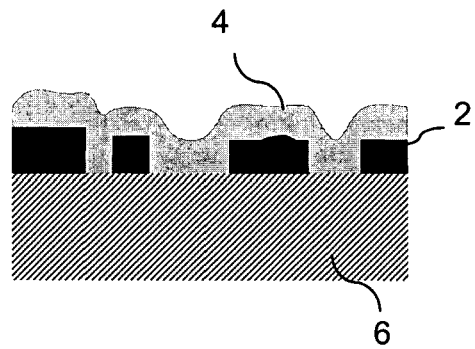
Figure 2D:
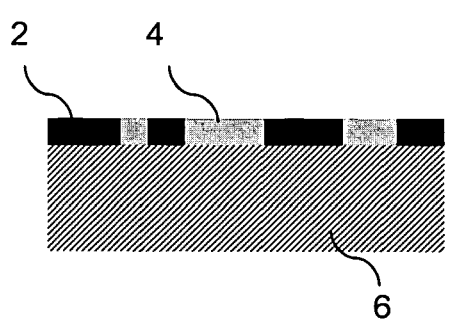
Figure 2E:
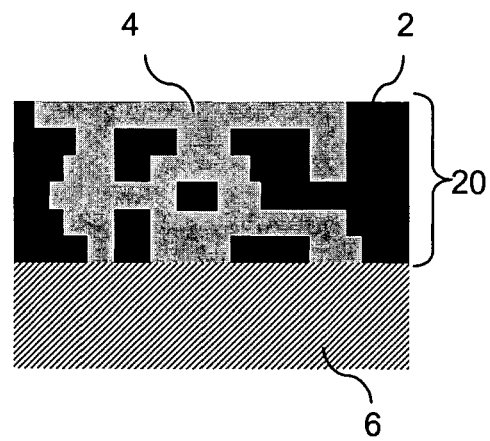
Figure 2F:
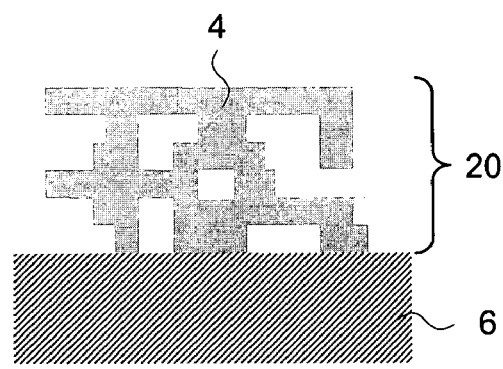
Figure 3A:
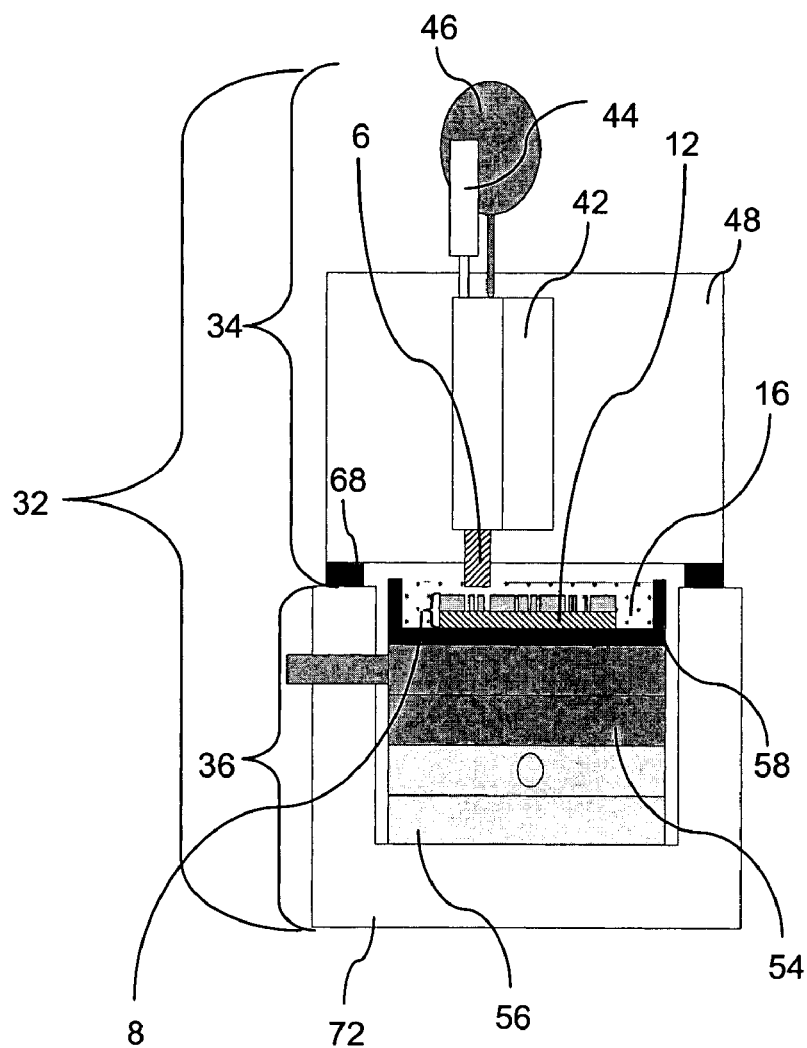
FIGS. 3(a)–3(c) schematically depict side views of various example subassemblies that may be used in manually implementing the electrochemical fabrication method depicted in FIGS. 2(a)–2(f).
Figure 3B:
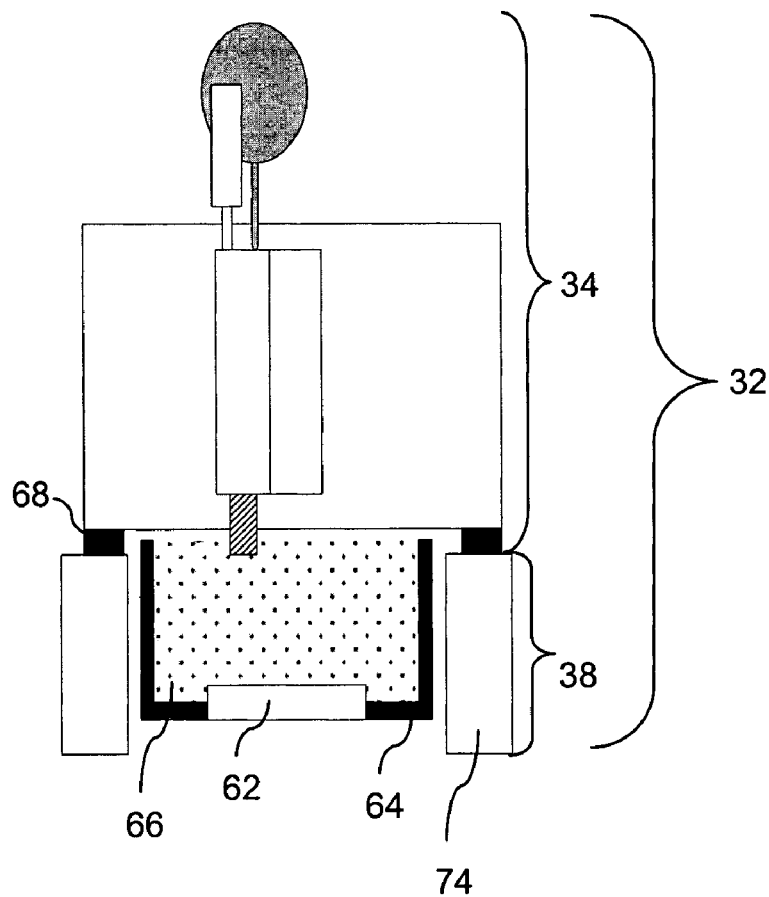
Figure 3C:
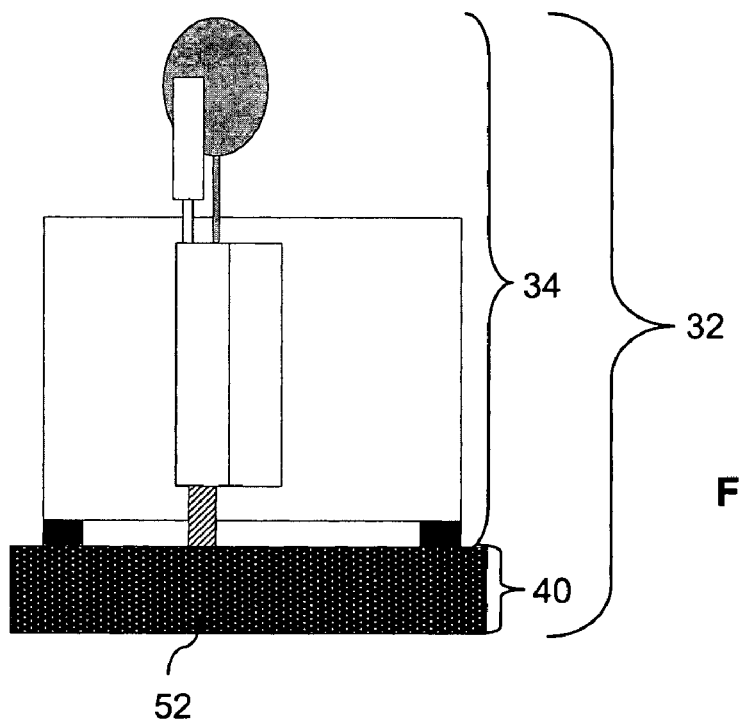
Figure 4A:
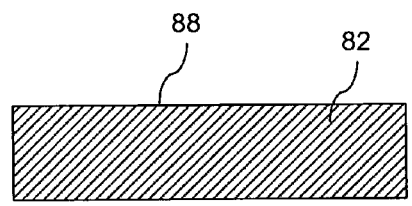
FIGS. 4(a)–4(i) schematically depict the formation of a first layer of a structure using adhered mask plating where the blanket deposition of a second material overlays both the openings between deposition locations of a first material and the first material itself.
Figure 4B:
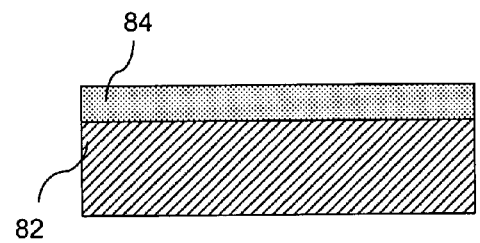
Figure 4C:
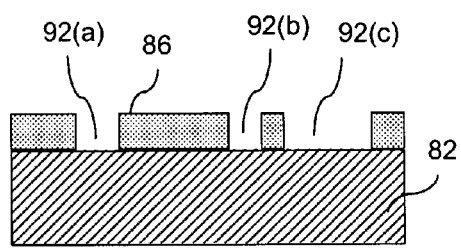
Figure 4D:
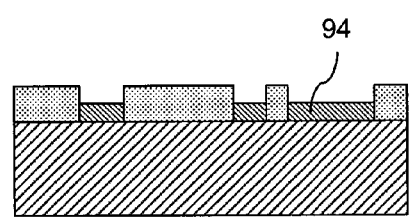
Figure 4E:
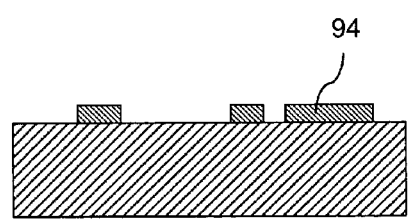
Figure 4F:
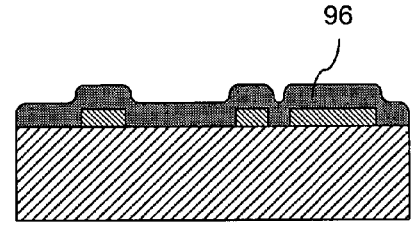
Figure 4G:
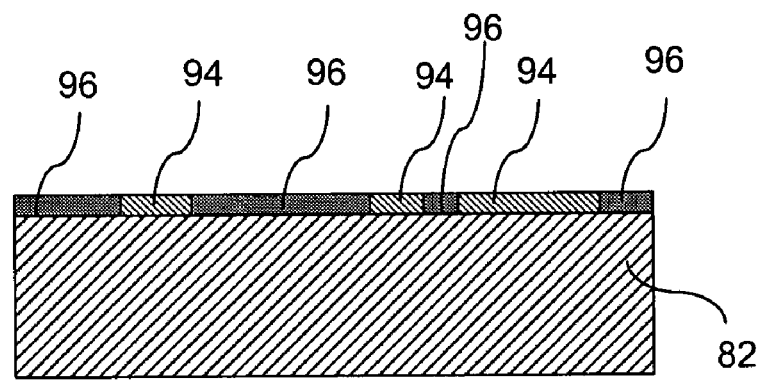
Figure 4H:
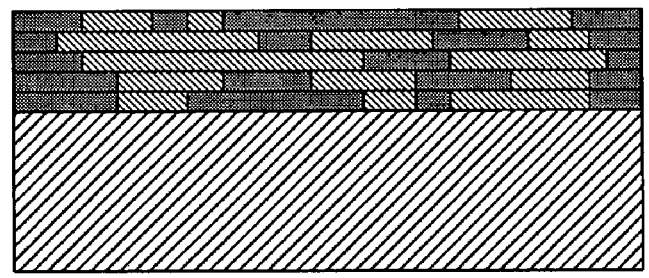
Figure 4I:
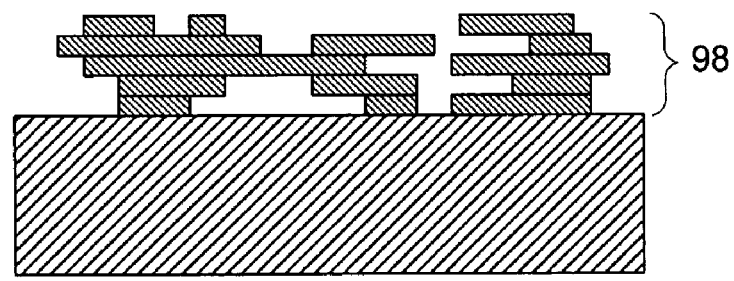

FIGS. 4(a)–4(i) illustrate various stages in the formation of a single layer of a multi-layer fabrication process where a second metal is deposited on a first metal as well as in openings in the first metal where its deposition forms part of the layer. In FIG. 4(a), a side view of a substrate 82 is shown, onto which patternable photoresist 84 is cast as shown in FIG. 4(b). In FIG. 4(c), a pattern of resist is shown that results from the curing, exposing, and developing of the resist. The patterning of the photoresist 84 results in openings or apertures 92(a)–92(c) extending from a surface 86 of the photoresist through the thickness of the photoresist to surface 88 of the substrate 82. In FIG. 4(d), a metal 94 (e.g. nickel) is shown as having been electroplated into the openings 92(a)–92(c). In FIG. 4(e), the photoresist has been removed (i.e. chemically stripped) from the substrate to expose regions of the substrate 82 which are not covered with the first metal 94. In FIG. 4(f), a second metal 96 (e.g., silver) is shown as having been blanket electroplated over the entire exposed portions of the substrate 82 (which is conductive) and over the first metal 94 (which is also conductive). FIG. 4(g) depicts the completed first layer of the structure which has resulted from the planarization of the first and second metals down to a height that exposes the first metal and sets a thickness for the first layer. In FIG. 4(h) the result of repeating the process steps shown in FIGS. 4(b)–4(g) several times to form a multi-layer structure are shown where each layer consists of two materials. For most applications, one of these materials is removed as shown in FIG. 4(i) to yield a desired 3-D structure 98 (e.g. component or device).

The various embodiments, alternatives, and techniques disclosed herein may be used in combination with electrochemical fabrication techniques that use different types of patterning masks and masking techniques. For example, conformable contact masks and masking operations may be used, proximity masks and masking operations (i.e. operations that use masks that at least partially selectively shield a substrate by their proximity to the substrate even if contact is not made) may be used, non-conformable masks and masking operations (i.e. masks and operations based on masks whose contact surfaces are not significantly conformable) may be used, and adhered masks and masking operations (masks and operations that use masks that are adhered to a substrate onto which selective deposition or etching is to occur as opposed to only being contacted to it) may be used.

All of these techniques may be combined with those of the various embodiments of various aspects of the invention to yield enhanced embodiments. Still other embodiments be may derived from combinations of the various embodiments explicitly set forth herein.

For example, in some embodiments, process variations may be used to yield cavities within the conductive structures that are filled completely or partially with a dielectric material (e.g. a polymer material or possibly a ceramic material), a conductive material embedded in a dielectric, or a magnetic material (e.g. a powdered ferrite material embedded in a dielectric binder or sintered after placement). The dielectric material(s) may be used as support structures to hold conducting elements separate from one another and/or they may be used to modify the microwave transmission or absorption properties of particular devices. A dielectric may be incorporated into the structures during a layer-by-layer buildup of the structures or may be back-filled in bulk or selectively into the structures after all layers have been formed.

Structures/devices produced by some embodiments may be sealed hermetically with a preferred gas or vacuum filling any voids within the structure. Other embodiments may protect critical surfaces of a structure from moisture or other damaging environmental conditions by use of plastic or glass shielding.

As a further example, in some embodiments, it may be desirable to have a structure composed of more than one conductive material (e.g. nickel and gold or copper and gold) and as such the process variations may be implemented to accomplish this result.

Some preferred embodiments of the invention provide microminiature RF or microwave transmission lines. Such transmission lines may be used as building blocks for RF and microwave components. A preferred transmission line has a rectangular coaxial structure that includes a rectangular solid-metal center conductor and a solid metal outer conductor. When used herein, a microminiature coaxial component or line shall mean a component having a minimum cross-sectional dimension from one inside wall of the outer conductor to the opposite inside wall of the outer conductor is less than about 200 μm. Coaxial transmission line is well suited to such microminiaturization because it supports a transverse electromagnetic (TEM) fundamental mode. From fundamental electromagnetic theory, a TEM mode is known to have a zero cut-off frequency. So the TEM mode continues to propagate at any practical frequency no matter how small the dimensions of the structure.

Three benefits of microminiaturized coaxial line are size, microwave bandwidth, and phase linearity. In general, the physical length of passive transmission-line components must be of the order of one free-space wavelength at the operating frequency which is, for example, 30 cm at 1 GHz. With conventional coaxial transmission line or waveguide, this results in a component having a linear dimension of this order. With microminiature coaxial line, the component can be made much shorter by wrapping the line back and forth in a serpentine fashion and even by stacking the multiple serpentine levels of the line.

A second benefit of microminiature coax is excellent bandwidth performance. In any coaxial transmission line this is defined maximally by the cut-on frequency of the first higher-order mode, which is usually a transverse-electric (TE) mode. From fundamental electromagnetics, it is known that this cut-on frequency scales inversely with the largest dimension of the outer conductor. In conventional coax this cut-on generally occurs between 10 and 50 GHz. In microminiature coax this cut-on can easily be extended to well above 100 GHz, giving it the bandwidth to handle the highest frequencies in near-term analog systems and the sharpest pulses in digital systems.

A third benefit of microminiature coax is its degree of phase linearity. From fundamental electromagnetics, it is known that the TEM mode is the only mode on a transmission line that can propagate with zero dispersion. In other words, all frequencies within the operational bandwidth have the same phase velocity, so the dependence of relative phase between two arbitrary points on the line is perfectly linear with frequency. Because of this property, sharp non-sinusoidal features, such as sharp digital edges or short digital pulses propagate without distortion. All of the other known transmission line media at the size scale of microminiature coax (i.e., less than 200 μm) do not propagate a pure TEM mode but rather a quasi-TEM mode. A good example is the strip line commonly used in Si digital ICs or the microstrip commonly used in GaAs or InP MMICs (monolithic microwave integrated circuits).

Beside the dimension, another feature of some preferred microminiature coaxial lines is their rectangular shape cross-sectional shape. Conventional coaxial lines are generally made of circular center and outer conductors because of the relative simplicity in fabricating a circular shape (e.g., round wire) for the center conductor and a hollow tube (e.g., catheter) as the outer conductor. Fundamental electromagnetic theory shows that rectangular coax can provide very similar performance to circular coax, although analytic methods of design are lacking. Fortunately, numerical tools (e.g., high-frequency structure simulator, or HFSS, software) are now readily available which can aid in the design of components such as rectangular microminiature coax of any shape or size.

In some preferred embodiments microminiature coaxial line is used in producing ultra-compact microwave components by, at least in part, utilization of the electrochemical fabrication techniques and particularly electrochemical fabrication techniques using contact masks or adhered masks to achieved selective patterning. Fabrication in such a manner, for example, allows adjacent transmission lines to be formed using a single common shield (i.e. outer conductor). There is an entire family of passive microwave functions that can not be realized in semiconductor ICs, or that can be realized only with a significant penalty in performance. A good example of a function that can not be realized on present day semiconductor ICs is circulation—i.e., the nonreciprocal transmission of microwave power between neighboring ports around a loop: An example-of a function with inferior present day IC performance is frequency multiplexing—i.e., the routing of microwave power from one input port into a number of different output ports depending on frequency. Microminiature coaxial lines may be used in forming components that can provide such functionality particularly when combined with the versatility of electrochemical fabrication processes.

Figure 5A:
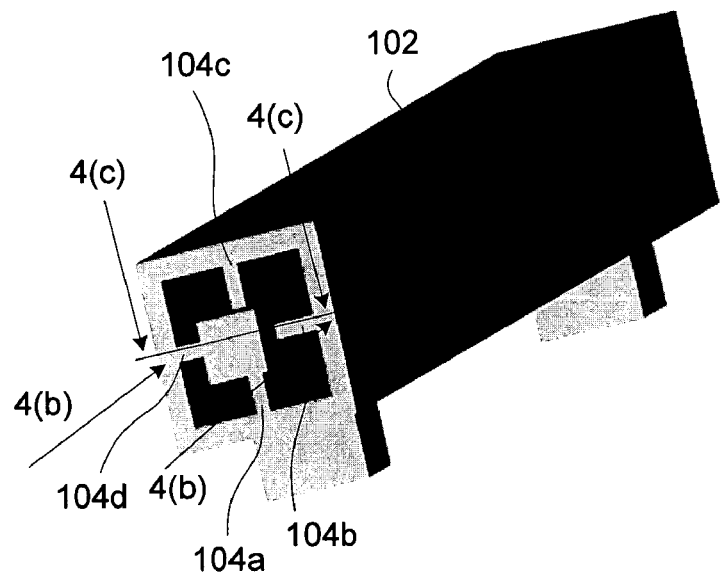
FIG. 5(a) depicts a perspective view of a coaxial filter element that includes shorting spokes.
Figure 5B:
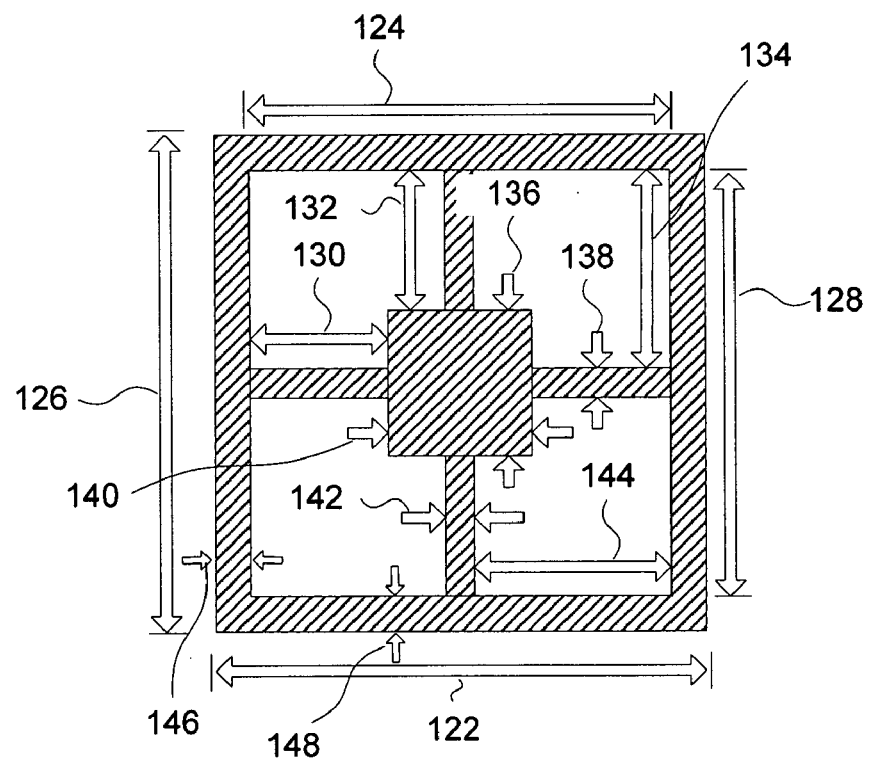
FIG. 5(b) depicts a plan view of the coaxial filter of FIG. 4(a) along lines 5(b)–5(b)
Figure 5C:
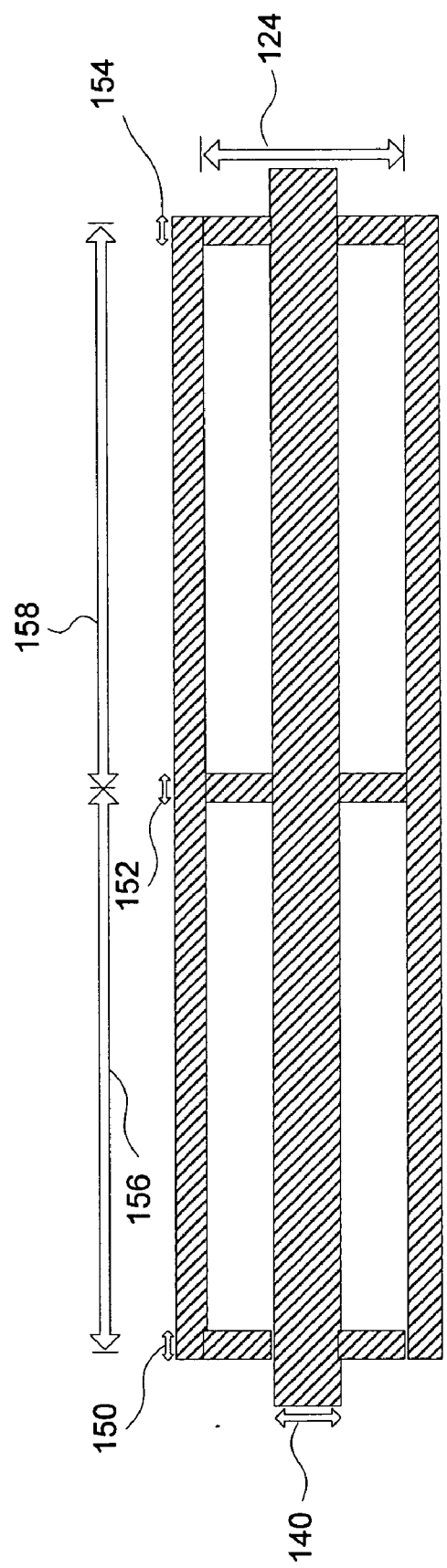
FIG. 5(c) depicts a plan view of the coaxial filter of FIG. 4(a) along lines 5(c)–5(c).

In some preferred embodiments, microminiature coaxial line is integrated with active semiconductor devices, particularly RF and high-speed digital ICs. Such integration addresses a growing problem in the IC industry which is the interconnecting and routing of high-frequency analog and digital signals within chips. A good example of where such integration would be useful is in clock distribution in high speed microprocessors. Transmission of very sharp edges down conventional (stripline) transmission lines on silicon invariably distorts, or spreads out, the edge because of dispersion and losses on the line. With microminiature coaxial lines, the clock signal could be coupled immediately into a single-mode coaxial structure in which the fundamental and all Fourier components of the clock pulse would propagate for long distances with the same velocity. As such, the clock pulse distortion, and associated clock skew, could be mitigated. These transmission lines could be used to form clock signal trees and the like FIGS. 5(a)–5(c) illustrate an RF/microwave filter 102 of an embodiment of the present invention. FIG. 5(a) depicts a perspective view of a coaxial filter element including a first set 104 of spokes 104a–104d. FIG. 5(b) depicts a plan view of filter 102 as viewed from lines 5(b)–5(b) of FIG. 5(a). FIG. 5(c) depicts a plan view of the coaxial filter as viewed from lines 5(c)–5(c) of FIG. 5(a). FIG. 5(c) illustrates that the filter of FIG. 5(a) includes three sets of spokes spaced apart by one-half (½) of the wavelength ($\lambda_o$) of an approximately central frequency in a band of frequencies that will be passed by the filter. In this configuration, the filter may be considered a Bragg-type filter having 2 poles (each adjacent pair of sets forming a single pole). In one example, the filter can take on the dimensions set forth in TABLE 1.

TABLE 1

| Reference | Dimension | Reference | Dimension | Reference | Dimension |
|---|---|---|---|---|---|
| 122 | 520 µm | 124 | 400 µm | 126 | 520 µm |
| 128 | 400 µm | 130 | 116 µm | 132 | 116 µm |
| 134 | 180 µm | 136 | 168 µm | 138 | 40 µm |
| 140 | 168 µm | 142 | 40 µm | 144 | 180 µm |
| 146 | 60 µm | 148 | 60 µm | 150 | 40 µm |
| 152 | 40 µm | 154 | 40 µm | 156 | $\lambda_o/2$ |
| 158 | $\lambda_o/2$ | | | | |

In other embodiments the dimensions may be varied to change the insertion loss of the filter in the pass band, the attenuation in the stop band, and the characteristics in the transition region. In other embodiments various parameters may also be modified by varying the material or materials from which the filter and/or filter components are made. For example, the entire filter may be formed from nickel or copper, or it may be partially or entirely plated with silver or gold.

Figure 5D:
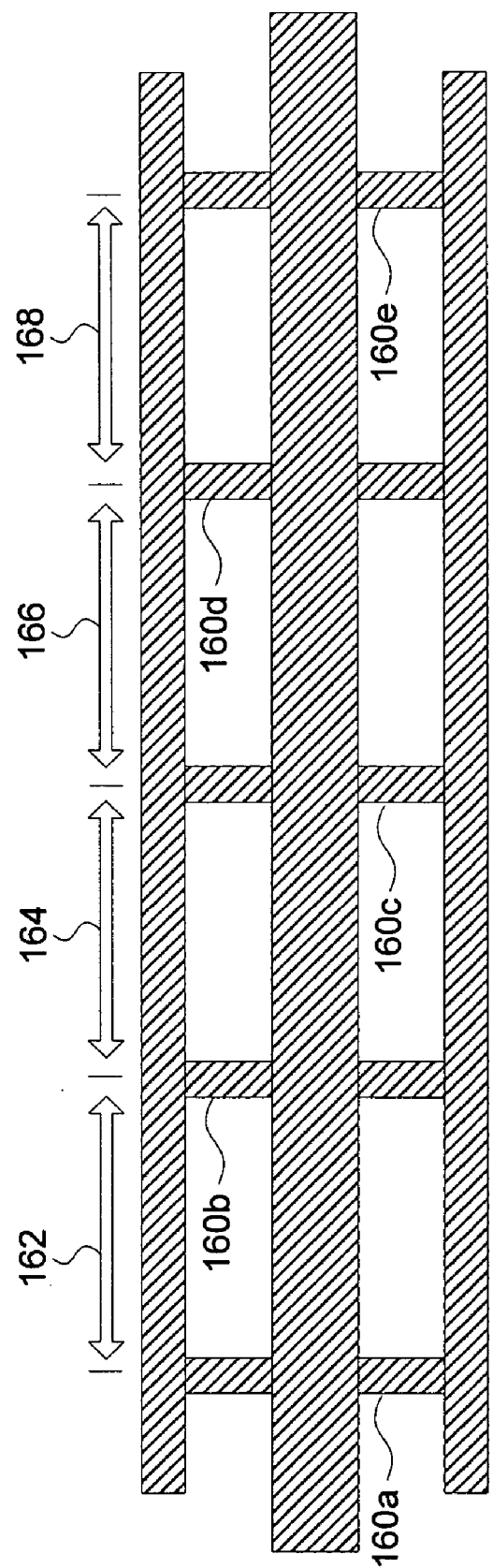
FIG. 5(d) depicts a plan view of the central portion of a coaxial filter element showing five sets of filtering spokes (two per set) along the length of the filter.

FIG. 5(d) depicts a plan view of the central portion of a coaxial filter of an alternative embodiment where the filter contains five sets of spokes 160a–160e (two spokes per set are depicted in this view) each spaced at about one-half the central frequency of the pass band (i.e. 162, 164, 166, and 168=$\lambda_o/2$). This figure illustrates a four pole embodiment.

In alternative embodiments other numbers of poles may be used in forming the filter (e.g. three poles or five or more poles).

Figure 6A:
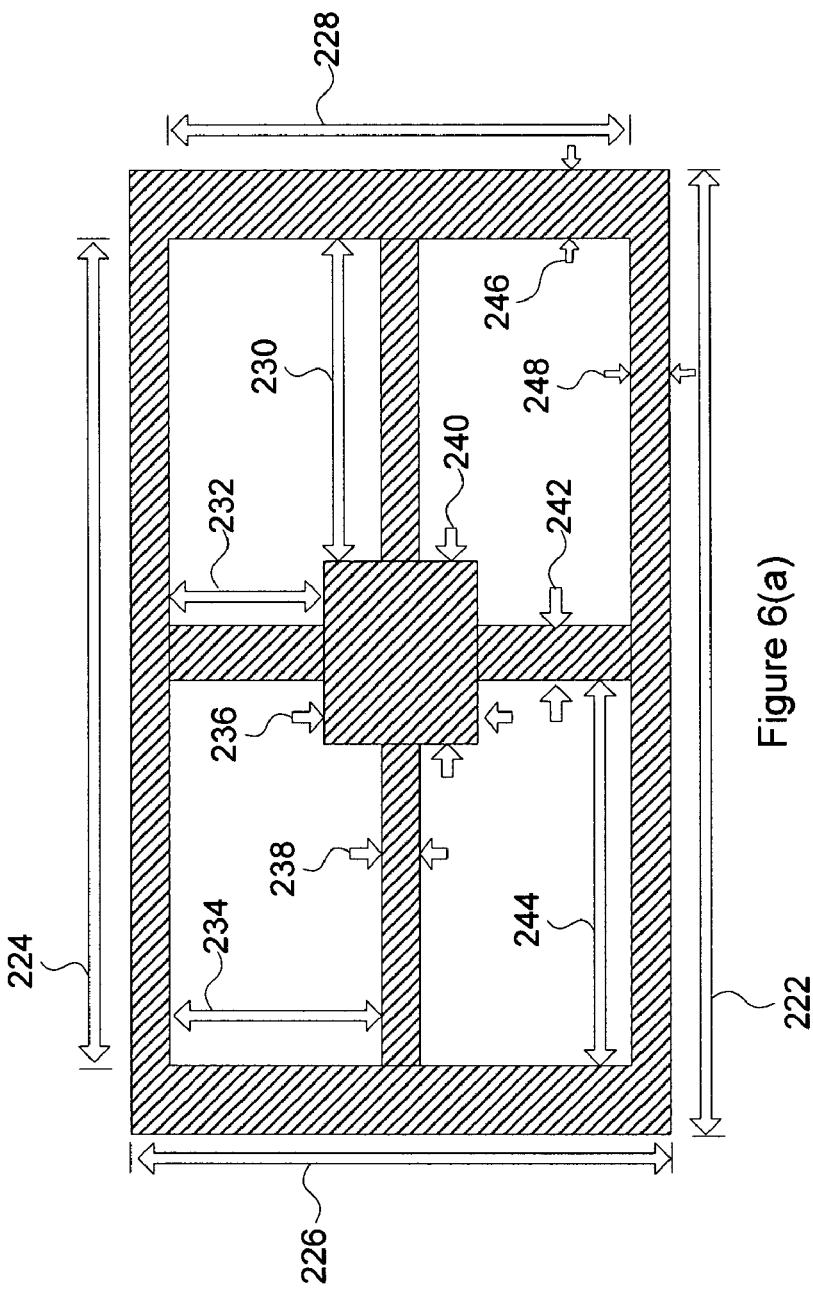
FIGS. 6(a)–6(c) depict end views, respectively, of rectangular, circular, and elliptical filter elements each using sets of spokes (four spokes per set).

FIG. 6(a) depicts end views of a rectangular filter that uses multiple sets of spokes with four spokes per set. In one example, the filter can take on the dimensions set forth in TABLE 2.

TABLE 2

| Reference | Dimension | Reference | Dimension | Reference | Dimension |
|---|---|---|---|---|---|
| 222 | 920 µm | 224 | 800 µm | 226 | 320 µm |
| 228 | 200 µm | 230 | 316 µm | 232 | 59 µm |
| 234 | 80 µm | 236 | 88 µm | 238 | 40 µm |
| 240 | 168 µm | 242 | 76 µm | 244 | 362 µm |
| 246 | 60 µm | 248 | 60 µm | | |

As with the square coaxial filter of FIGS. 5(a)–5(c), the dimensions set forth above for the rectangular coaxial filter may be varied. In the most preferred embodiments of this rectangular filter the sets of spokes are spaced at about $\lambda_o/2$.

Figure 6B:
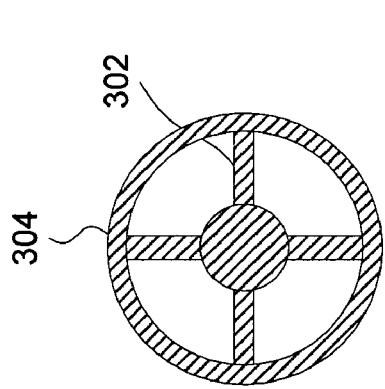
Figure 6C:
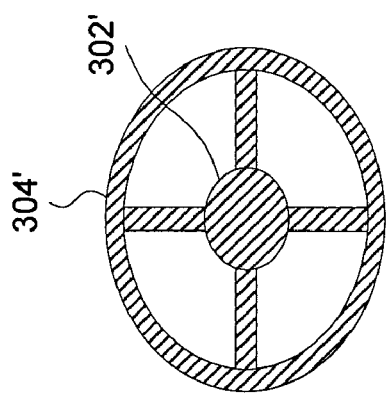

FIGS. 6(b) and 6(c) illustrate examples of two alternative cross-sectional configurations for coaxial filters of the type illustrated (i.e. a circular configuration and an elliptical configuration, respectively). In other embodiments other cross-sectional configurations are possible and even the cross-sectional configurations of the inner conductors 302 and 302' may be different from that of the outer conductors 304 and 304'. In still other embodiments the spokes may take on different cross-sectional configurations (square, rectangular, circular, elliptical, and the like).

Figure 7A:
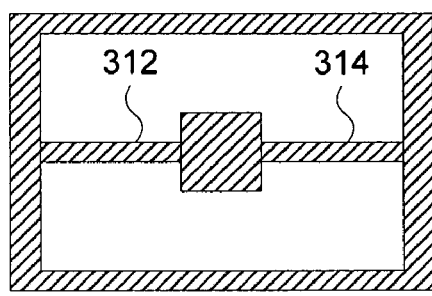
FIGS. 7(a)–7(d) depict examples of alternative spoke configurations that may be used in filtering components.
Figure 7B:
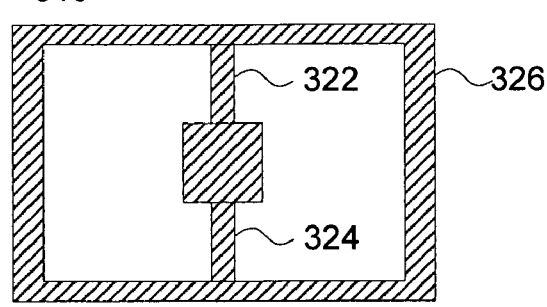
Figure 7C:
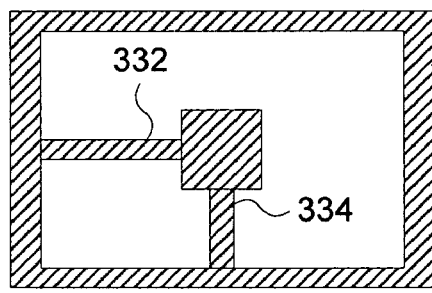
Figure 7D:
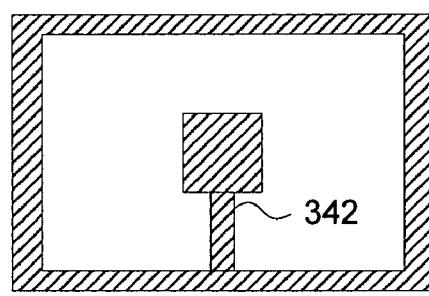

FIG. 7(a)–7(d) depict examples of alternative spoke configurations that may be used in coaxial filters. FIG. 7(a) illustrates an embodiment where only two spokes 312 and 314 are used and extend in the longer cross-sectional dimension of the rectangular outer conductor 316 and maintain the symmetry of the configuration. FIG. 7(b) illustrates a similar two spoke embodiment to that of FIG. 7(a) with the exception that the spokes 322 and 324 extend in smaller cross-sectional dimension of the outer conductor 326. FIG. 7(c) illustrates an embodiment where two spokes are still used as in FIGS. 7(a) and 7(b) where one spoke 332 extends in the horizontal dimension (i.e. the major dimension of the rectangular outer conductor 336) and one spoke 334 extends in the vertical dimension (i.e. the minor dimension of the rectangular outer conductor 336). In FIG. 7(d) only a single spoke 342 makes up each set.

As an example, the embodiment of FIG. 7(a) may take on the dimensions set forth in TABLE 2 above with the exception of dimensions 242, and 244 that do not exist in this configuration. As another example, the embodiment of FIG. 7(a) may take on the dimensions set forth in TABLE 3 where the reference numerals have been modified to include apostrophes.

TABLE 3

| Reference | Dimension | Reference | Dimension | Reference | Dimension |
|---|---|---|---|---|---|
| 222' | 720 µm | 224' | 600 µm | 226' | 420 µm |
| 228' | 300 µm | 230' | 175 µm | 232' | 87 µm |
| 234' | 130 µm | 236' | 125 µm | 238' | 40 µm |
| 240' | 250 µm | 246' | 60 µm | 248' | 60 µm |

In alternative embodiments, other spoke numbers (e.g. three or five) and configurations (e.g. multiple spokes extending from a single side of the conductor, not all spokes extending radically outward from the inner conductor to the outer conductor) may exist.

Figure 8A:
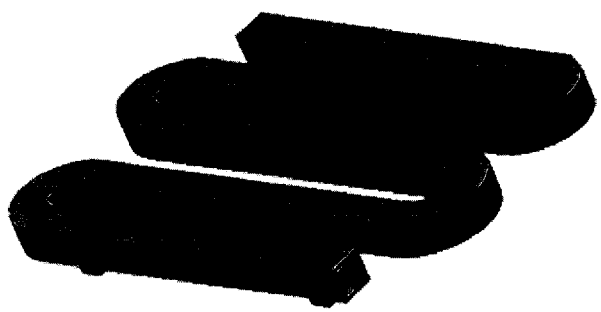
FIGS. 8(a) and 8(b) illustrate perspective views of curved coaxial filter components.
Figure 8B:
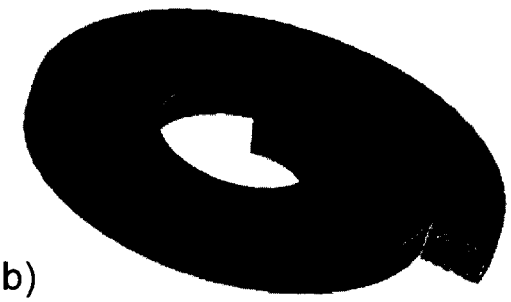

FIGS. 8(a) and 8(b) illustrate perspective views of non-liner coaxial filter components according to other embodiments of the invention. FIG. 8(a) depicts an extended serpentine shape while FIG. 8(b) depicts a spiraled configuration. In still other alternative embodiments other configurations may be used that take an entry and exit port out of the plane of the winding structure or even cause the winding in general to be stacked or extend in three-dimensions. Such three dimensional stacking may lead to more compact filter designs than previously obtainable.

Figures 9A, 9B:
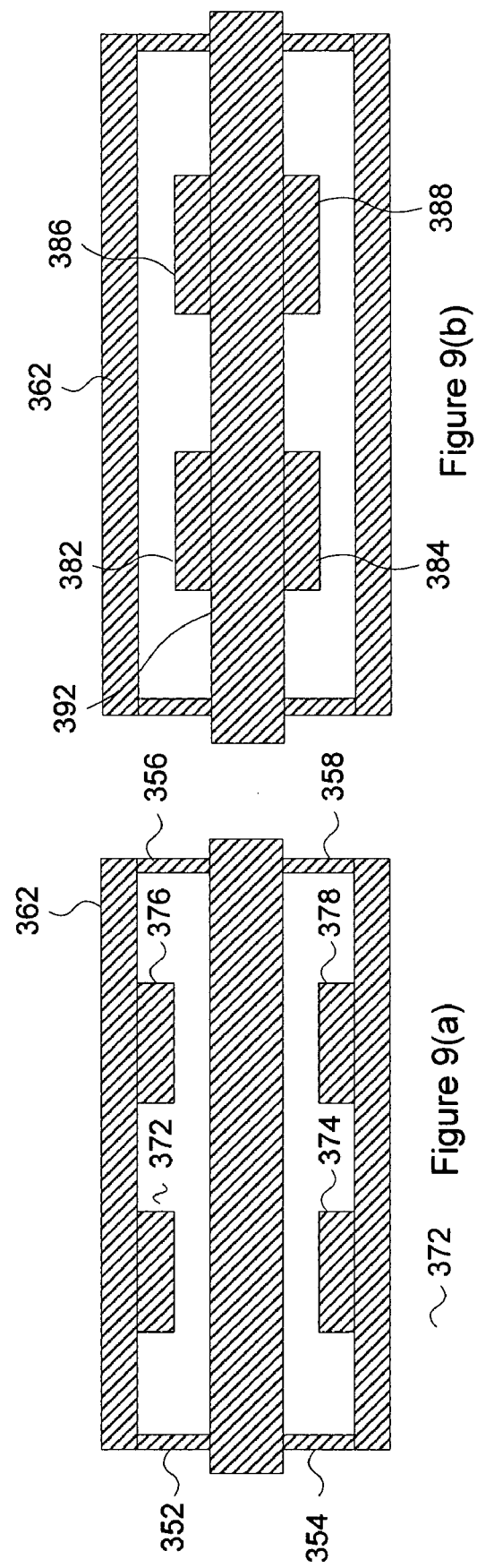
FIGS. 9(a)–9(c) depict alternative coaxial filter components that use protrusions along the inner or outer conductor to aid in filtering of signals.
Figure 9C:
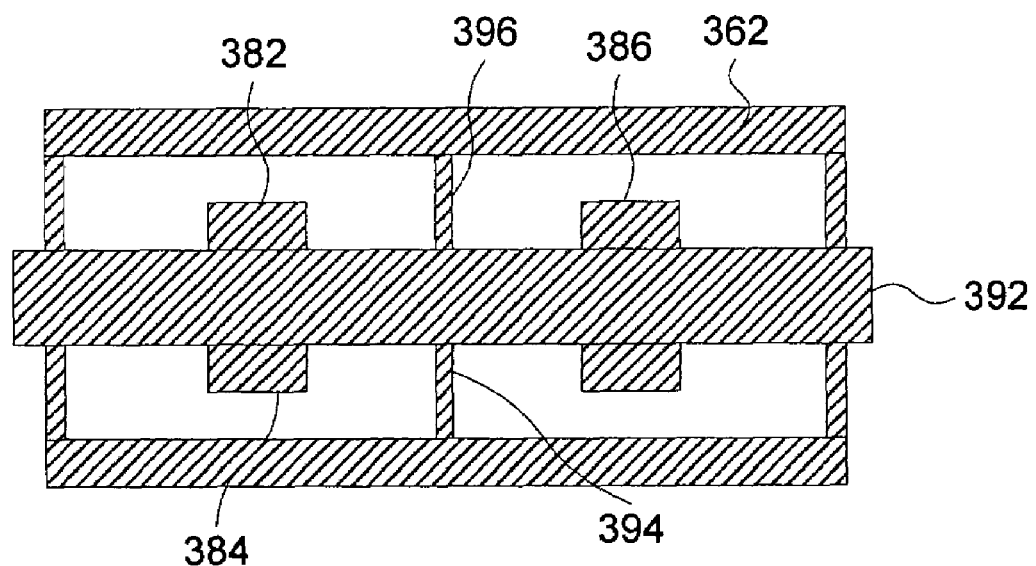

FIGS. 9(a)–9(c) depict alternative embodiments of coaxial filter components that use a combination of spokes and either protrusions along the inner or outer conductor to aid in filtering RF or microwave signals. In particular FIG. 9(a) illustrates an embodiment where spokes 352, 354, 356, and 358 are included at the end of the outer conductor 362 while intermediate to the ends of the outer conductor protrusions 372, 374, 376, and 378 are included on the interior surface of the outer conductor and are preferably about one-quarter of the wavelength ($\lambda_o/4$) in length and spaced by about one-half the wavelength ($\lambda_o/2$). In alternative embodiments, the recesses in the outer conductor 362 may be considered as opposed to protrusions. In the embodiment of FIG. 9(a) the spokes are not spaced from each other by $\lambda_o/2$ as in previous embodiments but instead are spaced by an integral multiple of $\lambda_o/2$. In the embodiment depicted the integral multiple is three.

FIG. 9(b) illustrates another alternative embodiment where the spacing between spokes are a non unity integral multiple of $\lambda_o/2$ and at the intermediate $\lambda_o/2$ positions protrusions 382, 384, 386, and 388 (of length approximating $\lambda_o/2$) are included on the inner conductor 392.

FIG. 9(c) illustrates a third alternative embodiment where not only are protrusions included on the inner conductor but an additional intermediate set of spokes 394 and 396 is also included. The most preferred spacing between each successive set of filter elements remains approximately $\lambda_o/2$.

In further embodiments other configurations of spokes, protrusions, and/or indentations are possible. In some embodiments, it may be acceptable to space the successive filter elements (e.g. spokes, protrusions, and/or indentations) at integral multiples of $\lambda_o/2$.

In the embodiments of FIGS. 5(a)–9(d), the spokes provided in the structures may provide sufficient support for the inner conductor such that no dielectric or other support medium is needed. As such, in the most preferred embodiments the inner conductor is separated from the outer conductor by an air gap or other gaseous medium or by an evacuated space. In other embodiments a solid or even liquid dielectric material may be inserted partially within or completely within the gap between the inner and outer conductors. The insertion of the dielectric may occur after formation of the conductors or may be formed in situ with the formation of the conductors. Various example implementation processes will be discussed hereafter.

Figure 9D:
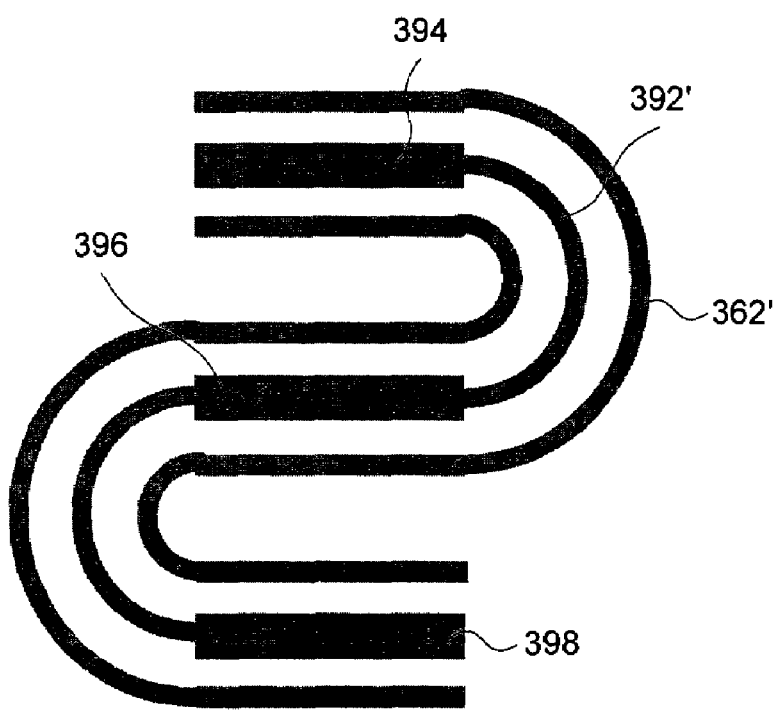
FIG. 9(d) depicts a plan view of the central portion, along the length, of an S-shaped two pole coaxial filter.

FIG. 9(d) depicts a plan view of the central portion, along the length, of a serpentine-shaped two pole coaxial filter. In this embodiment no spokes are used but only protrusions 394, 396, and 398 on the inner conductor 392' are used to provide the filtering effect. In alternative embodiments protrusions on the inside of portion of the outer conductor 362' may be used or a combination of protrusions on the inside and outside conductor may be used. As no spokes are used, the inner conductor's position is not fixed relative to the outer conductor. Various embodiments will be discussed hereafter that will allow for the formation of a dielectric between the inner and outer conductors during build up of the conductive materials. Various other embodiments will also be discussed that allow for the transition from a conductive support used during layer-by-layer build up to a complete or partial formation of a solid dielectric in between the inner and outer conductors.

FIGS. 10(a)–10(d) depict plan views of the central portion, along the length of coaxial elements that include sharp transitions in direction of radiation propagation. According to the production methods of the present invention miter bends of varying degrees can be inserted into coaxial components as well as waveguide components with little concern for the geometric complexity of the design or for the accessibility of tooling to reach the locations to be mitered. FIG. 10(a) depicts transitions from one coaxial segment 402 to another coaxial segment 404 and then again to another coaxial segment. In this Figure the transitions 412, 414, 416, 418, 422, 424, 426, and 428 are shown as 90° transitions and it is anticipated that significant reflection could result from these sharp turns. FIG. 10(b) illustrates the use of mitered facets 432 and 434 at transitions 412''' and 414''' to help reduce the losses (e.g. reflections). FIG. 10(c) depicts mitered facets for all transitions 412', 414', 416', 418', 422', 424', 426', and 428' which are believed to help further reduce losses. In still further embodiments the facet length can be extended (e.g. the lengths of the facets at 412 and 414) to ensure that a larger portion of the impinging radiation strikes with a non-90° incident angle. FIG. 10(d) illustrates that multiple facets may be applied to each transition region 412'', 414'', 416'', 418'', 422'', 424'', 426'', and 428''. The mitering effects according to the present production methods are not only applicable to coaxial components (e.g. transmission lines, filters, and the like) but are also applicable to waveguides (e.g. waveguides with internal dimensions under 800 µm, under 400 µm, or even with smaller dimensions, or larger waveguides where propagation paths are complex and monolithic structures are desired to reduce size and or assembly difficulties).

Figure 11A:
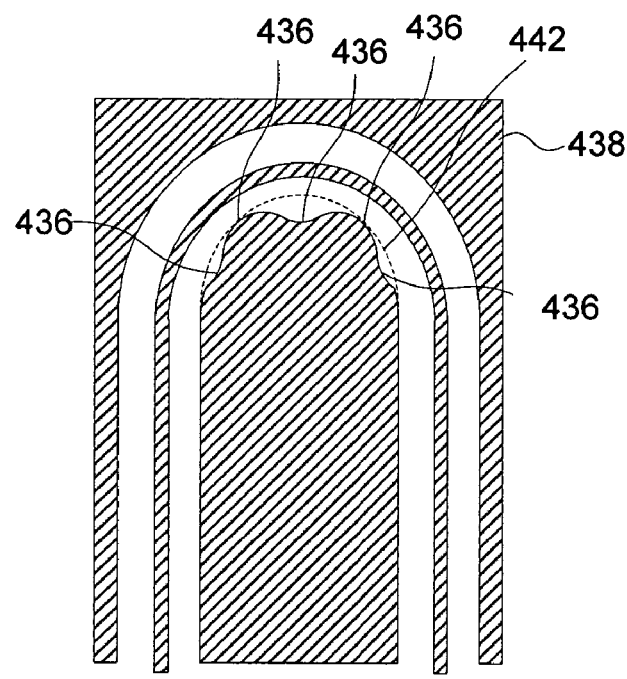
FIGS. 11(a) and 11(b) depict, respectively, plan views along the central portions of a coaxial transmission line and a coaxial filter component where wave-like oscillations are included on the inside surface of the smaller radius side of the coaxial line.
Figure 11B:
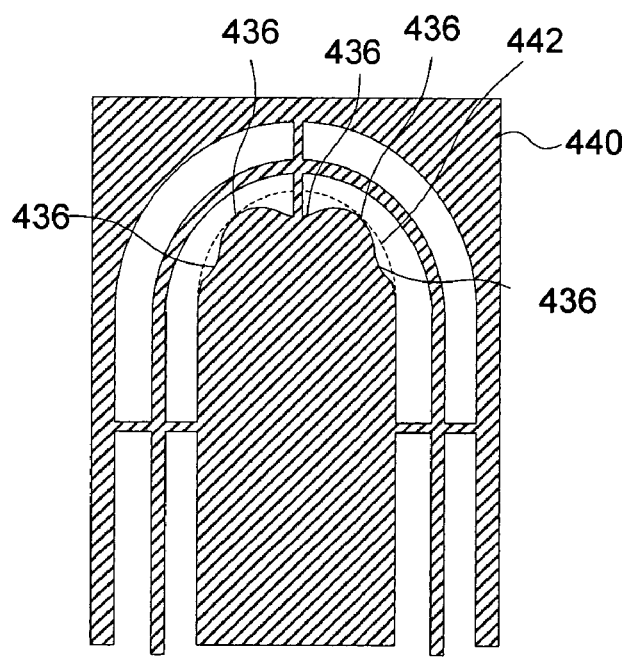

FIGS. 11(a) and 11(b) depict, respectively, plan views along the central portions of a coaxial transmission 438 and a coaxial filter component 440 where perturbations 436 are included on the inside surface of the smaller radius side of the coaxial line. The perturbations may be smooth and wave-like or they may be of a more discontinuous configuration. It is intended that the perturbations increase the path length along the side having the smaller nominal radius such that the path length is closer to that of the path length along the outer wall then it would be if the surface having the smaller nominal radius were a simple curve 442. In alternative embodiments the central conductor may also be modified with path length perturbations.

Figure 12C:
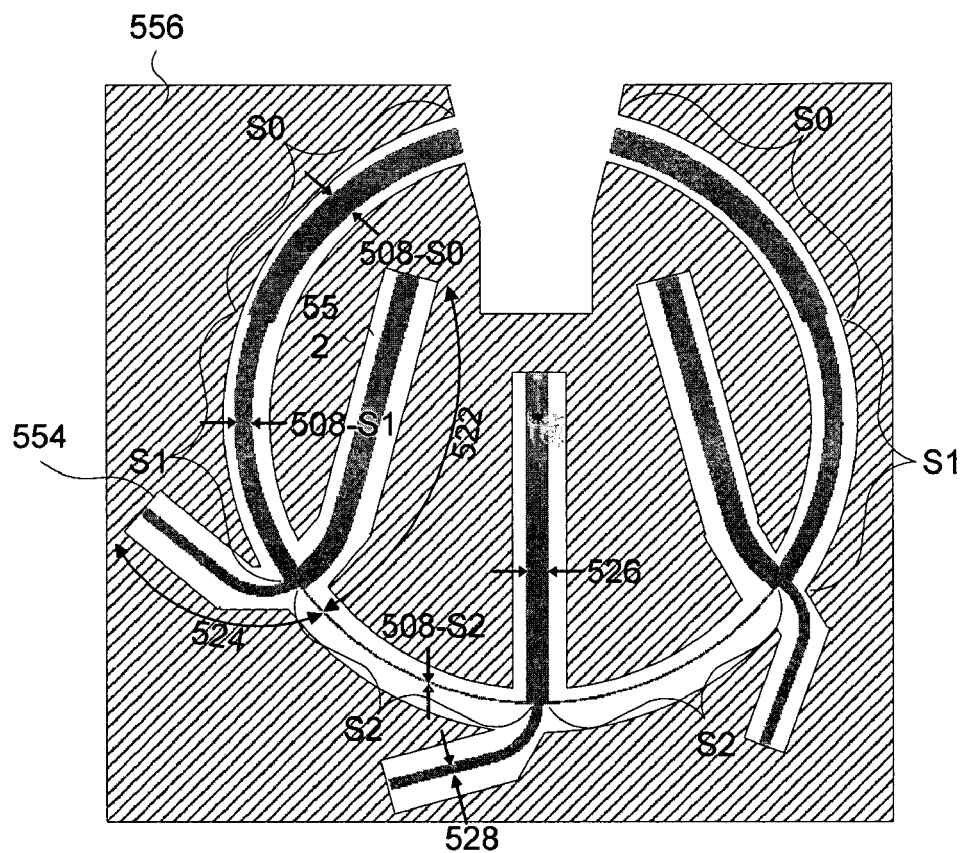
FIG. 12(c) depicts a plan view (from the top) of the central portion, along the length of a curved three-pole band pass coaxial filter with stub supports.

FIGS. 12(a)–12(c) depict a coaxial three-pole stub-based filter of an alternative embodiment of the invention. FIG. 12(a) depicts a plan view (from the top) of the central portion, along the length of the filter. FIG. 12(b) depicts an end view of the filter of FIG. 12(a) illustrating the rectangular configuration of the structure. FIG. 12(c) depicts a plan view of a circular version of the filter of FIGS. 12(a) and 12(b). In one example, the filter of FIGS. 12(a)–12(c) can take on the dimensions set forth in TABLE 4.

TABLE 4

| Reference | Dimension | Reference | Dimension | Reference | Dimension |
|---|---|---|---|---|---|
| 502 | 300 µm | 504 | 300 µm | 506 | 25 µm |
| 508-S0 | 245 µm | 508-S1 | 165 µm | 508-S2 | 25 µm |
| 512 | $\lambda_o/4$ (250 mm) | 514 | $\lambda_o/4$ (250 mm) | 516 | $\lambda_o/4$ (250 mm) |
| 522 | 3.00 mm | 524 | 1.64 mm | 526 | 200 µm |
| 528 | 100 µm | | | | |

Each pair of stubs 522 and 524 provide a capacitive and an inductive reactance, respectively, whose combination provides a pole of the filter. Each stub is shorted to the outside conductor 556 at the end of its side channel 552 and 554 respectively. The spacing between the poles preferably approximates one-quarter of the wavelength ($\lambda_o/4$) of the central frequency of the desired pass band of the filter. The lengths of the stubs are selected to provide a capacitive reactance (e.g. something longer than $\lambda_o/4$) and an inductive reactance (something shorter than $\lambda_o/4$). In alternative embodiments it is believed that spacing between the poles may be expanded to an integral multiple of $\lambda_o/4$, other filtering elements may be added into the component (e.g. spokes, protrusions, and the like).

In other embodiments the dimensions may be varied to change the insertion loss of the filter in the pass band, the attenuation in the stop band, and the characteristics in the transition region as well as in the pass band regions. In these other embodiments various parameters may also be modified by varying the material or materials from which the filter and/or filter components are made. For example, the entire filter may be formed from nickel or copper, or it may be partially or entirely plated with silver or gold.

In alternative embodiments it may be possible to form each pole from one shorted stub (providing a shunt inductance) and one open stub (providing a shunt capacitance) that terminates short of the end of the channel (e.g. into a dielectric) wherein the capacitive stub may be able to be shortened due to its open configuration.

Figure 13A:
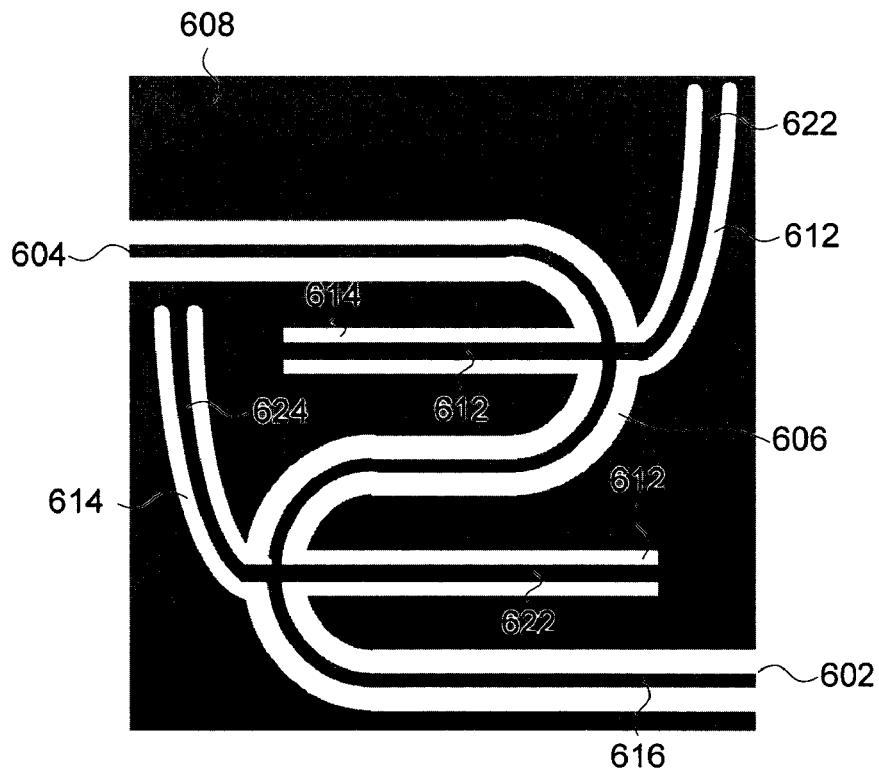
FIG. 13(a) depicts a plan view (from the top) of the central portion, along the length of an S-shaped two-pole band pass coaxial filter with stub supports.

FIG. 13(a) depicts a plan view (from the top) of the central portion, along the length of an S-shaped two-pole stub based band pass coaxial filter. Entry port 602 and exit port 604 are connected by a passage 606 in outer conductor 608 from which two pairs of channels 612 and 614 extend. Down the center of passage 606 an inner conductor 616 extends and from which two pairs of stubs 622 and 624 extend until they short into the outer conductor 608 at the ends of channels 612 and 614 respectively.

Figure 13B:
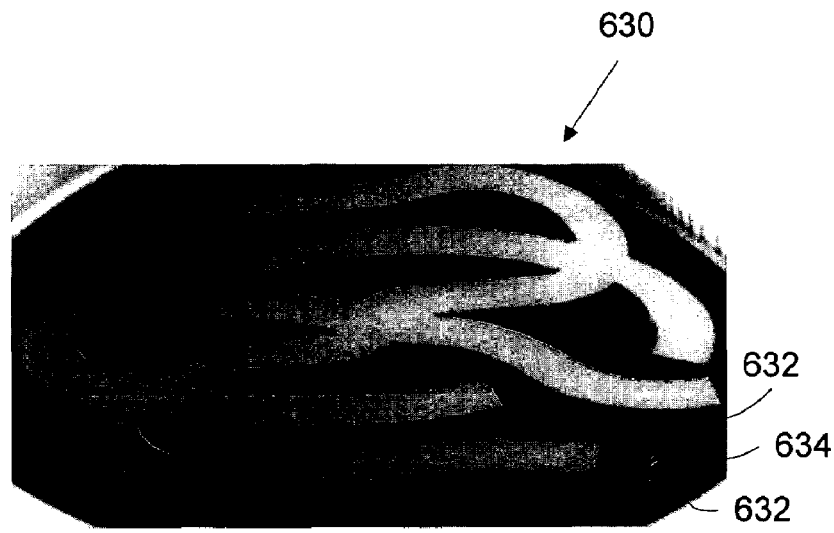
FIG. 13(b) depicts a perspective view of a somewhat modified version of the filter of FIG. 13(a) as produced using MEMGen's EFAB™ electrochemical fabrication technology and after sacrificial material has been removed.
Figure 13C:
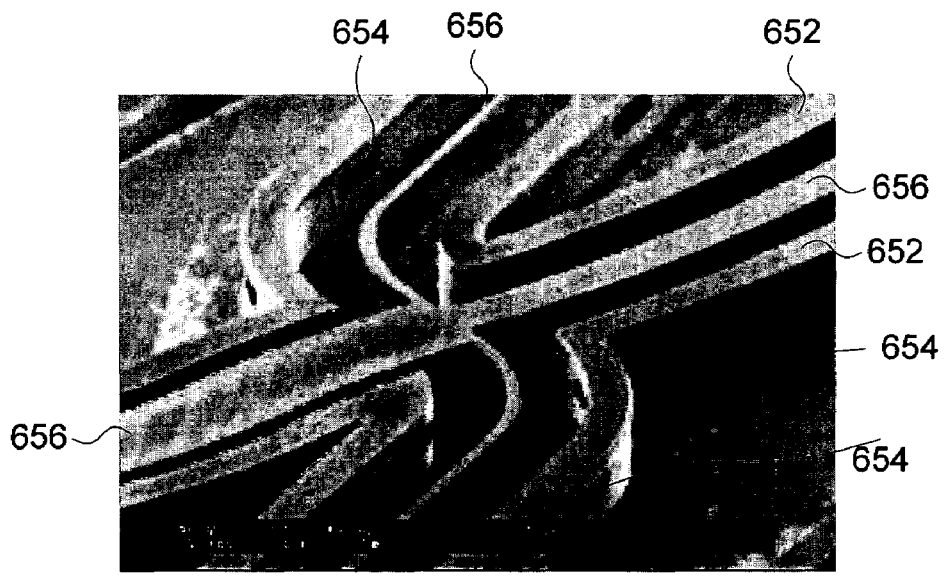
FIG. 13(c) depicts a perspective close up of a partially formed filter (like that of FIG. 13(b) after removal of sacrificial material from the structural material.

FIG. 13(*b*) depicts a perspective view of a filter 630 which has a somewhat modified configuration compared to that FIG. 13(*a*). The filter of FIG. 13(*b*) was produced using MEMGen's EFAB™ electrochemical fabrication technology. The filter is shown has having both ground leads 632 and signal leads 634 for connecting to a substrate (e.g. a circuit board, IC or the like. and after sacrificial material has been removed. The filter is also shown as having a plurality of holes 642 (apertures) in the out conductor to aid in the removal of sacrificial material from between the inner and outer conductors. In this example, each of these holes are 150 microns long and 50 microns high and extend 80 microns to extend completely through the walls of the shielding conductors FIG. 13(*c*) depicts a perspective close up of a partially formed filter (like that of FIG. 13(*b*) after removal of sacrificial material from the structural material. In this view, the outer walls of the coaxial elements (shielding walls) are visible 652, as are the apertures 654 that extend through them. The central conductors 656 are also visible.

The etching holes discussed herein are preferably sized and located in regions of coaxial structures or waveguide structures such that they allow enhanced and complete removal of sacrificial material while not significantly interfering with electrical properties of the structure. In this regard, it is preferred that the holes have dimensions that are significant less than the wavelength or wavelengths of interest such that they act as waveguides with cut off frequencies (lower limit) which are much higher than those of interest and as such do not significant impact the RF characteristics of the structure. In this regard it is preferred that the structures be 0.1, 0.01, and even 0.001 times smaller than the wavelengths of interest. As wavelengths increase such limiting values may result in etching holes that are too small for effective removal of sacrificial material and in such cases the reduction factor may have to be less.

Figure 14A:
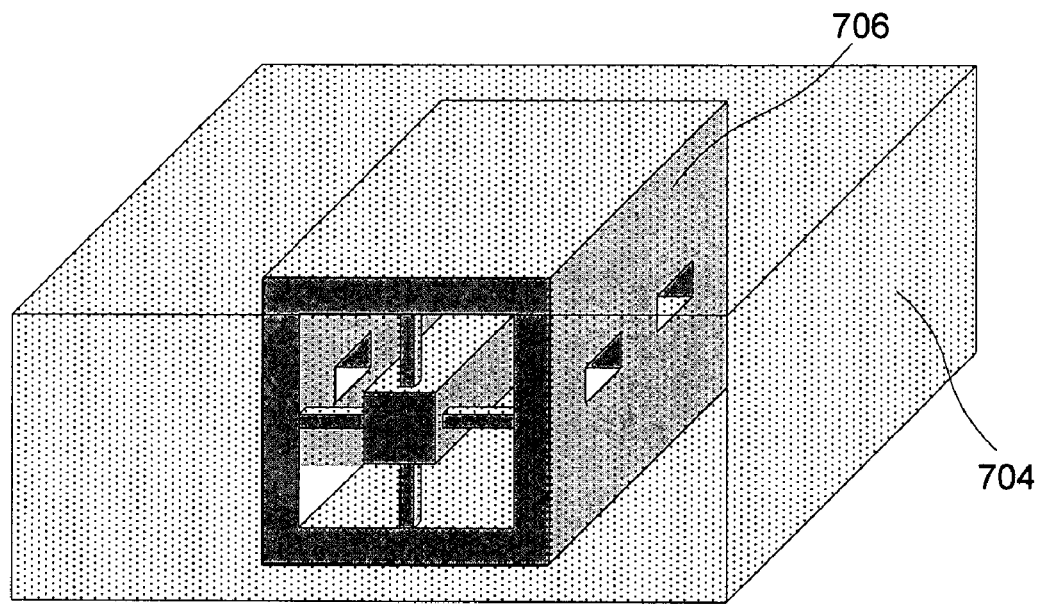
FIGS. 14(a) and 14(b) depict perspective views of coaxial filter elements embedded in sacrificial material and released from the sacrificial material, respectively, where the outer conductor of the coaxial components includes holes (in other than the intended microwave entrance and exit openings).
Figure 14B:
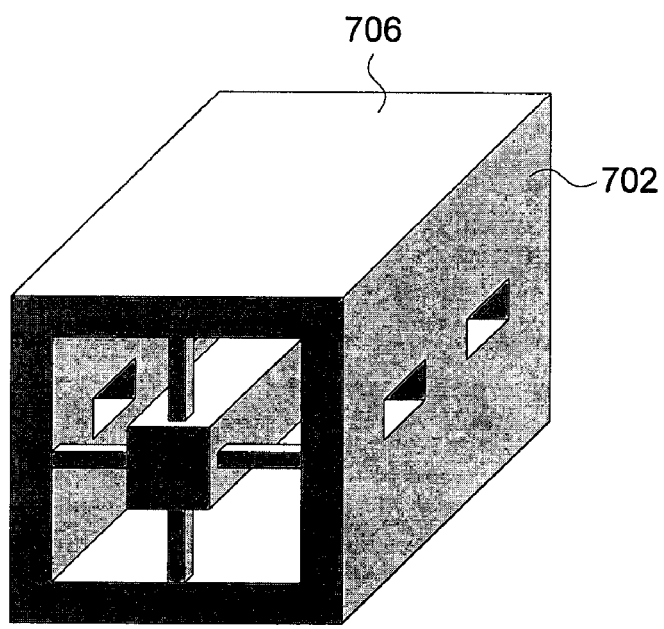

FIGS. 14(*a*) and 14(*b*) depict perspective views of coaxial filter elements having a modified design that includes openings (e.g. channels) along the length of the outer conductor where the openings are not intended to provide radiation entry or exit ports. In some of the production embodiments of the present invention such openings can aid in the release of a structural material 702 from a sacrificial material 704 that may have been deposited within the small cavities and channels within the outer conductor. In certain embodiments where chemical etching of the sacrificial material 704 is to occur, such holes may aid in allowing the etchant to get into the small cavities and channels. In other embodiments where a sacrificial material is to be separated from a structural material by melting and flowing the opening may not be needed but if located at selected locations (e.g. near the ends of blind channels and the like) the openings may allow appropriately supplied pressure to aid in the removal of the sacrificial material. FIG. 14(*a*) depicts a perspective view of the component 706 formed from structural material embedded in and filled by sacrificial material. FIG. 14(*b*) depicts a perspective view of the component 706 separated from the sacrificial material.

Figure 15A:
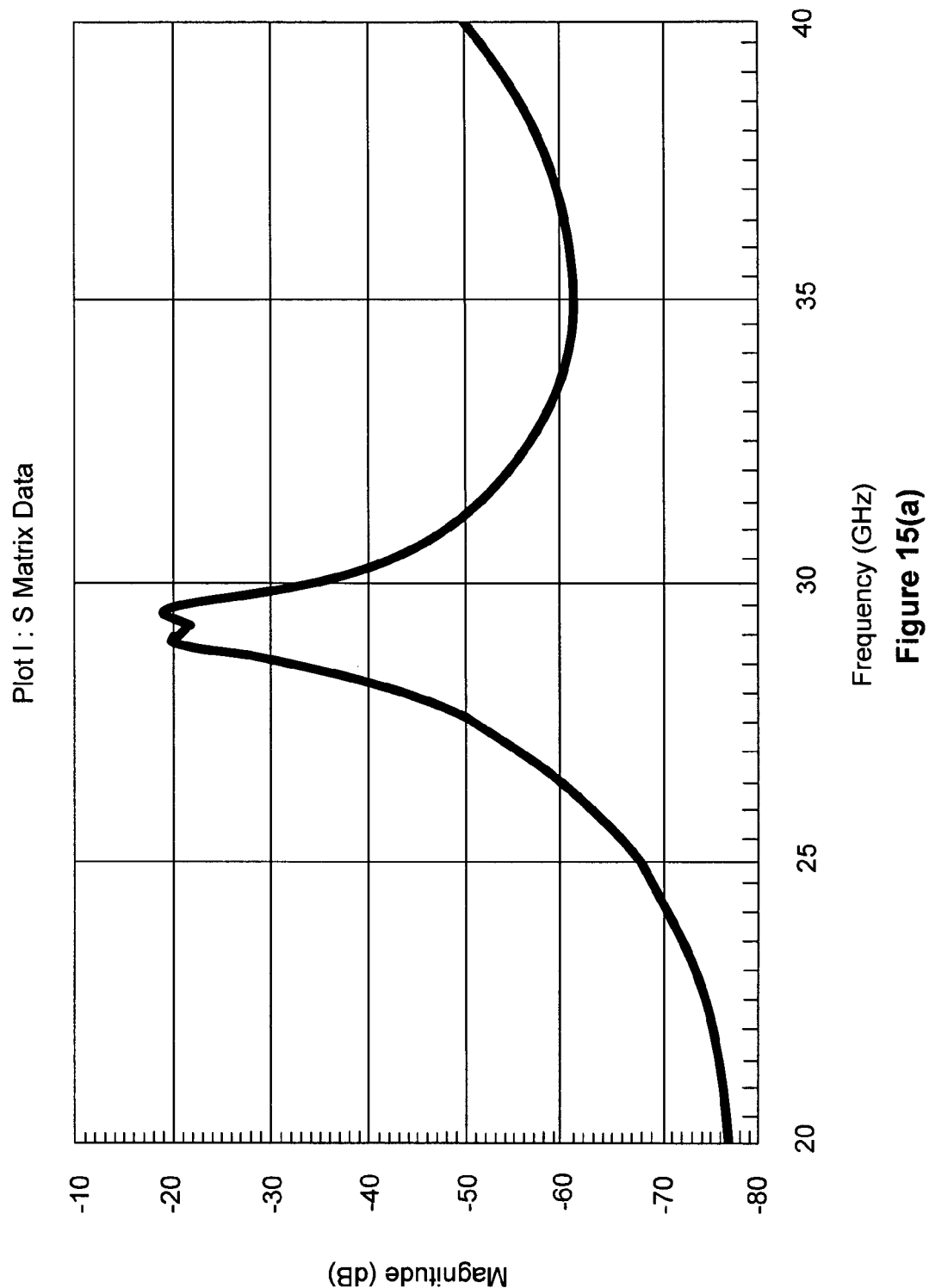
Figure 15C:
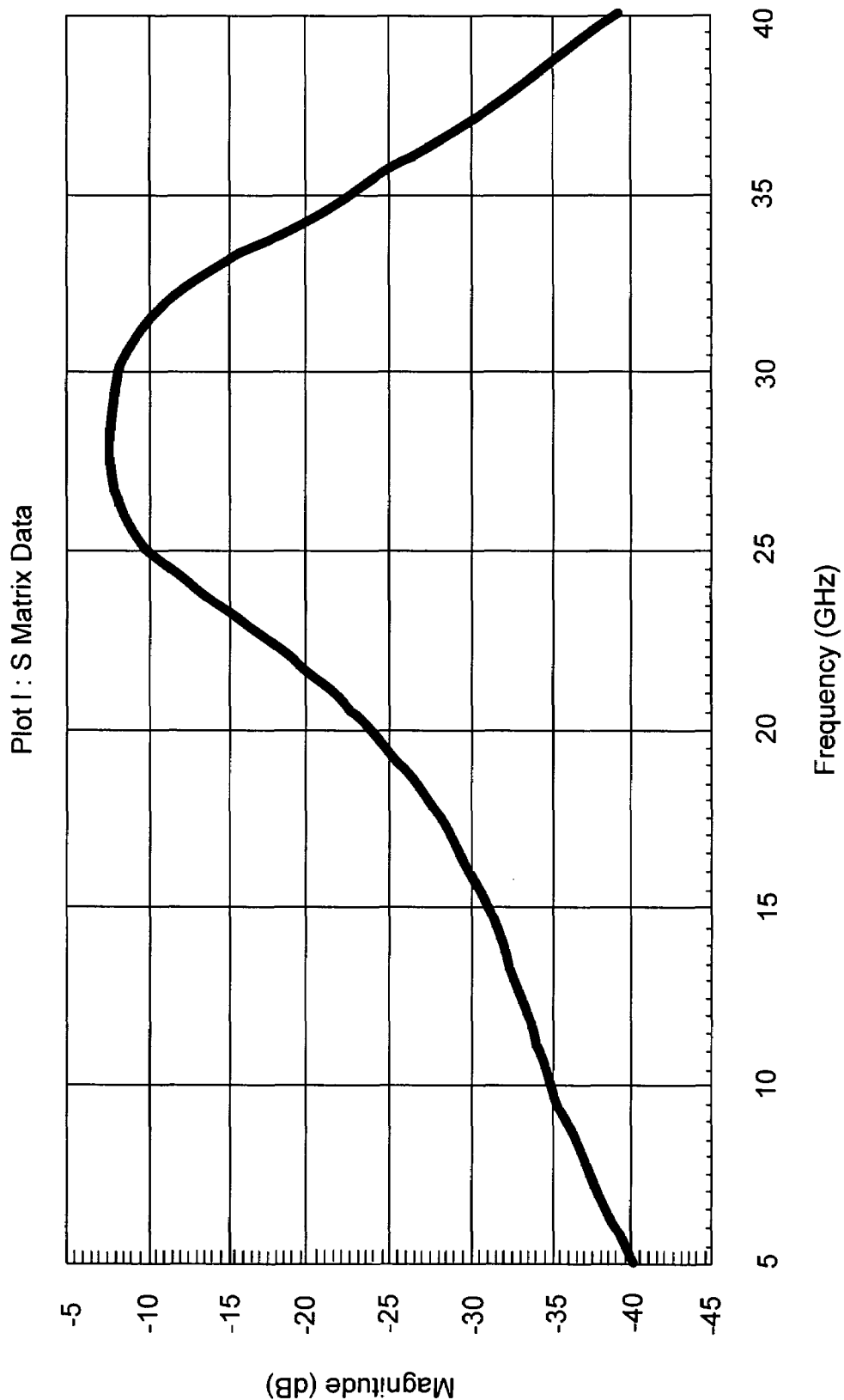
Figure 15D:
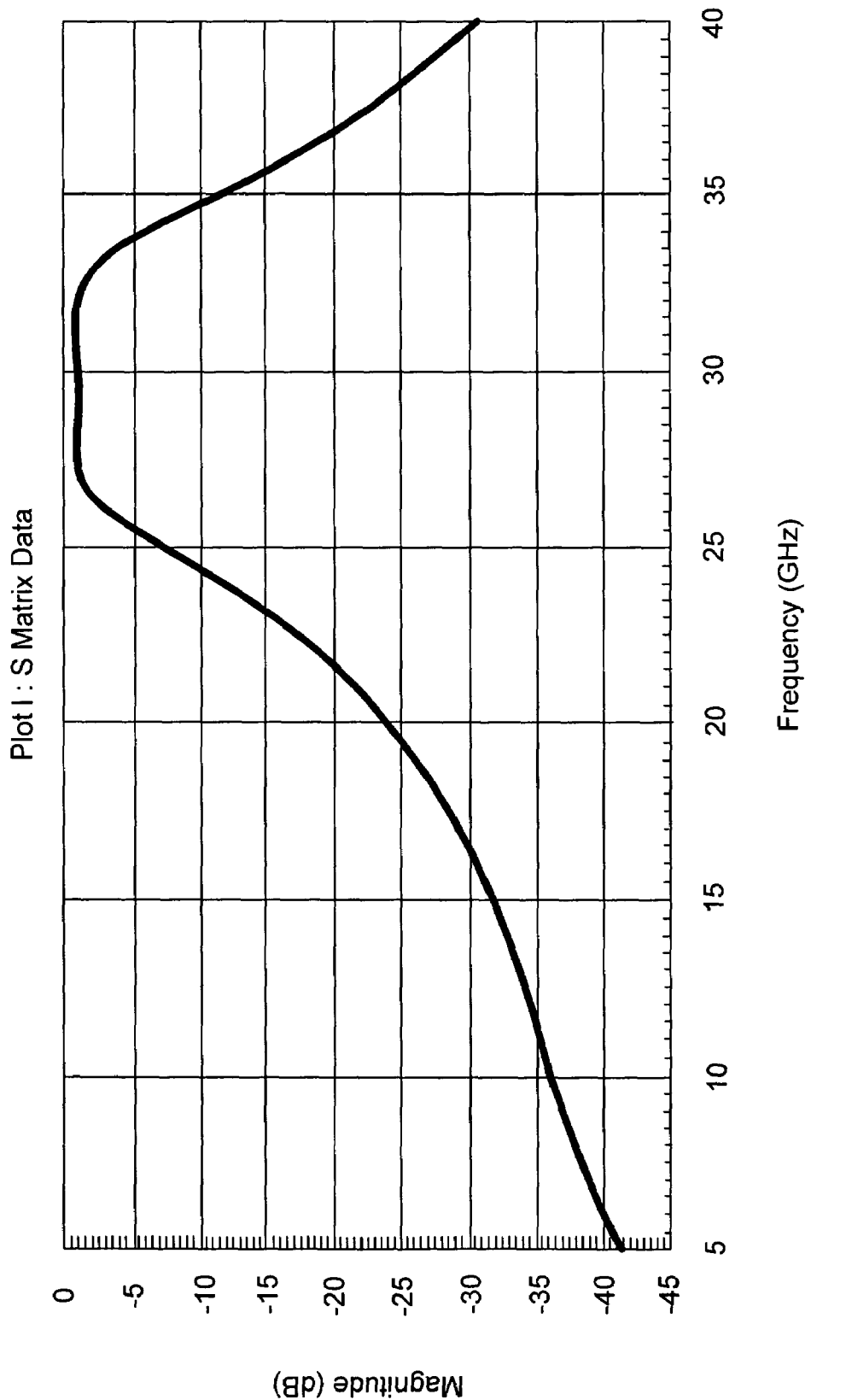

FIGS. 15(*a*)–15(*d*) illustrate plots of transmission versus frequency according to mathematical models for various filter designs discussed above. FIG. 15(*a*) depicts a modeled transmission plot for a 2 pole filter (three sets of spokes) having a configuration similar to that of FIG. 7(*a*) and made from nickel. The dimensions of the component are set forth in Table 5. As can be seen from the FIG. 15(*a*) the band pass of the filter is centered around 28 GHz with an insertion loss of about 20–22 dB in the pass band and an insertion loss in the stop band ranging from about 61–77 dB.

TABLE 5

| Feature | Dimension |
| --- | --- |
| Inside width of the outer conductor | 600 μm |
| Inside Height of the outer conductor | 300 μm |
| Width of the central (i.e. inner) conductor | 250 μm |
| Height of the central (i.e. inner) conductor | 75 μm |
| Height of the horizontally extending spokes | 40 μm |
| Thickness (i.e. dimension into the page) of the horizontally extending spokes | 100 μm |
| Spacing between successive sets of spokes | ~5–5.5 mm |

FIG. 15(*b*) depicts a model transmission plot for a 2 pole filter (three sets of protrusion on the inner conductor) as shown in FIG. 9(*d*) where the length of each protrusion is approximately $\lambda_o/4$ and the center-to-center spacing of the protrusions is approximately $\lambda_o/4$ having a configuration similar to that of FIG. 7(*a*) and made from nickel. The inside diameter of the outer conductor is about 240 μm, the diameter of the central conductor transitions between 20 μm and 220 μm with the protrusions having a length of about 15 mm and a center-to-center spacing of about 30 mm. From FIG. 15(*b*) the band pass is centered around 5 GHz with an insertion loss of 5–6 dB and an insertion loss in the stop band of about 13–18 dB.

FIGS. 15(*c*) and 15(*d*) depict model transmission plots for filters configured according to structures and dimensions for FIGS. 12(*a*)–12(*c*) where the structural material is nickel for FIG. 15(*c*) and is gold plated nickel for FIG. 15(*d*). FIG. 15(*c*) indicates an insertion loss on the order of 7–8 dB in the band pass region while FIG. 15(*d*) indicates a corresponding 1–2 dB insertion loss.

Figure 16:
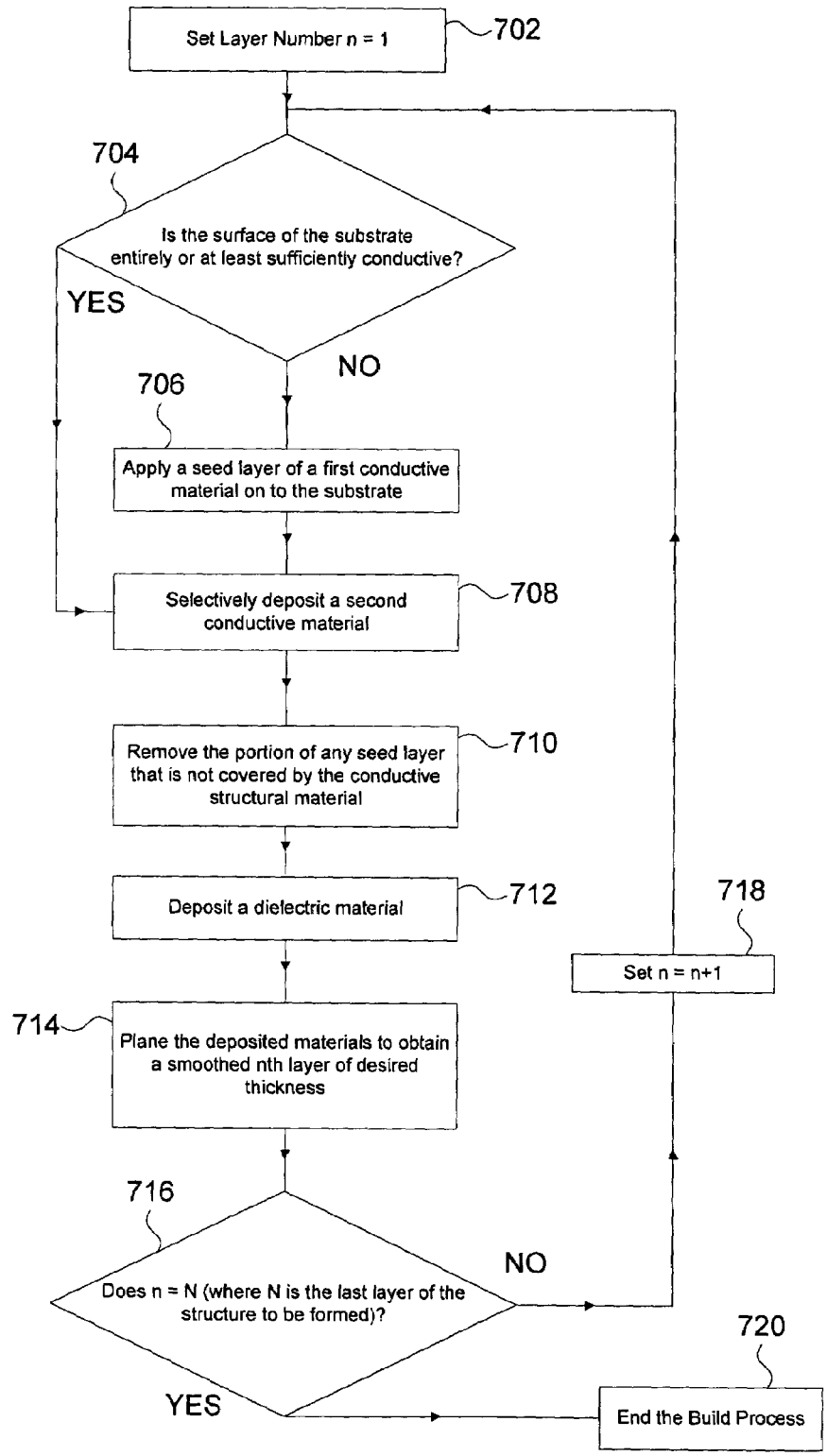
FIG. 16 depicts a flowchart of a sample electrochemical fabrication process that uses a single conductive material and a single dielectric material in the manufacture of a desired device/structure.

FIG. 16 provides a flow chart of an electrochemical fabrication process that builds up three-dimensional structures from a single conductive material and a single dielectric material that are deposited on a layer-by-layer basis.

The process of FIG. 16 begins with block 702 where a current layer number, n is set to a value of 1. The formation of the structure/device will begin with layer 1 and end with a final layer, N.

After setting the current layer number, the process moves forward to decision block 704 where an inquiry is made as to whether or not the surface of the substrate is entirely conductive or at least sufficiently conductive to allow electrodeposition of a conductive material in desired regions of the substrate. If material is only going to be deposited in a region of the substrate that is both conductive and has continuity with a portion of the substrate that receives electrical power, it may not be necessary for the entire surface of the substrate to be conductive. In the present embodiment, the term substrate is intended to refer to the base on which a layer of material will be deposited. As the process moves forward the substrate is modified and added to by the successive deposition of each new layer.

If the answer to the inquiry is "yes", the process moves forward to block 708, but if the answer is "no" the process first moves to block 706 which calls for the application of a seed layer of a first conductive material on to the substrate.

The application of the seed layer may occur in many different ways. The application of the seed layer may be done in a selective manner (e.g. by first masking the substrate and then applying the seed layer and thereafter removing the mask and any material that was deposited thereon) or in a bulk or blanket manner. A conductive layer may be deposited, for example, by a physical or chemical vapor deposition process. Alternatively it may take the form of a paste or other flowable material that can be solidified or otherwise bonded to the substrate. In a further alternative it may be supplied in the form of a sheet that is adhered or otherwise bonded to the substrate. The seed layer is typically very thin compared to the thickness of electrodeposition that will be used in forming the bulk of a layer of the structure.

After application of the seed layer, the process moves forward to block 708 which calls for the deposition of a second conductive material. The most preferred deposition process is a selective process that uses a dielectric CC mask that is contacted to the substrate through which one or more openings exist and through which openings the conductive material can be electrodeposited on to the substrate (e.g. by electroplating). Other forms of forming a net selective deposit of material may also be used. In various alternatives of the process, the first and second conductive materials may be different or they may be the same material. If they are the same the structure formed may have more isotropic electrical properties, whereas if they are different a selective removal operation may be used to separate exposed regions of the first material without damaging the second material.

The process then moves forward to block 710 which calls for removing the portion of the seed layer that is not covered by the just deposited conductive material. This is done in preparation for depositing the dielectric material. In some embodiments, it may be unnecessary to remove the seed layer in regions where it overlays the conductive material deposited on an immediately preceding layer but for simplicity in some circumstances a bulk removal process may still be preferred. The seed layer may be removed by an etching operation that is selective to the seed layer material (if it is different from the second conductive material). In such an etching operation, as the seed layer is very thin, as long as reasonable etching control is used, little or no damage should result to the seed layer material that is overlaid by the second conductive material. If the seed layer material (i.e. the first conductive material) is the same as the second conductive material, controlled etching parameters (e.g. time, temperature, and/or concentration of etching solution) should allow the very thin seed layer to be removed without doing any significant damage to the just deposited second conductive material.

Next the process moves forward to block 712 which calls for the deposition of a dielectric material. The deposition of the dielectric material may occur in a variety of ways and it may occur in a selective manner or in a blanket or bulk manner. As the process of the present embodiment forms planarized composite layers that include distinct regions of conductive material and distinct regions of the dielectric material, and as any excess material will be planed away, it does no harm (other than that associated with potential waste) to blanket deposit the dielectric material and in fact will tend to offer broader deposition possibilities. The deposition of the dielectric material may occur by spraying, sputtering, spreading, jetting or the like.

Next, the process proceeds to block 714 which calls for planarization of the deposited material to yield an nth layer of the structure having desired net thickness. Planarization may occur in various manners including lapping and/or CMP.

After completion of the layer by the operation of block 714, the process proceeds to decision block 716. This decision block inquires as to whether the nth layer (i.e. the current layer is the last layer of the structure (i.e. the Nth layer), if so the process moves to block 720 and ends, but if not, the process moves to block 718.

Block 718 increments the value of "n", after which the process loops back to block 704 which again inquires as to whether or not the substrate (i.e. the previous substrate with the addition of the just formed layer) is sufficiently conductive.

The process continues to loop through blocks 704–718 until the formation of the Nth layer is completed.

Figure 17A:
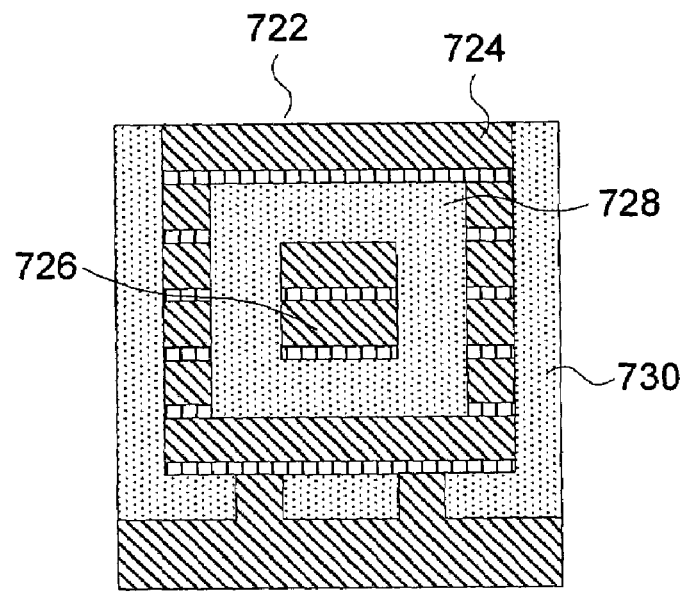
FIG. 17(a) depicts an end view of a coaxial structure that can be produced using the process of FIG. 16.

FIG. 17(a) depicts an end view of a coaxial structure 722 that includes an outer conductive element 724, and inner conductive element 726, an embedded dielectric region 728 and an external dielectric region 730. In some embodiments that extend the process of FIG. 16, it may be possible to use post-process (i.e. process that occur after the deposition of all layers) operations to remove a portion or all of the dielectric from region 730 and a portion or all of the dielectric from region 728 under the assumption that such removal from region 728 would be done in such away as to ensure adequate support for the inner conductive element 726.

Figure 17B:
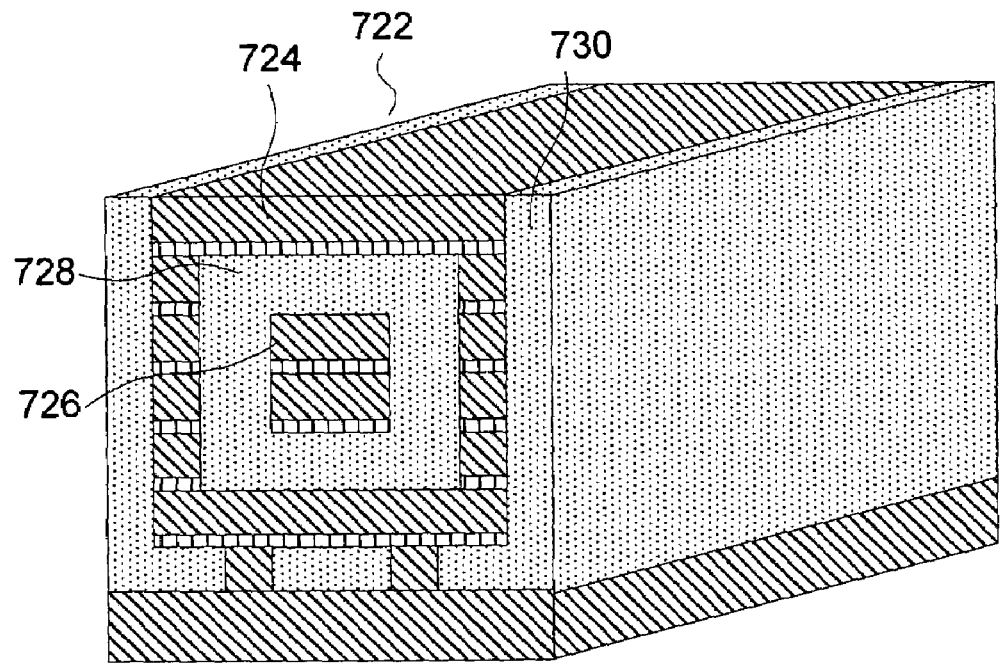
FIG. 17(b) depicts a perspective view of the coaxial structure of FIG. 17(a)
Figure 18A:
FIGS. 18(a)–18(j) illustrate application of the process flow of FIG. 16 to form the structure of FIGS. 17(a) and 17(b).
Figure 18:
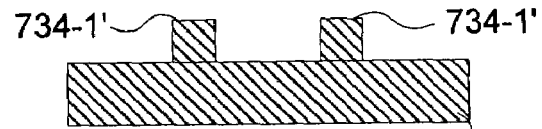
Figure 18:
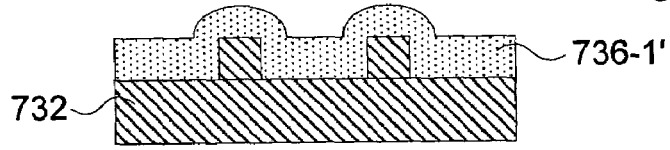
Figure 18:
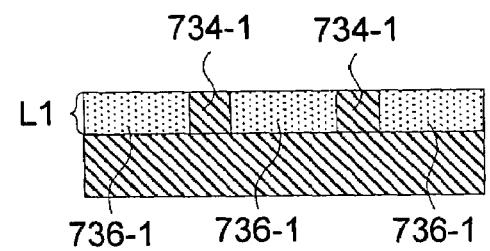
Figure 18:
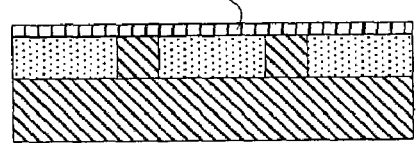
Figure 18:
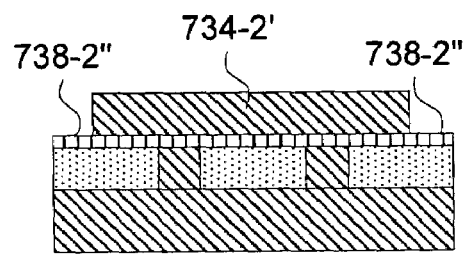
Figure 18:
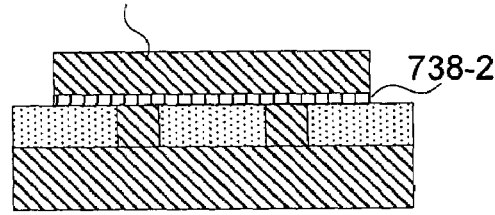
Figure 18:
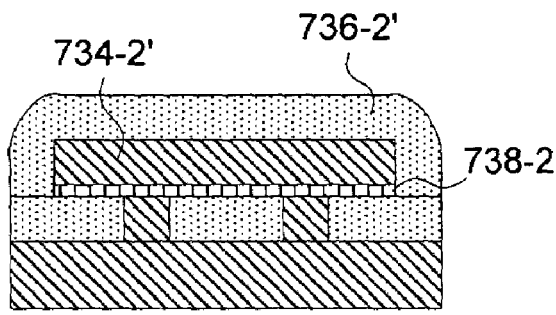
Figure 18:
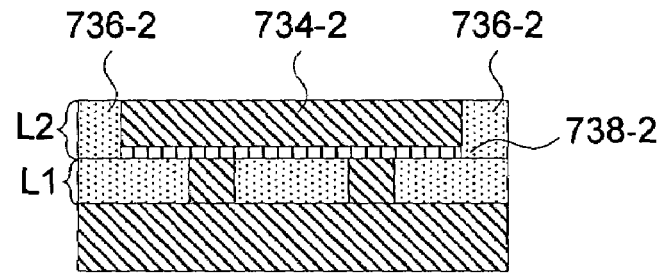
Figure 18:
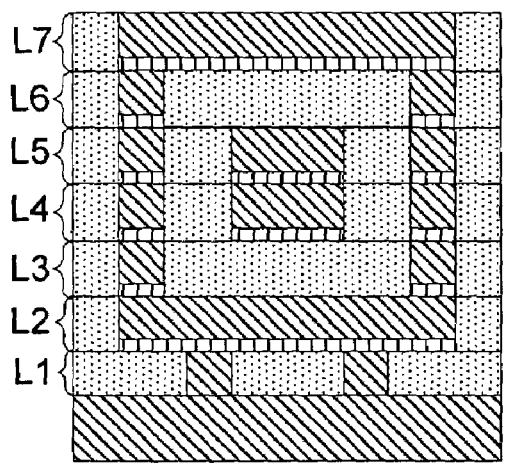

FIGS. 18(a)–18(j) illustrate application of the process flow of FIG. 16 to form a structure similar to that depicted in FIGS. 17(a) and 17(b). FIGS. 18(a)–18(j) depict vertical plan views displaying a cross-section of the structure as it is being built up layer-by-layer. FIG. 18(a) depicts the starting material of the process (i.e. a blank substrate 732 onto which layers will be deposited). FIG. 18(b) depicts the resulting selectively deposited second conductive material 734-1' for the first layer. In beginning this process it was assumed that the supplied substrate was sufficiently conductive to allow deposition without the need for application of a seed layer. FIG. 18(c) illustrates the result of a blanket deposition of the dielectric material 736-1' (according to operation/block 712) while FIG. 18(d) illustrates the formation of the completed first layer L1 as a result of the planarization operation of operation/block 714. The first completed layer has a desired thickness and distinct regions of conductive material 734-1 and dielectric material 736-1.

FIG. 18(e) illustrates the result of the initial operation (block 706) associated with the formation of the second layer. The application of a seed layer 738-2' was necessary for the second layer as a significant portion of the first layer is formed of a dielectric material and furthermore the center conductive region is isolated from the two outer conductive regions. FIG. 18(f) illustrates the result of the selective deposition of the second conductive material 734-2' (operation 708) for the second layer and further illustrates that some portions 738-2" of the seed layer 738-2' are not covered by the second conductive material 734-2', while FIG. 18(g) illustrates the result of the removal of the uncovered portions of the seed layer 738-2' (operation 710) which yields the net seed layer for the second layer 738-2. FIG. 18(h) illustrates the result of the blanket deposition of the dielectric material 736-2' for the second layer (operation 712). FIG. 18(i) illustrates the completed second layer L2 that results from the planarization process (operation 714) and that includes distinct regions of conductive material 734-2 and dielectric material 736-2.

FIG. 18(j) illustrates the formation of the completed structure from layers L1–L7. The operations for forming layers L3–L7 are similar to those used during the formation of L2. The structure device of FIG. 18(j) may be put to use or it may undergo additional processing operations to prepare it for its ultimate use.

Various alternatives to the embodiment of FIG. 16 are possible. In one alternative, the order of deposition could be reversed. In another process instead of depositing material selectively, each material may be deposited in bulk, and selective etching operations used to yield the "net" selective locating of materials.

Figure 19:
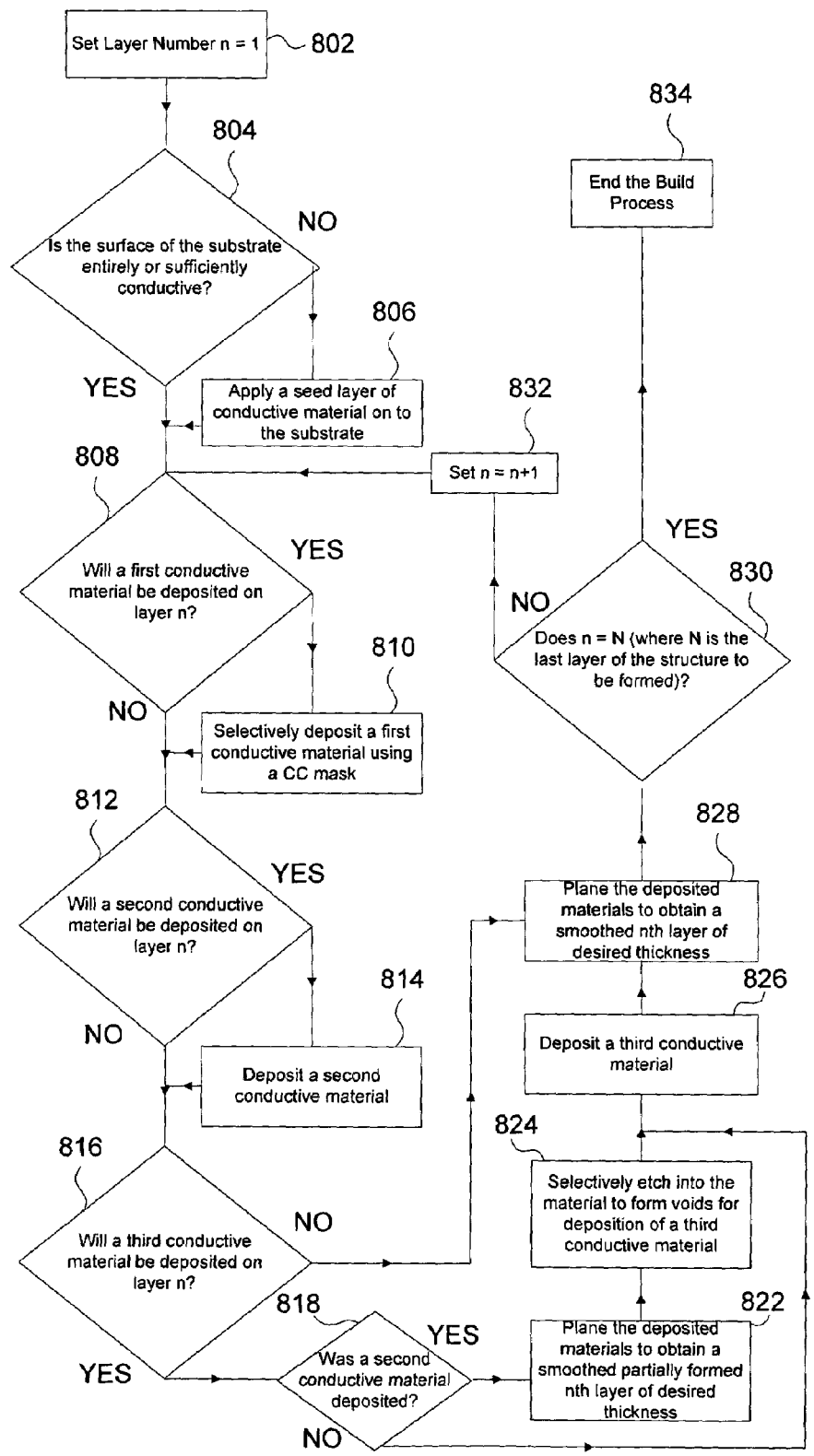
FIG. 19 depicts a flowchart of a sample electrochemical fabrication process that includes the use of three conductive materials.

FIG. 19 provides a flow chart of an electrochemical fabrication process that is somewhat more complex than the process of FIG. 16. The process of FIG. 19 builds up three-dimensional structures/devices using three conductive materials that are deposited on a layer-by-layer basis. As all materials in this process are conductors with the possible exception of the initial substrate, a simplification of the layer formation process results as compared to the process of FIG. 16. However, as three materials may or may not be deposited on each layer, this process adds not only complexity of the process but also can yield structures of enhanced functionality and versatility.

The process starts with block 802 where a current layer number is set to one (n=1). The process then moves to decision block 804 where the inquiry is made as to whether the surface of the substrate is entirely or at least sufficiently conductive. If the answer to this inquiry is "yes" the process moves forward to block 808. On the other hand if the answer is "no", the process moves to block 806 which calls for the application of a seed layer of a conductive material on to the substrate. The process then loops to decision block 808.

In block 808, the inquiry is made as to whether or not a first conductive material will be deposited on the nth layer (i.e. on the current layer). If the answer to this inquiry is "no" the process moves forward to block 812. On the other hand if the answer is "yes", the process moves to block 810 which calls for the selective deposition of the first conductive material. The process then loops to decision block 812.

In block 812, the inquiry is made as to whether or not a second conductive material will be deposited on the nth layer (i.e. on the current layer). If the answer to this inquiry is "no" the process moves forward to block 816. On the other hand if the answer is "yes", the process moves to block 814 which calls for the deposition of the second conductive material (which may be done selectively or in bulk). The process then loops to decision block 816.

In block 816, the inquiry is made as to whether or not a third conductive material will be deposited on the nth layer (i.e. on the current layer). If the answer to this inquiry is "no" the process moves forward to block 828. On the other hand if the answer is "yes", the process moves to decision block 818.

In block 818 the inquiry is made as to whether or not a second conductive material was deposited on the nth layer (i.e. on the current layer). If the answer to this inquiry is "no" the process moves forward to block 826. On the other hand if the answer is "yes", the process moves to block 822 which calls for the planarization of the partially formed layer at a desired level which may cause an interim thickness of the layer to be slightly more than the ultimate desired layer thickness for the final layer. The process then moves to block 824 which calls for selectively etching into the deposited material(s) to form one or more voids into which the third material will be deposited. The process then completes the loop to block 826.

Block 826 calls for the deposition of the third conductive material. The deposition of the third conductive material may occur selectively or in bulk. The process then loops to block 828.

Block 828 calls for planarization of the deposited materials to obtain a final smoothed nth layer of desired thickness.

After completion of the formation of the nth layer by the operation of block 828, the process proceeds to decision block 830. This decision block inquires as to whether the nth layer (i.e. the current layer) is the last layer of the structure (i.e. the Nth layer), if so the process moves to block 834 and ends, but if not, the process loops to block 832.

Block 832 increments the value of "n", after which the process loops back to block 808 which again inquires as to whether or not a first conductive material is to be deposited on the nth layer. The process then continues to loop through blocks 808–832 until the formation of the Nth layer is completed.

Figure 20A:
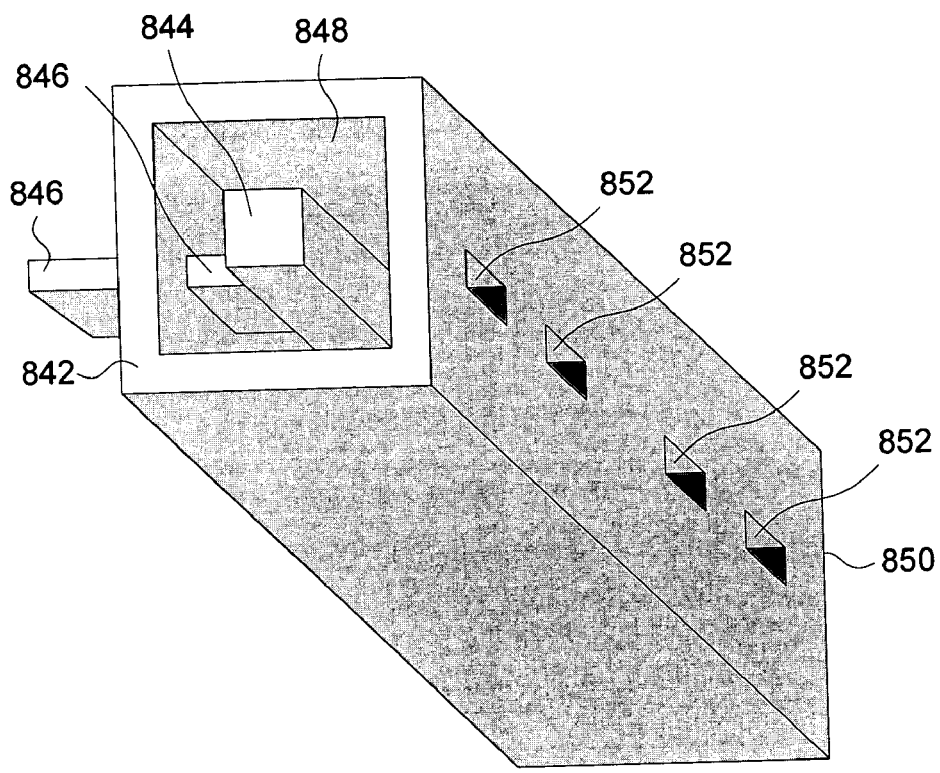
FIGS. 20(a) and 20(b) depict perspective views of structures that include conductive elements and dielectric support structures that may be formed according to extensions of the process of FIG. 19.
Figure 20B:
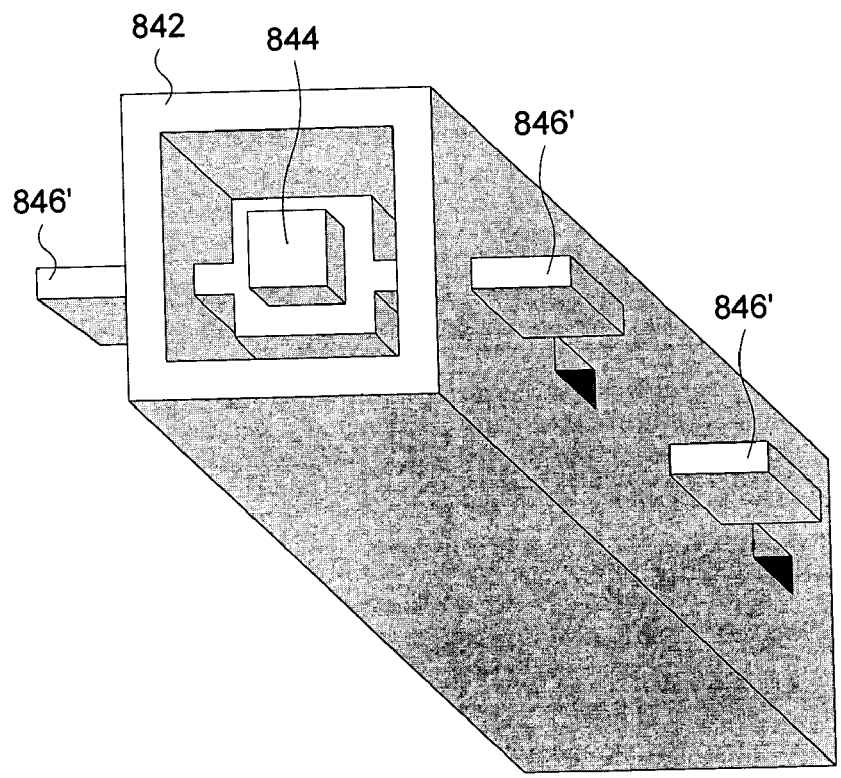

FIGS. 20(a) and 20(b) depict perspective views of structures that include conductive elements and dielectric support structures that may be formed in part according to the process of FIG. 19. The coaxial structure/device of FIG. 20(a) includes an outer conductor 842, an inner conductor 844, and dielectric support structures 846 that hold the two conductors in desired relative positions. During formation, the inner and outer conductors are formed from one of the three conductive materials discussed in relation to the process of FIG. 19 (a primary material) and the outer conductor is formed not only with entry and exit ports 848 and 850 but also with processing ports 852. Within some of these processing ports a secondary conductive material is located and which is made to contact the inner conductor 844. In the remainder of the build volume a tertiary conductive material is located. After formation of all layers of the structure, the secondary conductive material is removed and a dielectric material 846 is made to fill the created void or voids. Thereafter, the tertiary conductive material is removed leaving the hollowed out structure/device of FIG. 20(a). It should be understood that in the discussion of FIG. 20(a), the references to the primary, secondary, and tertiary materials do correlate one-to-one with the first, second, and third conductive materials of the process of FIG. 19 but not necessarily respectively.

FIG. 20(b) depicts a similar structure to that of FIG. 20(a) with the exception that the inner conductor and outer conductor positions are more firmly held into position by modified dielectric structures 846'.

Figure 21A:
FIGS. 21(a)–21(t) illustrate application of the process flow of FIG. 19 to form a coaxial structure similar to that depicted in FIG. 20(a) where two of the conductive materials are sacrificial materials that are removed after formation of the layers of the structure and wherein a dielectric material is used to replace one of the removed sacrificial materials.

FIGS. 21(a)–21(t) illustrate application of the process flow of FIG. 19 to form a coaxial structure similar to-that depicted in FIG. 20(a) where two of the conductive materials are sacrificial materials that are removed after formation of the layers of the structure and wherein a dielectric material is used to replace one of the removed sacrificial materials.

Figure 21B:
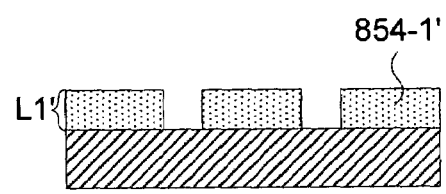
Figure 21C:
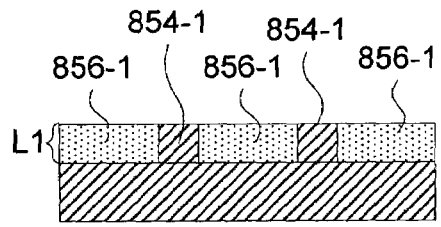
Figure 21D:
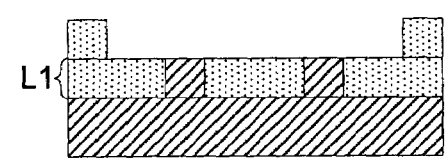
Figure 21E:
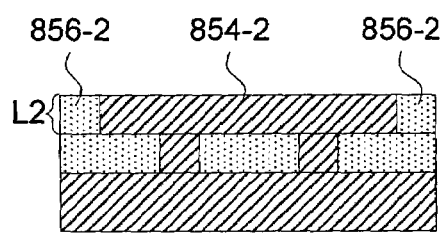
Figure 21F:
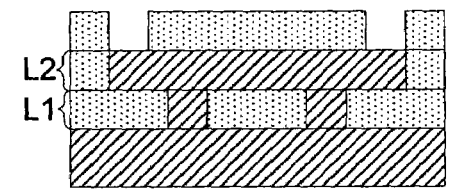
Figure 21G:
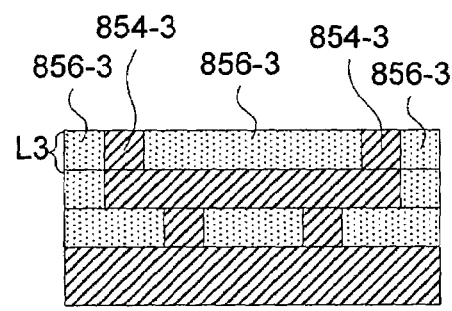
Figure 21H:
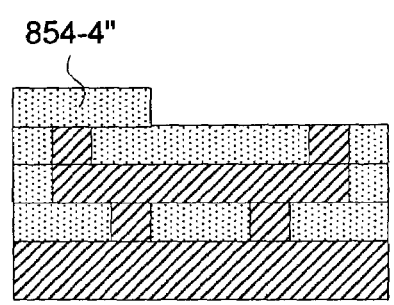
Figure 21I:
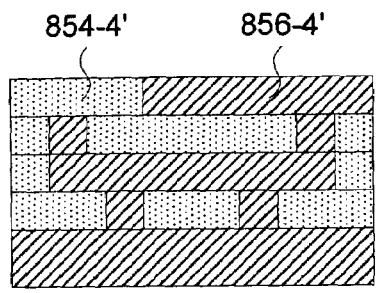
Figure 21J:
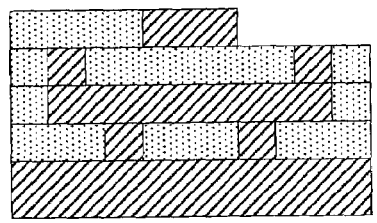
Figure 21K:
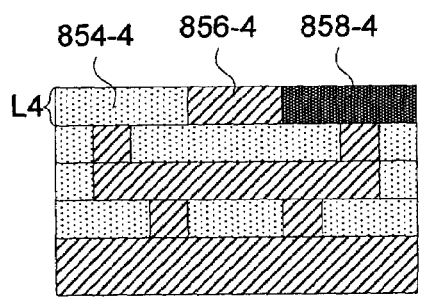
Figure 21L:
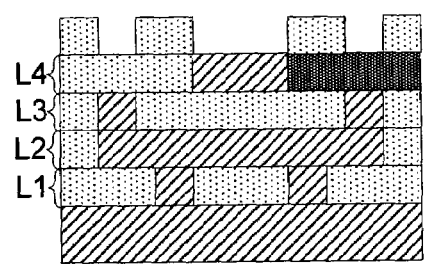
Figure 21M:
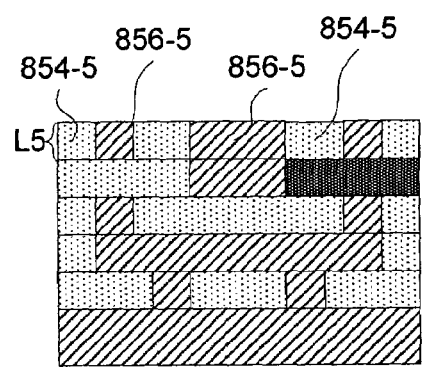
Figure 21N:
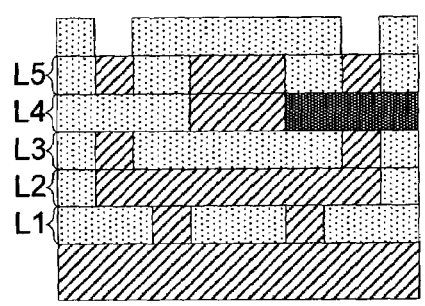
Figure 21O:
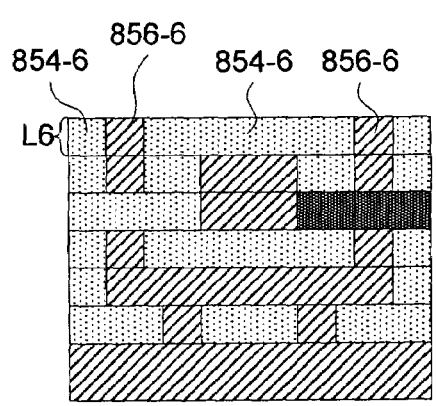
Figure 21P:
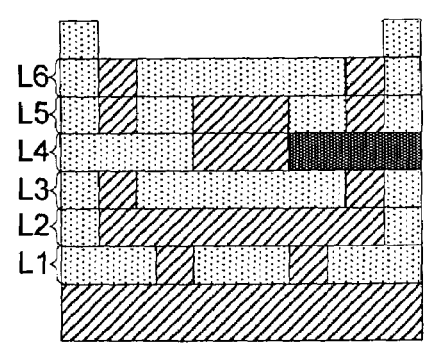

FIG. 21(a) depicts the starting material of the process (i.e. a blank substrate 852 onto which layers will be deposited). In moving through the process, it is assumed that the supplied substrate was sufficiently conductive to allow deposition without the need for application of a seed layer (i.e. the answer to the inquiry of 804 was "yes") and that the answer to the inquiry of 808 was also "yes". FIG. 21(b) depicts the result of the operation of block 819 related to the deposit of the first conductive material 854 for producing an initial deposition 854-1' for the first layer. Next, it is assumed the answer to the inquiry of block 812 is "yes" for the first layer. It is also assumed for the first layer that the answer to the inquiry of block 816 is "no". As such FIG. 21(*c*) illustrates the combined deposition of the second material 856 (block 810) and the planarization of the deposited first and second conductive materials 854-1 and 856-1 (block 828) to complete the formation of the first layer L1. FIGS. 21(*d*) and 21(*e*) represent the same processes and operations as were applied to the formation of the first layer for formation of the second layer L2 which is composed of distinct regions 854-2 and 856-2 of first and second conductive materials. FIGS. 21(*f*) and 21(*g*) represent the same processes and operations as were applied to the formation of the first and second layers for formation of the third layer L3 which is composed of distinct regions 854-3 and 856-3 of first and second conductive materials.

FIGS. 21(*h*)–21(*k*) illustrate the results of some of the operations associated with forming the fourth layer L4 of the structure/device. FIG. 21(*h*) depicts the result of the operation of block 810 related to the deposit of the first conductive material 854 for producing an initial deposition 854-4" for the fourth layer. Next, it is assumed the answer to the inquiry of block 812 is "yes" for the fourth layer. It is also assumed for the fourth layer that the answer to the inquiry of block 816 is "yes". As such, FIG. 21(*i*) illustrates the combined deposition of the second material 856 (block 810) and the planarization of the deposited first and second conductive materials 854-4' and 856-4' (block 822) to form a smooth but only partially formed fourth layer. FIG. 21(*j*) illustrates the result of operation 824 in etching away a portion of the planed deposit 856-4'. FIG. 21(*k*) illustrates the combined results of operations 826 and 828 to yield the completed fourth layer L4 which is composed of distinct regions 854-4 and 856-4, and 858-4 of first conductive material 854, the second conductive material 856, and the third conductive material 858.

FIGS. 21(*l*) and 21(*m*), FIGS. 21(*n*) and 21(*o*), and 21(*p*) and 21(*q*) represent the same processes and operations as were applied to the formation of the first three layers for formation of the fifth through seventh layers (L5, L6, and L7) which are composed respectively of distinct regions 854-5 and 856-5, 854-6 and 856-6, and 854-7 and 856-7 of first and second conductive materials.

FIGS. 21(*r*)–21(*t*) represent an extension of the process flow of FIG. 19. FIG. 21(*r*) represents the result of the selective removal (e.g. by etching or melting) of the third conductive material to form a void 866 that extends through an outer wall 862 of first conductive material to contact an isolated interior structure 864 of the second conductive material (e.g. the inner conductor of a coaxial transmission line). FIG. 21(*s*) depicts the structure of FIG. 21(*r*) with the void 866 filled by a selected dielectric material 860 which contacts both the outer wall 862 and the interior structure 864. FIG. 21(*t*) depicts the structure of FIG. 21(*s*) with the first conductive material removed to yield a final substantially air filled structure with the interior structure 864 supported relative to the outer wall by one or more dielectric structures. FIG. 21(*t*) also depicts an opening in the structure.

Figure 22A:
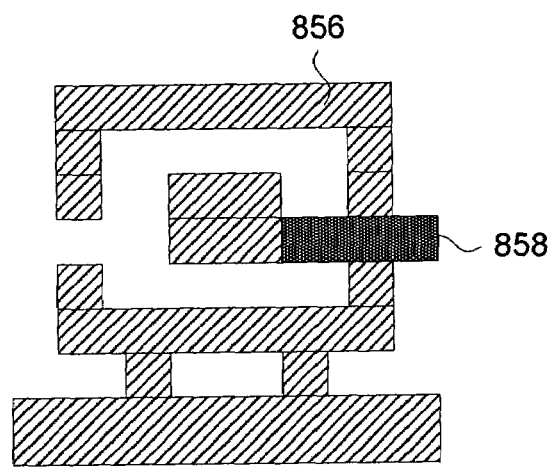
FIGS. 22(a)–22(c) illustrate the extension of the removal and replacement process of FIGS. 21(r)–21(t).
Figure 22B:
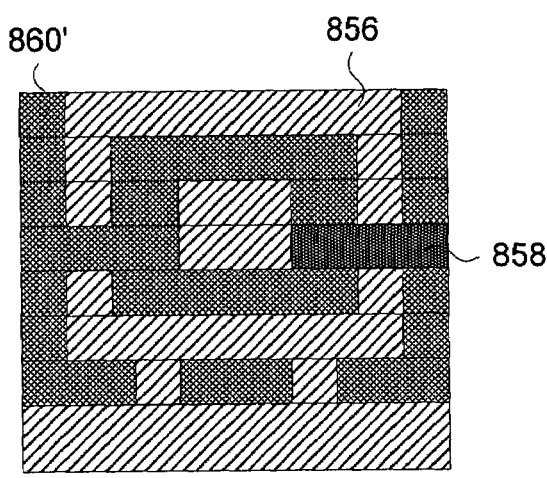
Figure 22C:
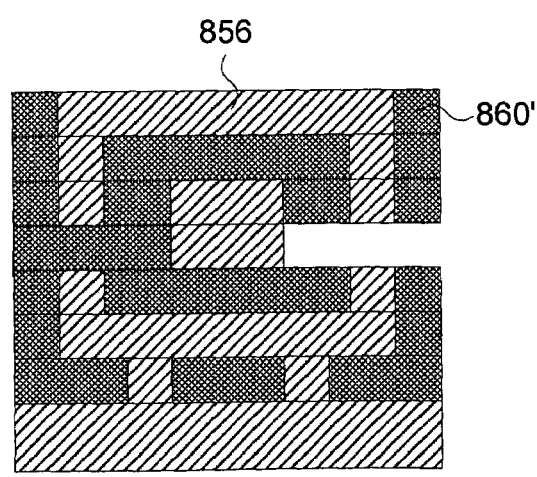

FIGS. 22(*a*)–22(*c*) depict application of the first removal, back filling, and second removal operations to the opposite materials as illustrated in FIGS. 21(*r*)–21(*t*). In FIGS. 22(*a*)–22(*c*) the first conductive material 854 is removed to create a void, the void is filled with a dielectric 860', and then the third conductive material is removed.

In alternative embodiments, the processes of FIGS. 21(*r*)–21(*t*) and 22(*a*)–22(*c*) can be extended to include a second filling operation to fill the void that results from the final removal operation. The second filling operation may use the same or a different dielectric than was originally used. In still further alternatives more than three conductive materials may be used such that the resulting structure/device is comprised of two or more conductive materials, and/or is accompanied by two, three or more solid, liquid, or gaseous dielectrics.

Figure 23A:
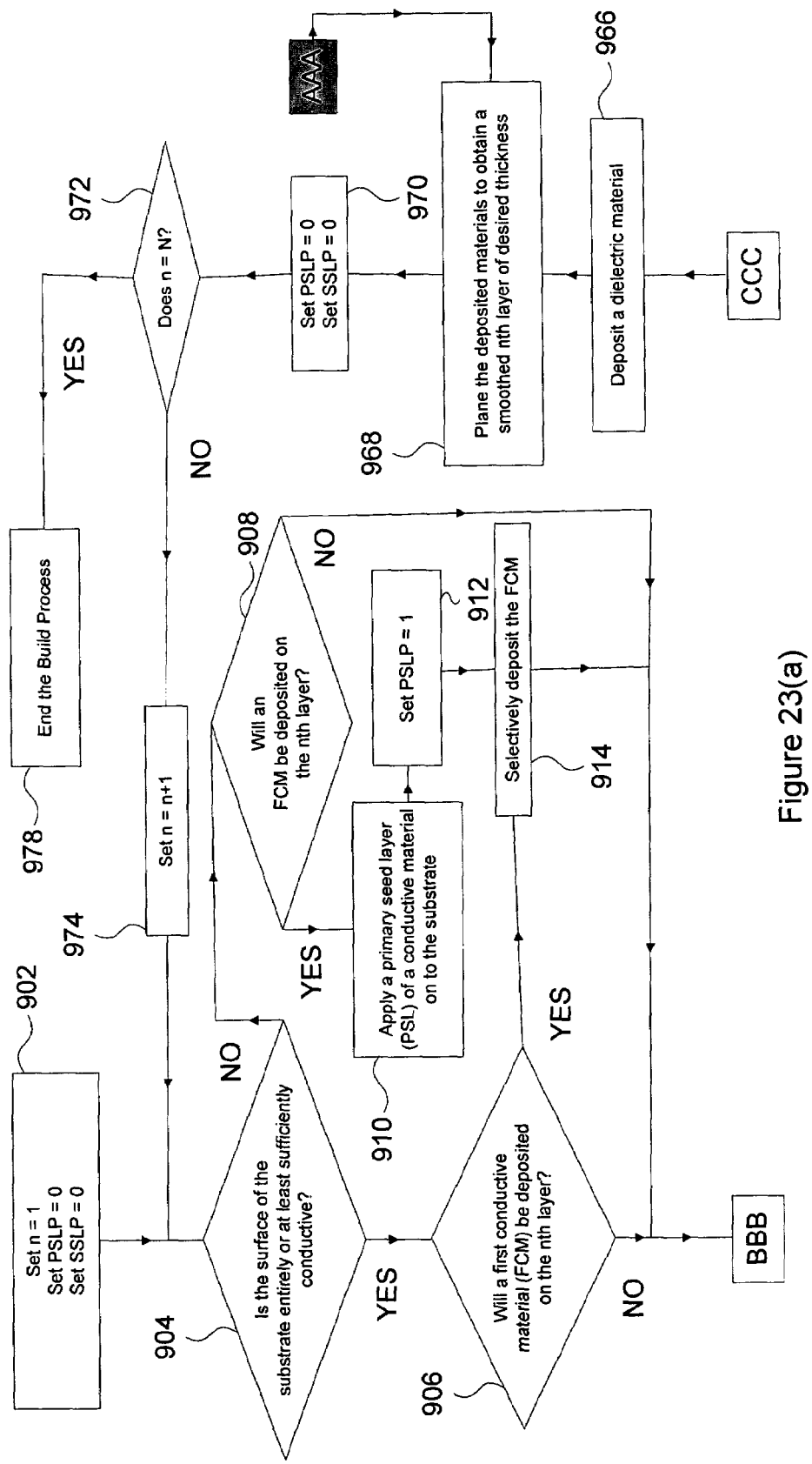
FIGS. 23(a) and 23(b) depict a flowchart of a sample electrochemical fabrication process that involves the use of two conductive materials and a dielectric material.
Figure 23B:
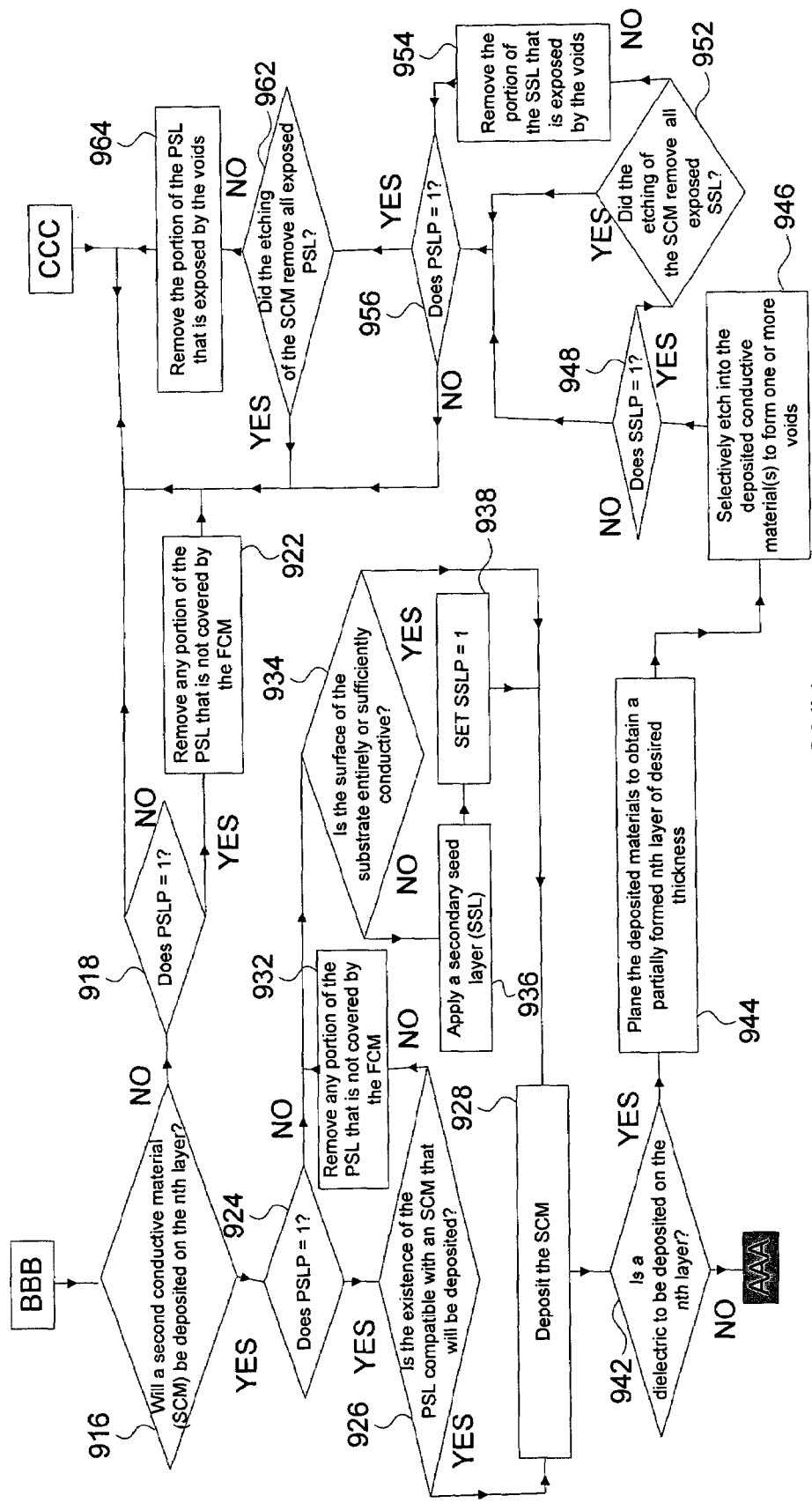

FIGS. 23(*a*) and 23(*b*) provide a flow chart of an electrochemical fabrication process that builds up three-dimensional structures/devices using two conductive materials and one dielectric material.

The process of FIGS. 23(*a*) and 23(*b*) begins at block 902 with the setting of three process variables: (1) the layer number is set to one, n=1, (2) a primary seed layer parameter is set to zero, PSLP=0, and (3) a second seed layer parameter is set to zero, SSLP=0. The process then proceeds to decision block 904 where the inquiry is made as to whether the surface of the substrate is entirely or at least sufficiently conductive? If "yes" the process proceeds to decision block 906 and if "no" the process proceeds to block 908.

In blocks 906 and 908, the same inquiry is made as to whether a first conductive material (FCM) will be deposited on the nth layer (i.e. the first layer). If the answer to the inquiry of block 906 is "yes", the process proceeds to block 914 and if it is "no", the process proceeds to block 916. If the answer to the inquiry of block 908 is "yes", the process proceeds to block 910 and if it is "no", the process proceeds to block 916.

Block 910 calls for application of a primary seed layer (PSL) of a conductive material on to the substrate. This seed layer may be applied in a variety of ways some of which have been discussed previously herein. From Block 910 the process proceeds to block 912 where the primary seed layer parameter is set to one, PSLP=1, which indicates that a primary seed layer has been deposited on the current layer.

From block 912 and from a "yes" answer from block 906 the process proceeds to block 914 which calls for the selectively deposition of the FCM. In some alternatives, the preferential deposition is via a CC mask. From block 914, from a "no" answer in block 908, and from a "no" answer in block 906 the process proceeds to decision block 916.

In decision block 916 an inquiry is made as to whether a second conductive material (SCM) will be deposited on the nth layer (i.e. the first layer in this case). If the answer to the inquiry of block 916 is "yes", the process proceeds to block 924 and if it is "no", the process proceeds to block 918.

In blocks 924 and 918, the same inquiry is made as to whether a primary seed layer has been deposited on the first layer (i.e. Does PSLP=1?). If the answer to the inquiry of block 924 is "yes", the process proceeds to block 926 and if it is "no", the process proceeds to block 934. If the answer to the inquiry of block 918 is "yes", the process proceeds to block 922 and if it is "no", the process proceeds to block 966.

In decision block 926 an inquiry is made as to whether the existence of the PSL is compatible with an SCM that will be deposited. If the answer to the inquiry of block 924 is "yes", the process proceeds to block 928 and if it is "no", the process proceeds to block 932.

Blocks 932 and 922 call for the removal of any portion of the PSL that is not covered by the FCM. From block 932 the process proceeds to block 934, as did a "no" response in block 924, and from block 922 the process proceeds to block 966. In decision block 934 an inquiry is made as to whether the surface of the substrate is entirely or sufficiently conductive. Though this question was asked previously, the answer may have changed due to a different pattern of conductive material to be deposited or due to the removal of a previously supplied seed layer because it is incompatible with the second conductive material that is to be deposited. If the answer to the inquiry of block 934 is "yes", the process proceeds to block 928 and if it is "no", the process proceeds to block 936.

Block 936 calls for application of a secondary seed layer (SSL) which will allow a second conductive material to be deposited in a subsequent operation. After which the process proceeds to block 938 where SSLP is set to one, thereby indicating that the present layer received the secondary seed layer which information will be useful in subsequent operations.

Block 928 is reached by a "yes" response to either of block 926 or 934, or via block 938. Block 928 calls for the deposition of the second conductive material (SCM). This deposition operation may be a selective operation or a blanket operation.

From block 928 the process proceeds to decision block 942 where an inquiry is made as to whether a dielectric will be deposited on the nth layer (i.e. the first layer). If the answer to the inquiry of block 942 is "yes", the process proceeds to block 944 and if it is "no", the process proceeds to block 968.

Block 944 calls for planarizing the deposited materials to obtain a partially formed nth layer having a desired thickness which may be different from the final thickness of the layer. After planarization the process proceeds to block 946 which calls for the selectively etching into one or both of the deposited conductive materials to form one or more voids into which the dielectric may be located after which the process proceeds to block 948. If the answer to the inquiry of block 948 is "yes", the process proceeds to block 952 and if it is "no", the process proceeds to block 956.

Decision block 952 inquires as whether the etching of block 946 resulted in the removal of all exposed SSL? If the answer to the inquiry of block 952 is "yes", the process proceeds to block 956 and if it is "no", the process proceeds to block 954.

Block 954 calls for the removal of the portion of the SSL that is exposed by the voids formed in block 946. After the operation of block 954, the process proceeds to decision block 956.

Decision block 956 inquires as whether PSLP is equal to one. If the answer to the inquiry of block 956 is "yes", the process proceeds to decision block 962 and if it is "no", the process proceeds to block 966.

Decision block 962 inquires as to whether the etching of the SCM removed all the exposed PSL. If the answer to the inquiry of block 956 is "yes", the process proceeds to decision block 966 and if it is "no", the process proceeds to block 964.

Block 964 calls for the removal of the portion of the PSL that is exposed by the voids created in block 946. After the operation of block 964 the process proceeds to block 966.

Block 966 calls for the deposition of the dielectric material. The deposition process may be selective or of a blanket nature and various processes are possible some of which were discussed elsewhere herein.

Block 968 calls for planarization of the deposited materials to obtain a final smoothed nth layer of desired thickness.

After completion of the formation of the nth layer by the operation of block 968, the process proceeds to decision block 970 where PSLP and SSLP are both set to zero, after which the process proceeds to decision block 972. This decision block inquires as to whether the nth layer (i.e. the current layer) is the last layer of the structure (i.e. the Nth layer), if so the process moves to block 978 and ends, but if not, the process proceeds to block 974.

Block 974 increments the value of "n", after which the process loops back to block 904 which again inquires as to whether or not surface of the substrate (i.e. the substrate surface as modified by the formation of the immediately preceding layer) is sufficiently conductive. The process then continues to loop through blocks 904–974 until the formation of the Nth layer is completed.

As with the processes of FIGS. 16 and 19, various alternatives to the process of FIGS. 23(*a*) and 23(*b*) exist. These variations may involve changing the order of the material depositions as a whole or changing the order of the operations for performing each type of material deposition based on what other operations have occurred or will occur during the formation of a given layer. Additional materials of the conductive or dielectric type may be added. Ultimate selectivity of any deposition may occur by depositing material in voids, by actual control of the deposition locations, or by etching away material after deposition. Additional operations may be added to the process to remove selected materials or to deposit additional materials.

Figure 24:
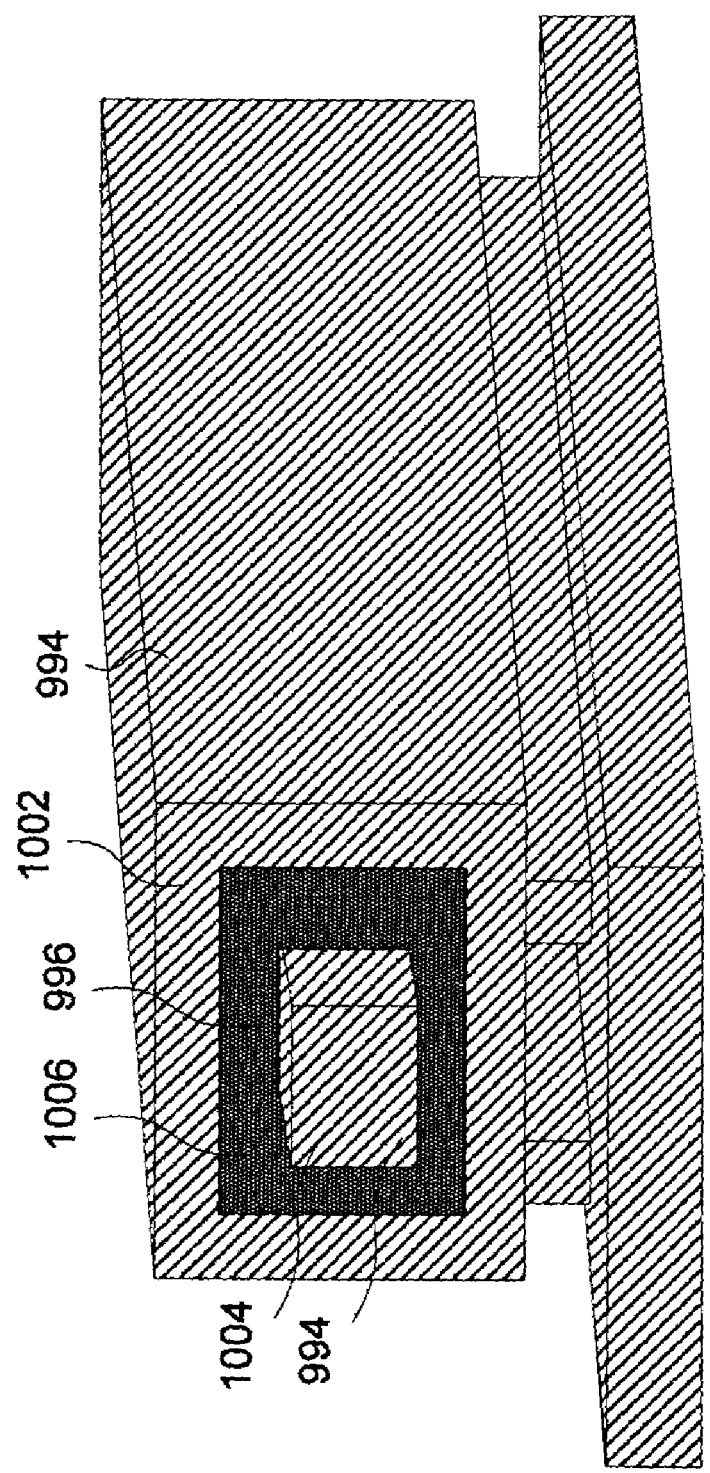
FIG. 24 illustrates a perspective view of a structure that may be formed using an extension of the process of FIGS. 23(a) and 23(b).

FIG. 24 depicts a perspective view of a coaxial structure that includes outer and inner conductive elements 1002 and 1004, respectively, made from material 994 and a dielectric support structure 1006 made from a material 996. The structure of FIG. 24 may be formed according to the process of FIGS. 23(*a*) and 23(*b*) with the addition of a post layer formation operation that removes one of the conductive materials. During layer-by-layer build up of the structure, the inner and outer conductors are formed from one of the two conductive materials discussed in relation to the process of FIGS. 23(*a*) and 23(*b*) (i.e. a primary material). A secondary conductive material is used as a sacrificial material. A dielectric material (i.e. a tertiary material) is also used as part of the structure. After formation of all layers of the structure, the secondary conductive material is removed to yield the final structure comprised of the primary conductive material 994 and the dielectric material 996.

FIGS. 25(*a*)–25(*z*) illustrate side views of the results of various operations of FIGS. 23(*a*) and (*b*) that are used in forming layers of the sample coaxial component illustrated in FIG. 24. The operations associated with the results illustrated in FIGS. 25(*a*)–25(*x*) and 26(*a*)–26(*f*) are set forth in the TABLE 6.

TABLE 6

| FIGS. "25" FIGS. "26" | Layers "L" | Operation | Comments |
|---|---|---|---|
| 25(a), (c), (e), (i), (p), (v) 26(c) | 1, 2, 3, 4, 6, 7 | 914 | The 1st material 992 is deposited |
| 25(b), (d), (f), (x) | 1, 2, 6, 7 | 936 & 968 | The 2nd material 994 is deposited |

TABLE 6-continued

| FIGS. "25" FIGS. "26" | Layers "L" | Operation | Comments |
|---|---|---|---|
| 26(f) | | | and planarized to complete formation of the layer |
| 25(f), (k), (r) — | 3, 4, 6 | 928 & 944 | The 2$^{nd}$ material 994 is deposited and planarized to form an incomplete layer |
| 25(g), (l), (s) — | 3, 4, 6 | 946 | The deposited material is etched to form voids 990 |
| 25(h), (n), (u) — | 3, 4, 6 | 966 & 968 | The 3$^{rd}$ material 996 is deposited and planarized to complete formation of the layer |
| 25(j), (q), (w) 26(e) | 4, 6, 7 | 936 | A secondary seed layer 1000 is applied |
| — 26(b) | | | A primary seed layer 998 is applied |
| 25(m), (t) — | 4, 6 | | Exposed portions of the secondary seed layer are removed |
| — 26(d) | | | Exposed portions of the primary seed layer are removed |
| (o) | 5 | | All operations performed for layer 4 |

Figure 25A:
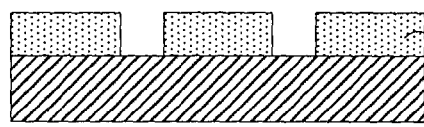
FIGS. 25(a)–25(z) illustrate side views of a sample layer formation process according to FIGS. 23(a) and (b) to form a coaxial structure with a dielectric material that supports only the inner conductor.
Figure 25B:
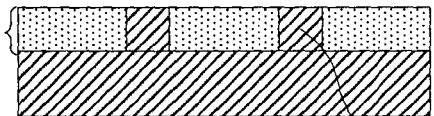
Figure 25C:
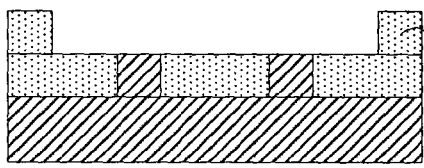
Figure 25D:
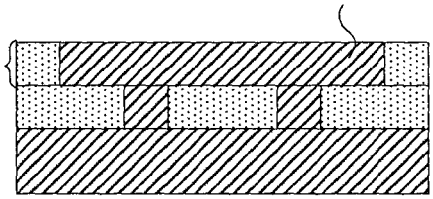
Figure 25E:
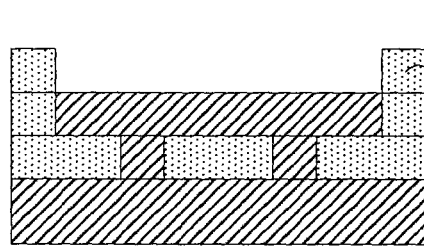
Figure 25F:
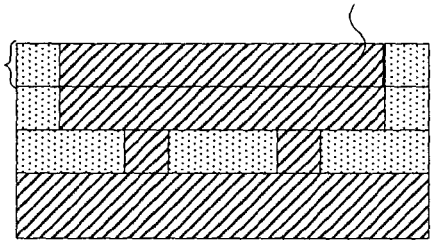
Figure 25G:
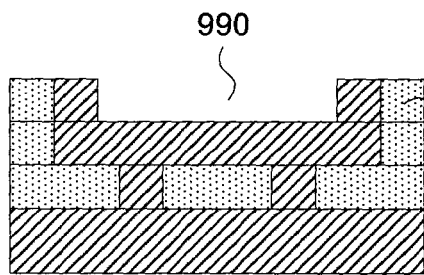
Figure 25H:
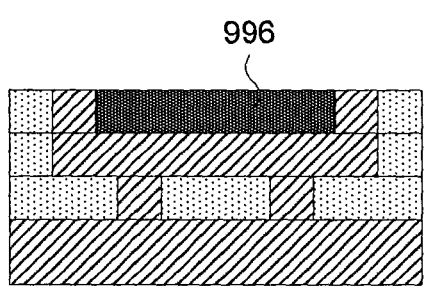
Figure 25I:
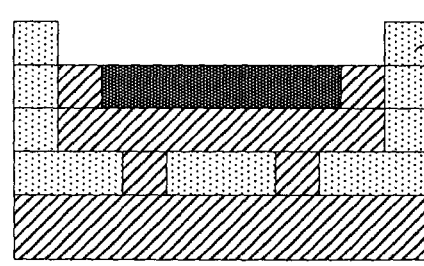
Figure 25J:
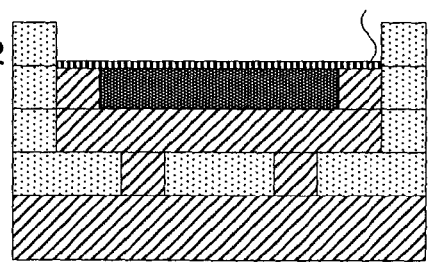
Figure 25K:
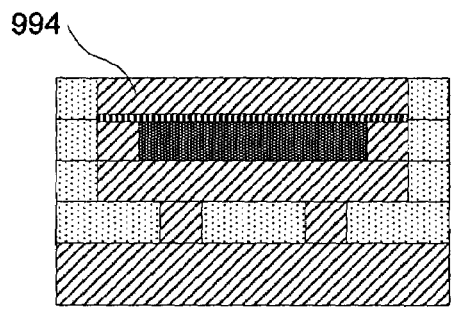
Figure 25L:
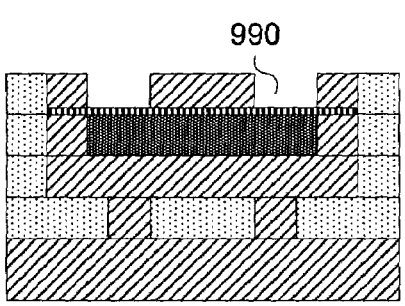
Figure 25M:
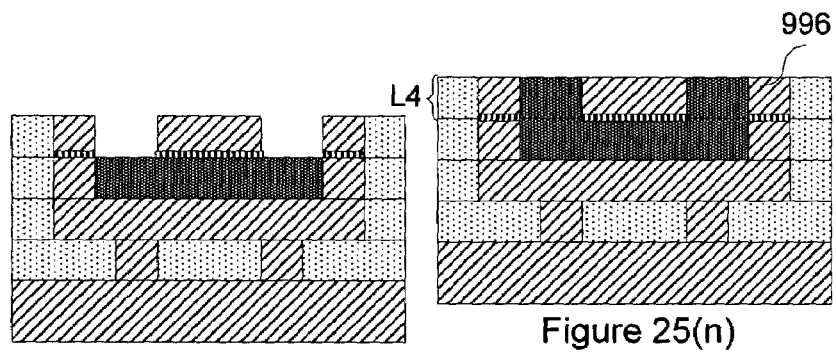
Figure 25N:
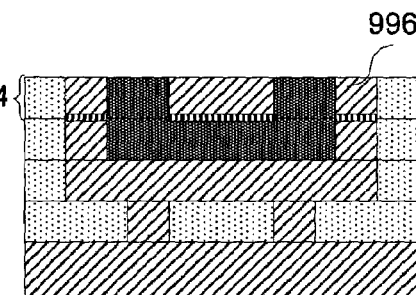
Figure 25O:
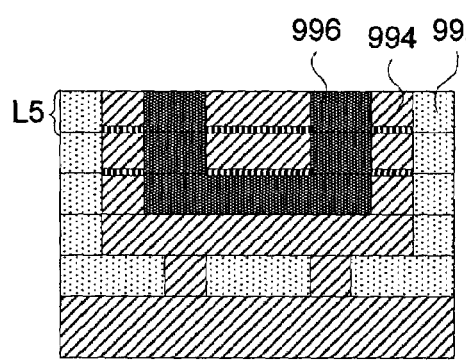
Figure 25P:
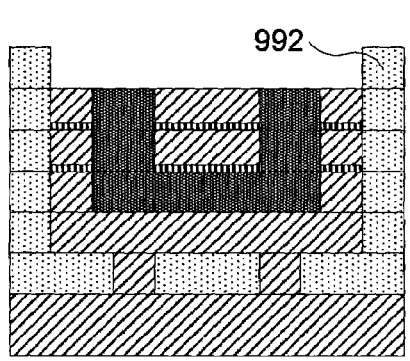
Figure 25Q:
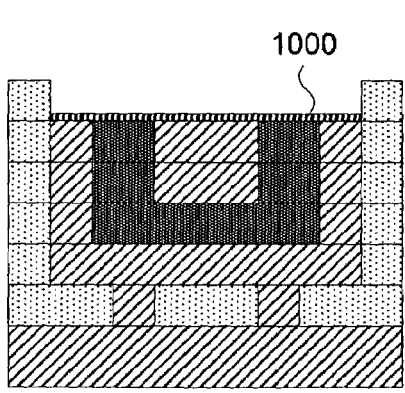
Figure 25R:
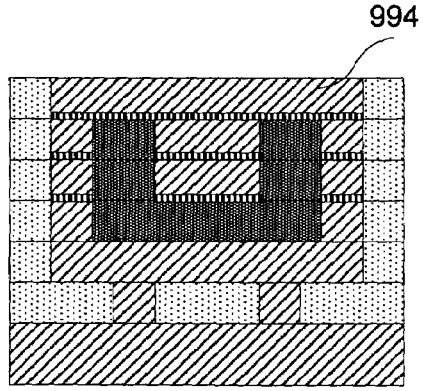
Figure 25S:
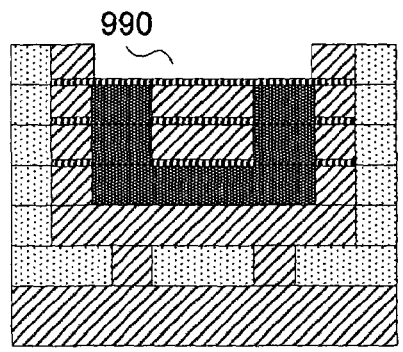
Figure 25T:
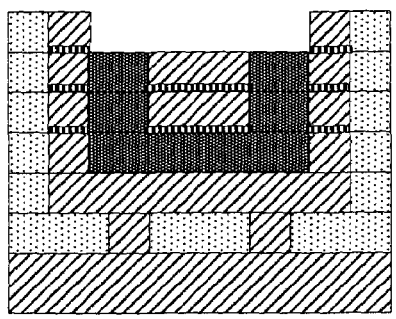
Figure 25U:
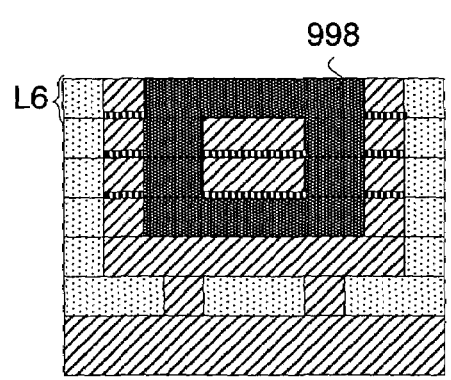
Figure 25V:
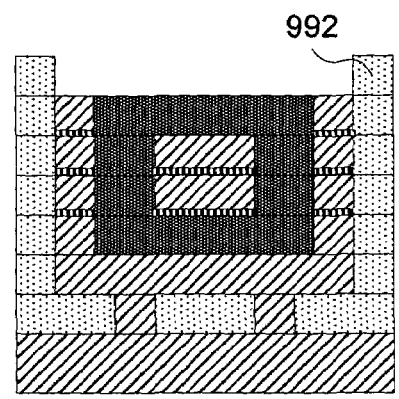
Figure 25W:
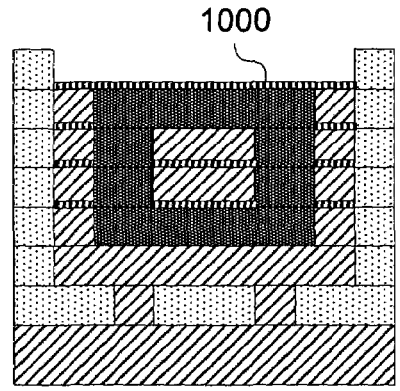
Figure 25X:
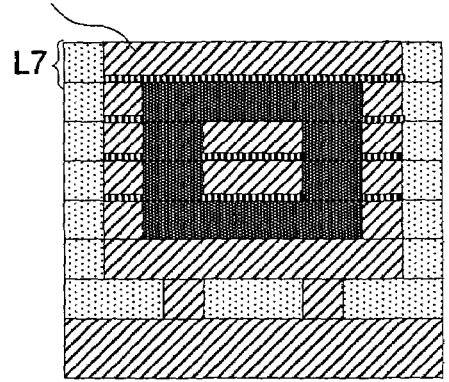
Figure 25Y:
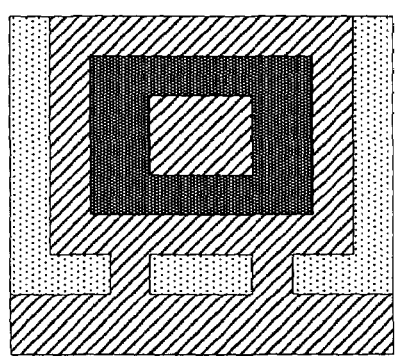
Figure 25Z:
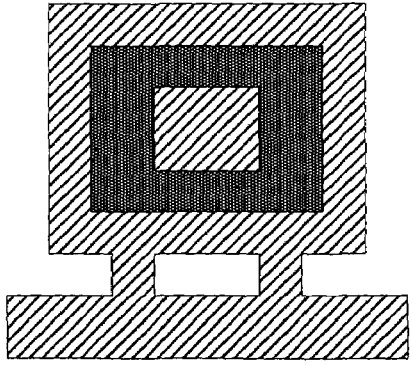
Figure 26A:
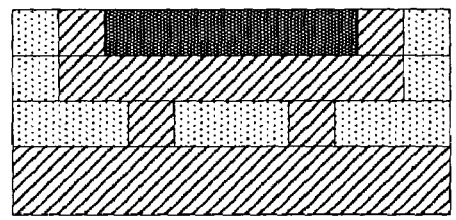
FIGS. 26(a)–26(f) illustrate an alternative to the process of FIGS. 25(h)–25(k) when a seed layer is needed prior to depositing the first conductive material for the fourth layer of the structure.
Figure 26B:
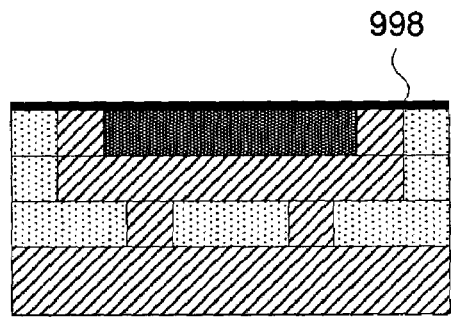
Figure 26C:
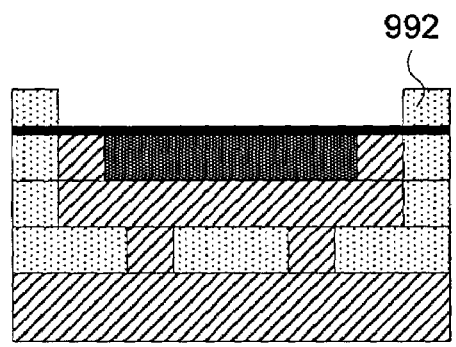
Figure 26D:
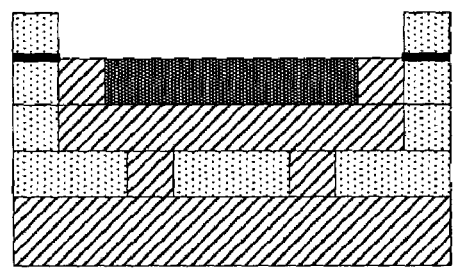
Figure 26E:
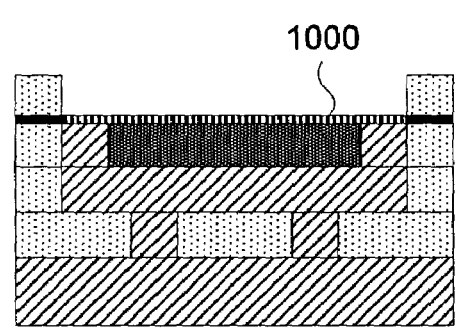
Figure 26F:
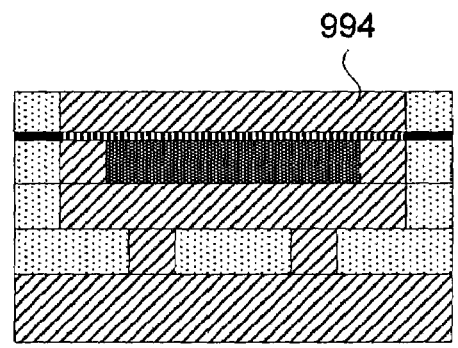

FIG. 25(y) illustrates an overview of the completed structure with the presence of the layer delimiters removed and the under the assumption that the second seed layer material was identical to the second material. FIG. 25(z) illustrates the result of a post process 1$^{st}$ material removal operation (e.g. selective etching) that yields the structure illustrated in FIG. 24.

FIGS. 26(a)–26(f) illustrate an alternative to the process of FIGS. 25(h)–25(k) when use of the primary seed layer is needed prior to depositing the first conductive material for the fourth layer of the structure.

Figure 27:
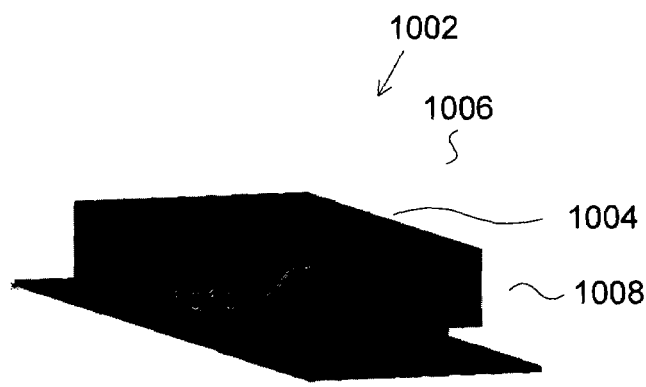
FIG. 27 depicts a perspective view of a coaxial transmission line.

FIG. 27 depicts a perspective view of a coaxial transmission line. The coaxial transmission line 1002 includes an outer conductive shield 1006 surrounding an inner conductor 1004. In the illustrated embodiment, the transmission line 1002 may be set away from a substrate 1008 by a spacer 1010. In the illustrated embodiment the substrate may be a dielectric with an appropriate ground potential being applied to the shield 1006 via conductive spacer 1010 (e.g. via the underside of the substrate) while a signal may be applied to the central conductor (e.g. via an appropriate connection from the underside of the substrate). In alternative embodiments, the shielding may curve around the bend in the central conductor such that the shield provides substantially complete shielding of the central conductor at substantially all of its locations above the substrate (except for maybe one or more openings in the shield that allows removal of a sacrificial material that may have been used during device formation. In other alternative embodiments, the substrate may be conductive with a dielectric material providing isolation were the central conductor and the interior portion of the coaxial element penetrates the substrate. In still other embodiments, the shielding may take the forms of a conductive mesh or even one or more conductive lines that extend out of the plane of the substrate. In still other embodiments, the transmission line may be curved in a single plane (e.g. a plane parallel to that of the substrate) or it may take on any desired three-dimensional pattern. For example, the transmission line may take a spiraling pattern much like that of a spiral loop of a conductive wire. Similarly, a filter element like those shown in FIGS. 12(c) and 13(a) have be converted from the relatively planar configurations shown to a more three dimensional shape where, for example, the main line of the filter (616, 606) takes form of spiral while branches 622, 614, and the like, either take a path down the center of the spiral or take spiral path themselves (e.g. a smaller diameter path than that taken by the main line). Such a configuration can reduce the planar size of the structure at the cost of increasing its height while still maintaining a desired effective length.

Figure 28:
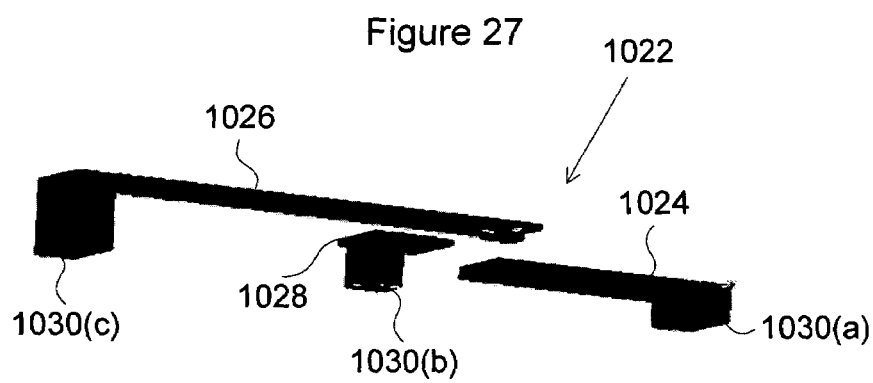
FIG. 28 depicts a perspective view of an RF contact switch.

FIG. 28 depicts a perspective view of an RF contact switch. The RF switch is a cantilever switch. The switch 1022 includes a cantilever beam 1026 which contacts a second beam 1024. The cantilever beam deflects downwards due to electrostatic forces when a voltage is applied between the underlying control electrode 1028. In the illustrated embodiment, all of the switch elements are suspended above the substrate with by pedestals 1030a–1030(c), which, it is believed, will result in a reduction of parasitic capacitance to the substrate. This approach makes it possible to decrease the distance between the drive electrode and the cantilever beam, which increases actuation force while decreasing the required drive voltage, and at the same time allows increased distance from the substrate, thereby reducing parasitics. This independence of the electrode size and contact gaps is not possible if both must lie on a planar substrate. The flexibility of the multilevel embodiments of electrochemical fabrication makes it possible to place the switch components in more optimal locations. In one embodiment, the long cantilever beam may have a length of about 600 μm and a thickness of 8 μm. A circular contact pad may be located underneath the beam such that the contacts are separated by, for example about 32 μm for high isolation. The lower beam may be suspended, for example, at about 32 μm, above the substrate while the upper beam may be about 88 μm above the substrate. Of course in other embodiments other dimensional relationships may exist. In one example of the use of such a switch, a voltage may be applied between control electrode 1028 and cantilever 1026 to close the switch while an AC signal (e.g. an RF or microwave signal) exists on either the cantilever or the other beam and is capable of propagating once the switch is closed. In some alternative designs, one or both of lines 1026 and 1024 may include protrusions at their contact locations or alternatively the contract locations may be made of an appropriate material to enhance contact longevity. In still other alternative designs, the entire switch may be located within a shielding conductor which might reduce any radiative losses associated with signal propagation along the lengths of lines 1024 and 1026. In still further embodiments, the switch may be used as a capacitive switch by locating a thin layer of dielectric (e.g. nitride) at the contact location of one or both of lines 1024 and 1026 thereby allowing the switch to move the contacts between low and high capacitance values. Signal passage may occur for such a switch when impedance matching occurs (e.g. when capacitance is low higher frequency signals may pass while lower frequency signals may be blocked or significantly attenuated. In still further embodiments control electrode or the nearest portion of line 1026, thereto, may be coated with a dielectric to reduce the possibility of a short occurring between the control electrode and the deflectable line. In still other embodiments, a pull up electrode may be included to supplement separation of the contacts beyond what is possible with the spring force of the deflectable line 1026 alone. In some embodiments the ratio of switch capacitance (assuming it to be a capacitive switch) when open to closed, is preferably greater than about 50 and more preferably greater than about 100. In still other embodiments, a secondary conductor may be attached to and separated from the pedestal 1030(*c*) and the underside of line 1026 by a dielectric. This secondary conductor may be part of the switch control circuitry as opposed to having the control circuitry share conductor 1026 with the signal.

Figure 29:
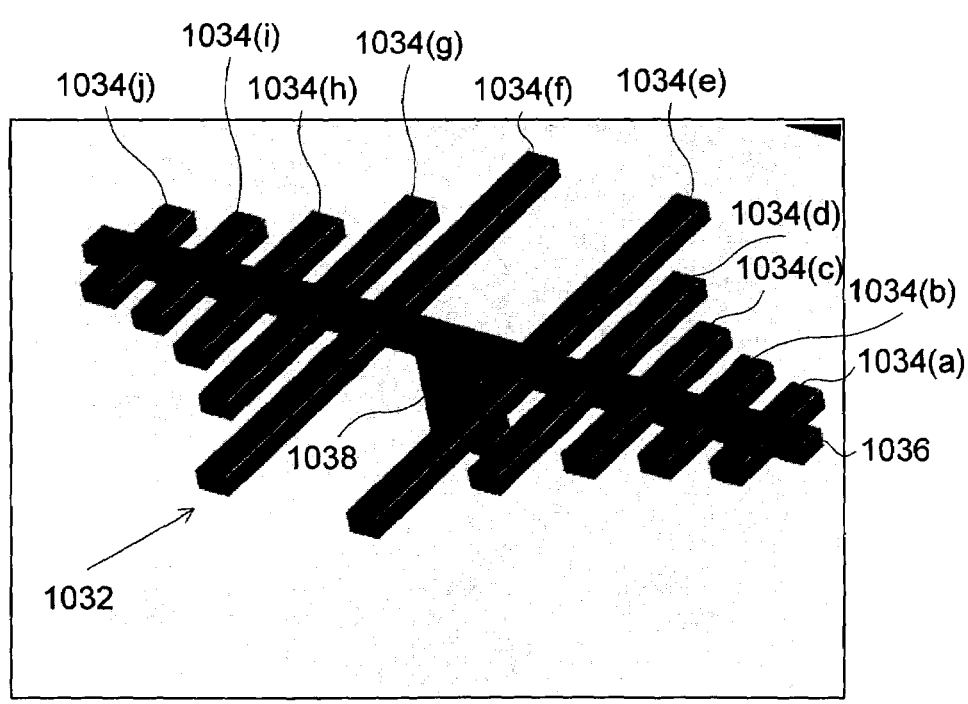
FIG. 29 depicts a perspective view of a log-periodic antenna.

FIG. 29 depicts a perspective view of a log-periodic antenna. The antenna 1032 includes a number of different dipole lengths 1034(*a*)–1034(*j*) along a common feedline 1036 that is supported from a substrate (not shown) by spacer 1038). It is believed that this elevated position may reduce parasitic capacitive losses that may otherwise be associated with the antenna contacting or being in proximity to a lossy substrate. In other embodiments, other antenna configurations may be used, such as for example, linear slot arrays, linear dipole arrays, helix antennas, spiral antennas, and/or horn antennas.

Figure 30A:
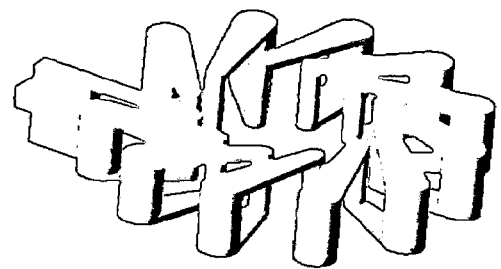
FIGS. 30(a) and 30(b) depict perspective views of a sample toroidal inductor rotated by about 180 degrees with respect to one another.
Figure 30B:
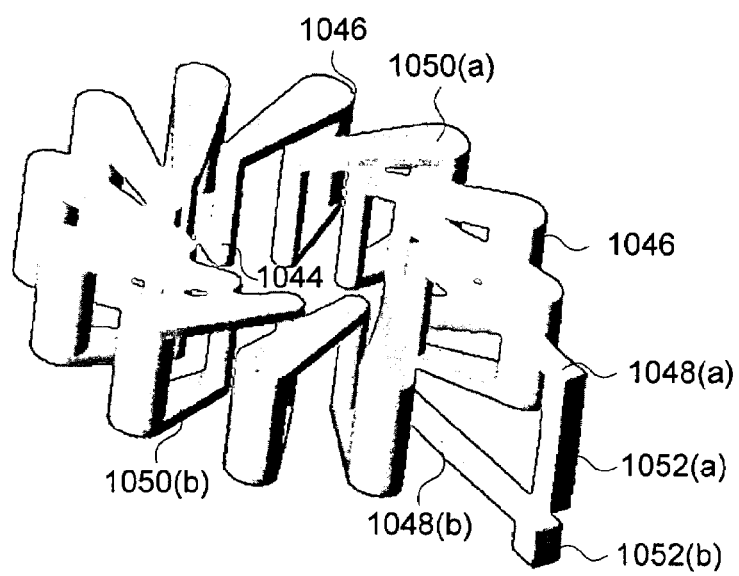
Figure 30C:
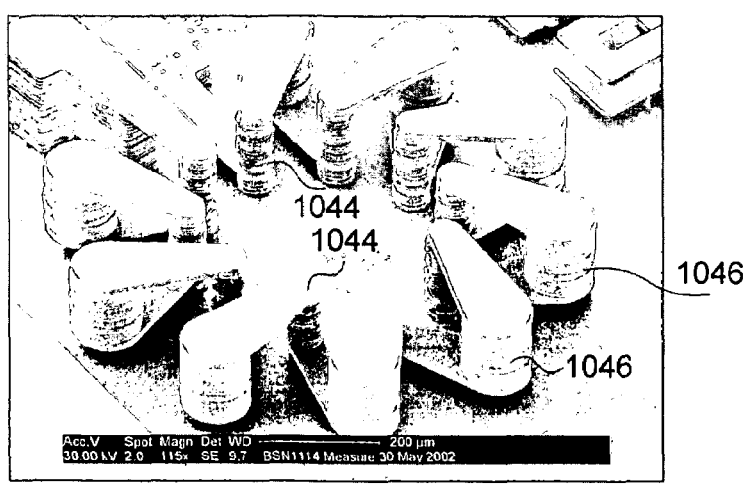
FIG. 30(c) depicts a perspective view of toroidal inductor formed according to an electrochemical fabrication process FIGS. 31 (a) and 31(b) depict perspective views of a spiral inductor design and a stacked spiral inductor formed according to an electrochemical fabrication process.

FIGS. 30(*a*)–30(*b*) depict perspective views of a sample toroidal inductor design rotated by about 180 degrees with respect to one another. FIG. 30(*c*) depicts a perspective view of the toroidal inductor of FIGS. 30(*a*) and 30(*b*) as formed according to an electrochemical fabrication process. The toroidal inductor of FIG. 20(*c*) was formed according to the process of FIGS. 2(*a*)–2(*f*). In some embodiments the inductor may be formed on a dielectric substrate while in other embodiments the inductor may be formed on a conductive substrate with appropriate dielectrically isolated feedthroughs. In one specific embodiment, the toroidal coil may include 12 windings, be about 900 μm across, and have its lower surface suspended about 40 μm above the substrate. The inductor 1042 includes a plurality of inner conductive columns 1044 and a plurality of outer conductive columns 1046 connected by upper bridging elements and lower bridging elements 1050(*a*) and 1050(*b*). The inductor also includes two circuit connecting elements 1048(*a*) and 1048(*b*) that are supported by spacers 1052(*a*) and 1052(*b*). In some embodiments, the entire inductor may be supported by and spaced from a substrate by the spacers 1052(*a*) and 1052(*b*). It is believed that such spacing may reduce parasitic capacitance that might otherwise result from contact between or proximity of the lower conductive bridges 1050(*b*) and a substrate (not shown). Though in some embodiments, the inner and outer conductive columns may have similar dimensions, in the illustrated embodiment, the area of each of the inner conductive columns is smaller than the area of the outer conductive columns (e.g. the diameter is smaller). Similarly, in the present embodiment the width of the conductive bridges 1050(*a*) and 1050(*b*) also increase radially outward from the center of the inductor. It is believed that such a configuration will result in reduced ohmic resistance has a desired current travels around the inductive path. It is also believed that such a configuration may lead to reduced leakage of magnetic flux from the inductor and thus contribute to an enhancement in inductance or a reduction in noise that the component may radiate to other circuit elements. In still further embodiments, it may be advantageous to shield the outer circumference of the inductor by a conductive wall. Similarly the inner circumference may also be shielded by a conductive wall, and in still further embodiments the upper surface and potentially even the lower surface may also be shielded by conductive plates or meshes. In some alternative embodiments the spacers 1052(*a*) and 1052(*b*) and even the circuit connecting elements 1048(*a*) and 1048(*b*) may be shielded, at least in part, by conductive elements which may help minimize radiative losses. In further embodiments loops of the inductor may take on a more circular shape as opposed to the substantially rectangular shape illustrated.

Figure 31A:
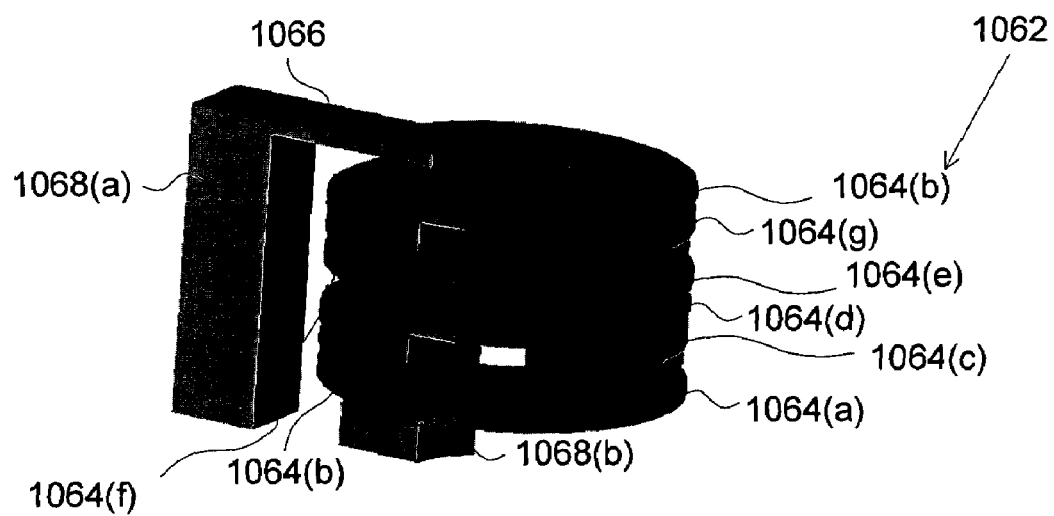
FIG. 31(c) depicts a variation of the inductors of FIGS. 31(a) and 31(b).
Figure 31B:
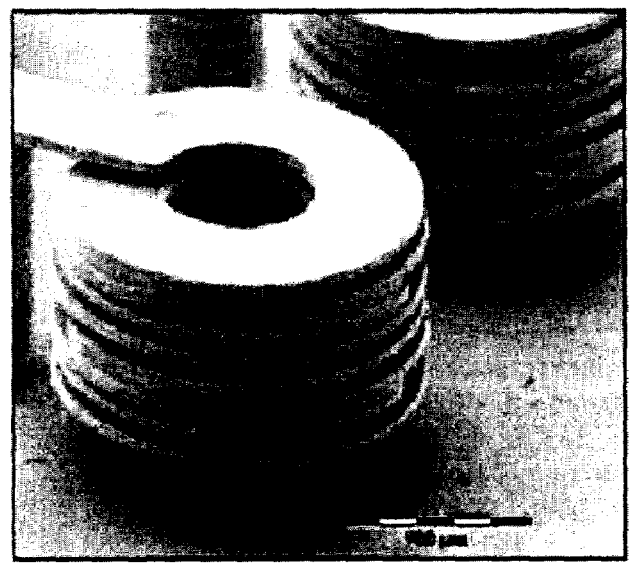
Figure 31C:
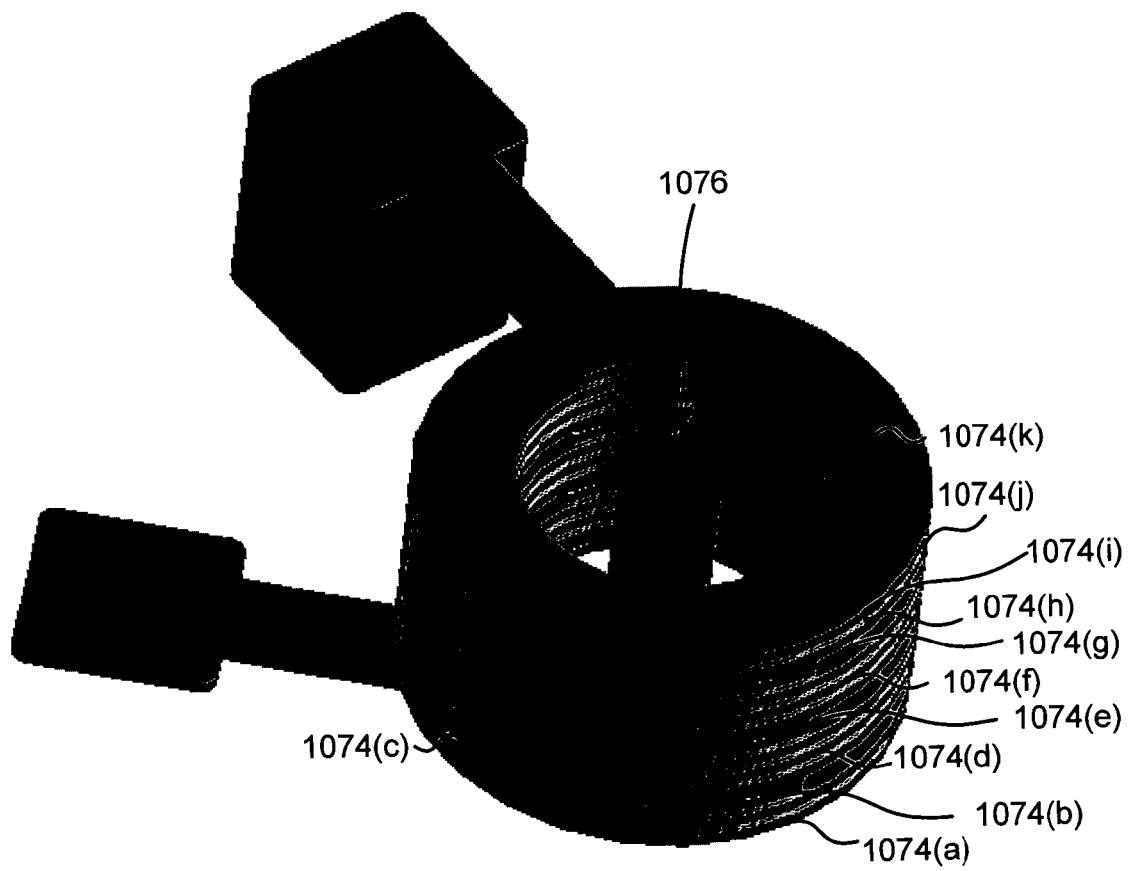

FIGS. 31(*a*)–31(*b*) depict perspective views of a spiral inductor design and a stacked spiral inductor formed according to an electrochemical fabrication process, respectively. The illustrated inductor 1062 includes eight coils 1064(*a*)–1064(*g*), one connecting bridge 1066, and two spacers 1068(*a*) and 1068(*b*). In one detailed embodiment, the coils may be about 8 μm thick each, they may have an outer diameter of about 200 μm, they may be separated by about 8 μm, and the bottom coil may be elevated about 56 μm above the substrate. As with the illustrated embodiments of FIGS. 27–30(*c*), the spacers are used not only for establishing an electrical connection between the inductor and the rest of the circuit but also to space the inductor coils from a substrate (not shown).

FIG. 31(*c*) depicts a variation of the inductors of FIGS. 31(*a*) and 31(*b*). The inductor 1072 of FIG. 31(*c*) may be formed with the indicated design features using 23 layers. As depicted, the inductor includes 11 coil levels 1074(*a*)–1074(*k*) and 9 and ⅛ turns. Each coil level is formed from an 8 micron thick layer and is separated from other coil levels by gaps of 4 micron thickness. The inner diameter is 180 microns and outer is 300 micron. As illustrated the inductor includes a core which is 60 micron in diameter with a 60 micron space between the core 1076 and windings 1074(*a*)–1074(*k*). A simple calculation based on a uniform magnetic field yields an inductance of 20 nH for the inductor when the core is disregarded. However since the real inductor has a diameter larger than its length, and the windings are not particularly tight, the inductance will be lower than this theoretical value. The real value is estimated to be in the range of 25%–50% of the theoretical value, (i.e. about 5–10 nH). On the other hand, the inductance may be greatly enhanced by the presence of the core 1076 (e.g. by a factor of 100 or more). Of course, in other embodiments, other configurations are possible.

Figure 32A:
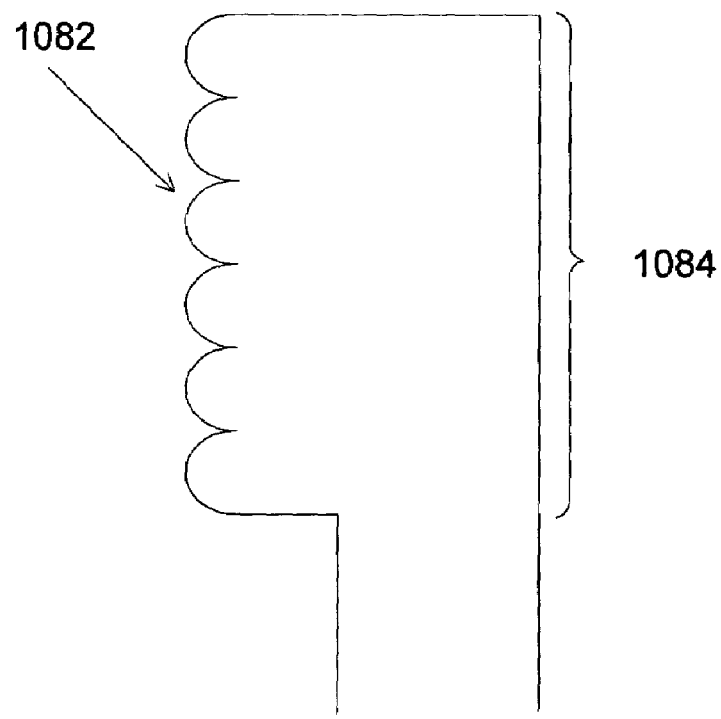
FIGS. 32(a) and 32(b) contrast two possible designs where the design of FIG. 32(b) may offer less ohmic resistance than that of FIG. 32(a) along with a possible change in total inductance.
Figure 32B:
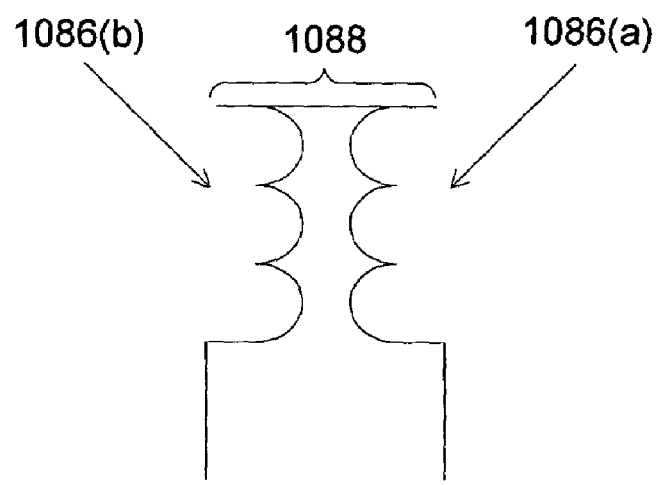

In other embodiments, the inductors of FIGS. 31(*a*)–31(*c*) may take on different forms. FIGS. 32(*a*) and 32(*b*) contrast two possible designs where the design of FIG. 32(*b*) may offer less ohmic resistance than that of FIG. 32(*a*) along with a possible change in total inductance. A single inductor 1082 having N coils and a relative long connector line 1084 is illustrated in FIG. 32(*a*) while FIG. 32(*b*) depicts two half sized inductors 1086(*a*) and 1086(*b*) where the number of coils in each is considered to be about one-half of those in the inductor of FIG. 32(*a*) connected in series via short bridging element 1088. As illustrated since bridging element 1088 is shorter than connector line 1084, it is believed that the inductor pair of FIG. 32(*b*) will have less loss than that of FIG. 32(*a*). On the other hand as the coupling between the two inductors is probably reduced, there is probably an associated loss of net inductance. By inclusion of a core that extends in the form of a loop through both inductors it may be possible to bring the inductance back up to or even beyond that of the taller inductor of FIG. 32(*a*).

Figure 33A:
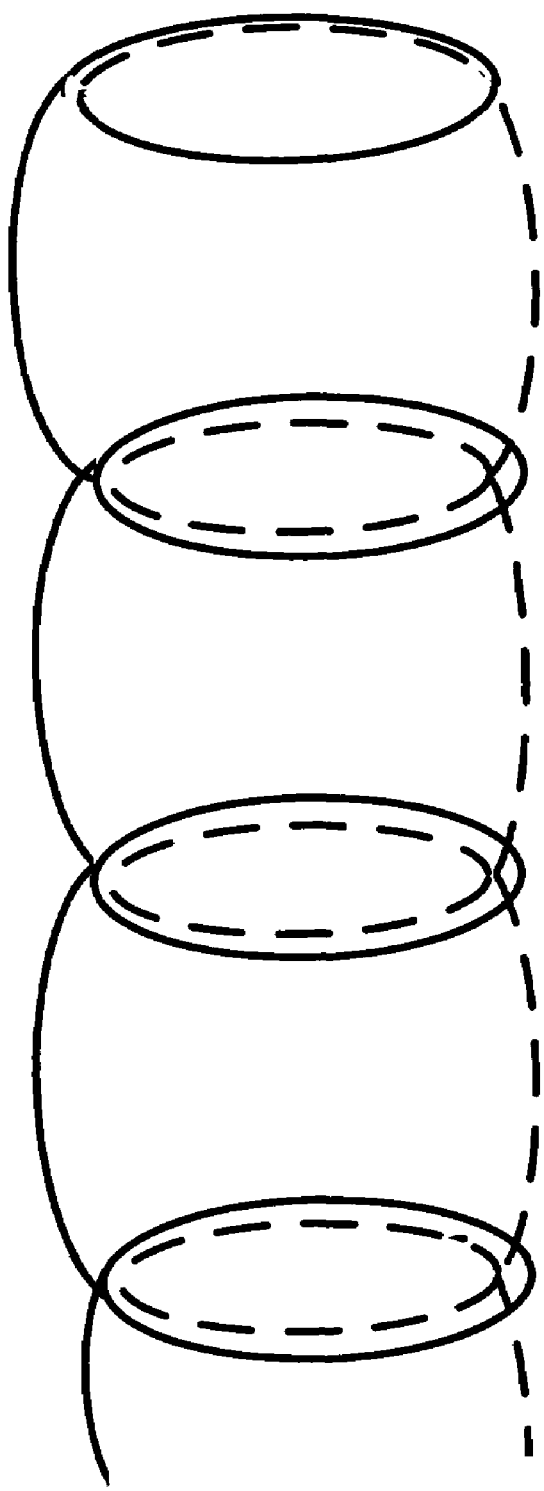
FIGS. 33(a) and 33(b) depict a schematic representation of two alternative inductor configurations that minimize ohmic losses while maintaining a high level of coupling between the coils of the inductor.
Figure 33B:
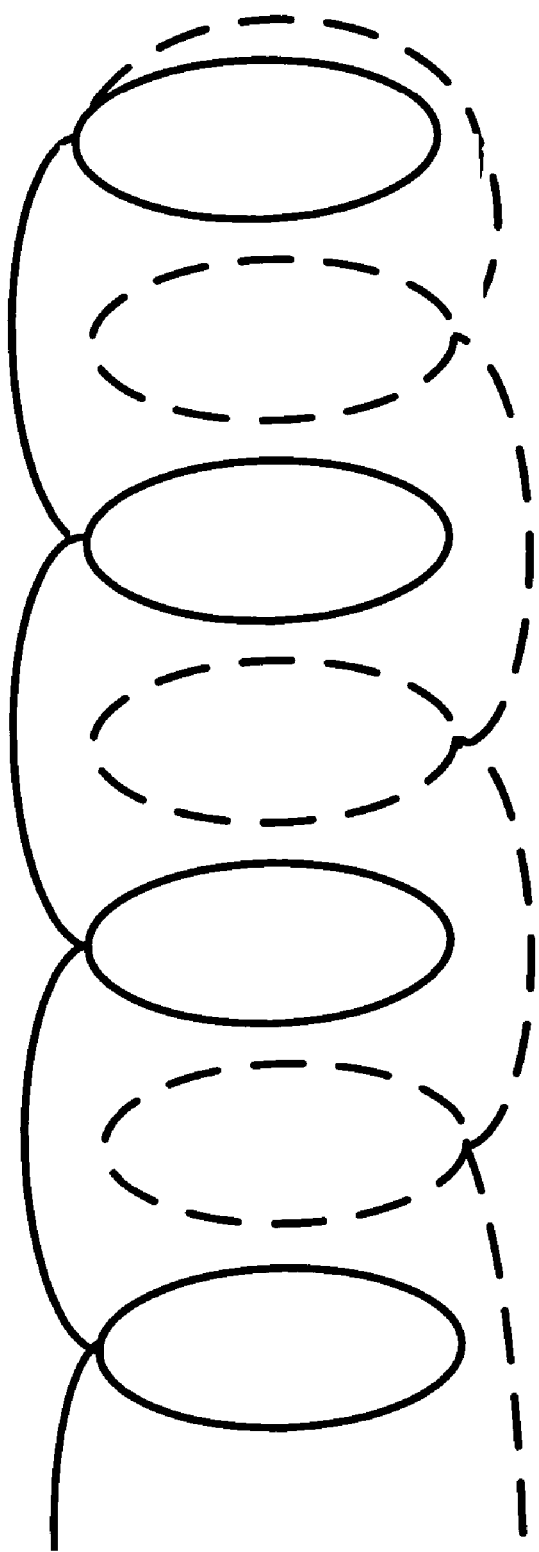

FIGS. 33(*a*) and 33(*b*) depict a schematic representation of two alternative inductor configurations that minimize ohmic losses while maintaining a high level of coupling between the coils of the inductor. In the figures the upward path of the coils is depicted with a solid line while the downward path of the coils is depicted with a dashed line. In FIG. 33(*a*) the upward extending coils have a larger perimeter than the downward extending coils. In FIG. 33(*b*) they are of substantially similar perimeter dimensions.

Figure 34:
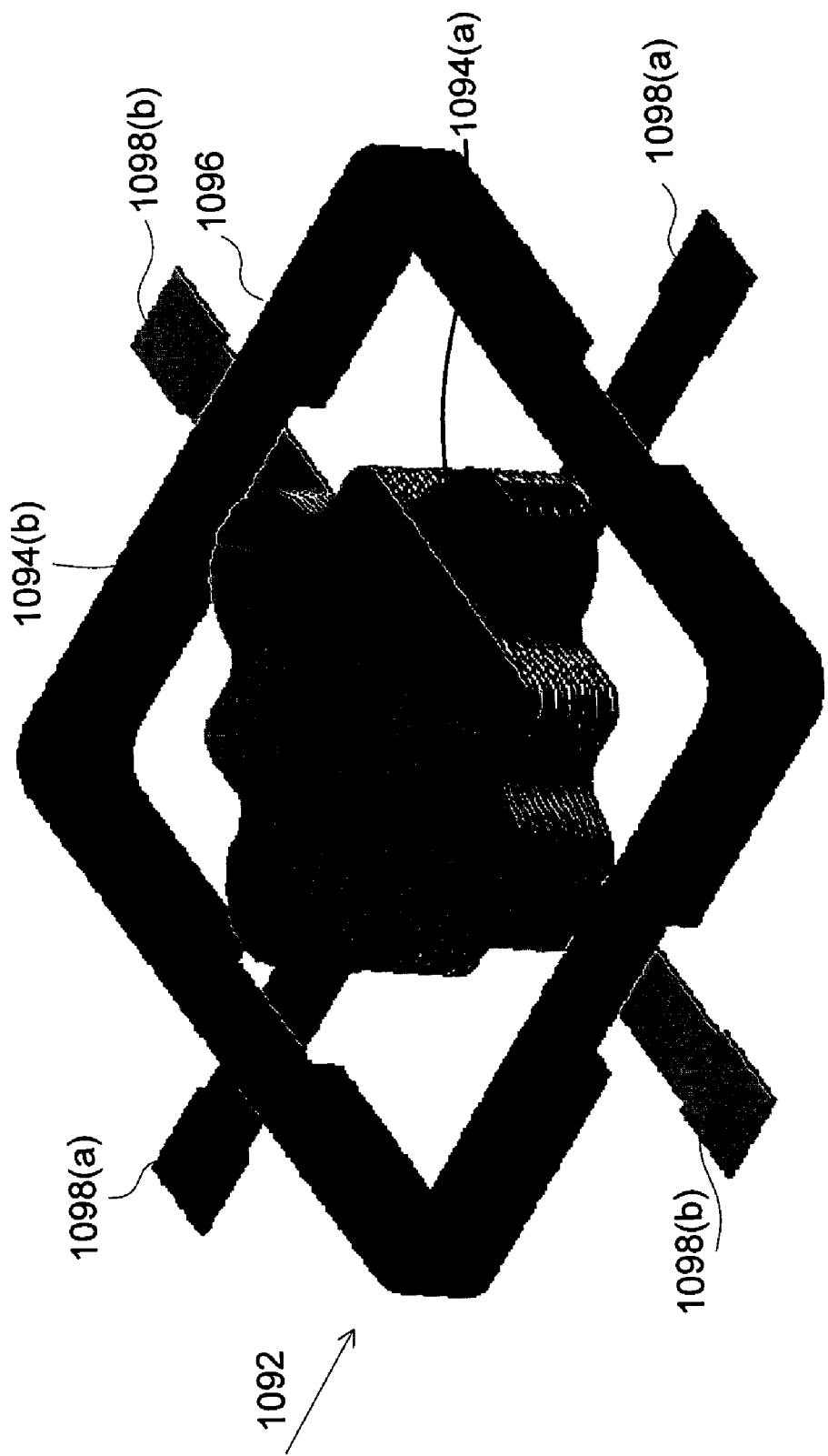
FIG. 34 depicts a perspective view of a capacitor.

FIG. 34 depicts a perspective view of a capacitor 1092 including 12 interdigitated plates (two sets 1094(*a*) and 1094(*b*) of six plates each). In a detailed embodiment each plate may have an eight micron thickness, a 4 micron gap between each plate, and each plate may be 436 μm on a side. Based on these details, the capacitance is calculated at about 5 pF based on an ideal parallel plate calculation. It is anticipated that the value will be somewhat different due to fringe field effects. As illustrated, the capacitor is surrounded by a dam 1096 which may be used to facilitate a post-release dielectric backfill while minimizing dielectric spill over to adjacent devices that may be produced nearby on the same substrate. Backfilling with a dielectric could dramatically increase the capacitance offered by such capacitors. Similarly decreasing the separation between plates and or adding additional plates may also significantly increase the capacitance. The capacitor is shown with two pairs of orthogonally located bond pads 1098(*a*) and 1098(*b*), respectively. As the parallel bond pads are conductively connected, electrical connection to the device may occurred via connection to one of the 1098(*a*) pads and one of the 1098(*b*) pads. As illustrated the bond pads are in line with the lowest plates of the capacitor and the upper plates are connected to the lowest plates by columns located in the extended regions from each group. In other embodiments, the pads could connect more directly to, for example, the mid-level plates of each stack. The current flow could from there proceed both upward and downward to the other plates of each stack respectively.

Figure 35B:
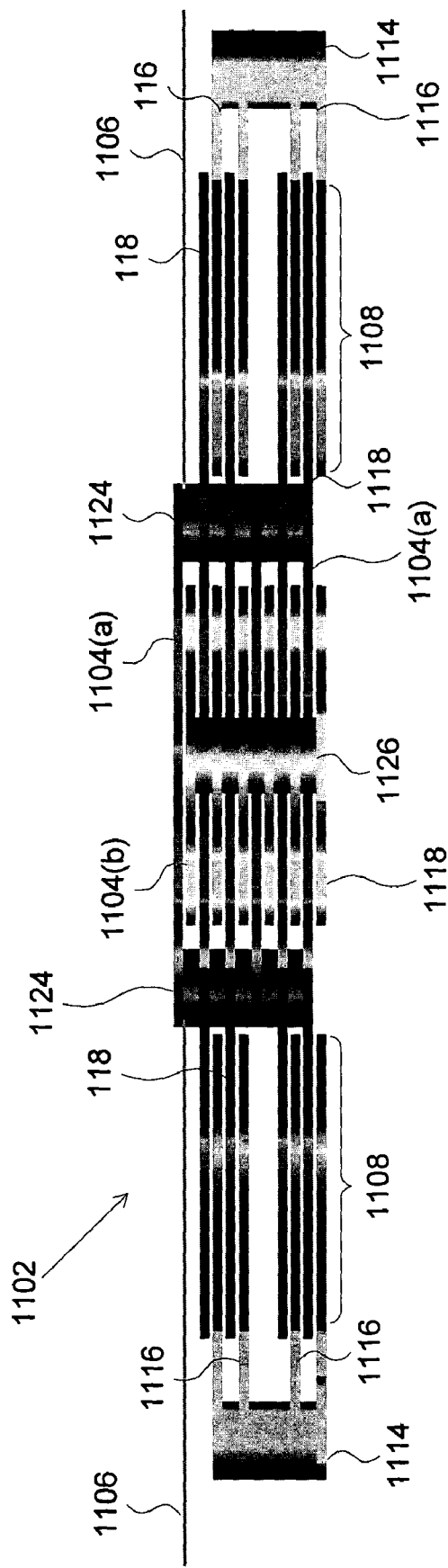

FIGS. 35(*a*) and 35(*b*) depict a perspective view and a side view, respectively, of an example of a variable capacitor 1102. The capacitor plates have a similar configuration to that of FIG. 34 and are again divided into two sets of six plates 1104(*a*) and 1104(*b*). In this embodiment one set of capacitor plates 1104(*a*) is attached to spring elements 1106 and to two sets of parallel plate electrostatic actuators 1108 that can drive plates 1104(*a*) vertically relative to fixed plates 1104(*b*). In use a DC potential may be applied between spring supports 1110 and actuator pads 1112. Actuator pads 1112 connect to columns 1114 which in turn hold fixed drive plates 1116. When such a drive voltage is applied moveable drive plates 1118 are pulled closer to fixed drive plates which in turn pull moveable capacitor plates 1104(*a*) closer to fixed capacitor plates 1104(*b*) via support columns 1124 and thereby change the capacitance of the device. Capacitor plates 1104(*b*) are held in position by support columns 1126. The capacitor may be connected in a circuit via spring support 1110 and one of fixed capacitor plate contact pads 1128.

Figure 36A:
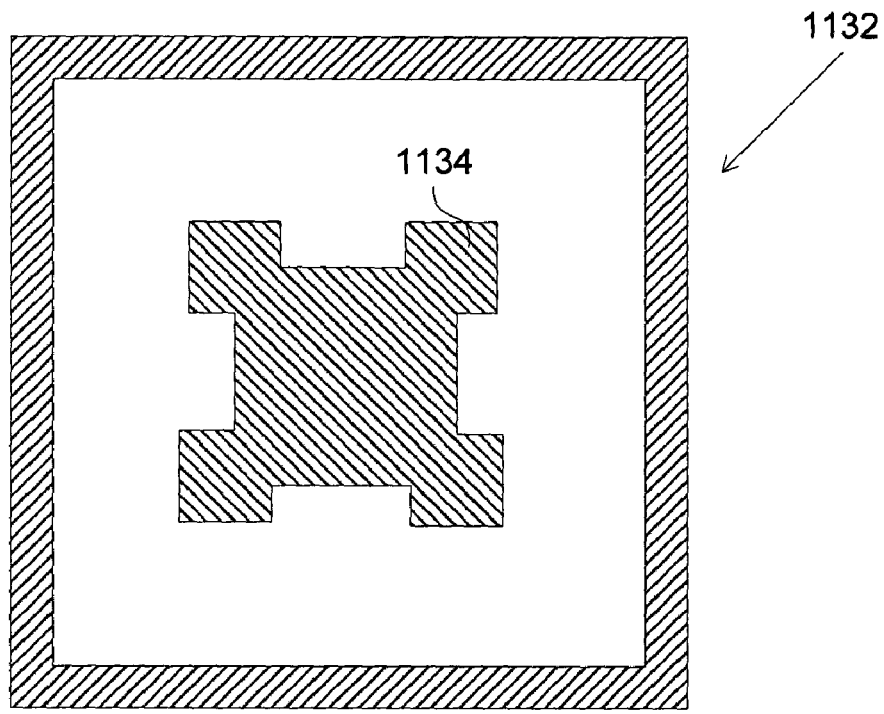
FIGS. 36(a)–36(b) depict end views of two example coaxial structures where the central conductors are provided with a cross-sectional configuration that increases their surface area relative to their cross-sectional area.
Figure 36B:
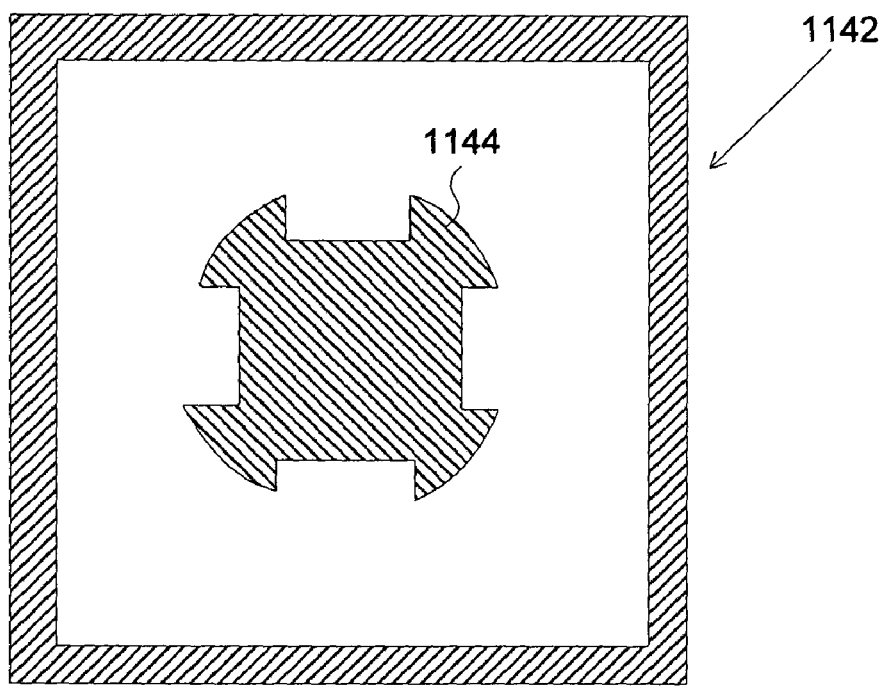

In still further embodiments, resistive losses associated with current carrying conductors such as the spacers of FIGS. 27–31(*c*), with central conductors of coaxial components, and with elements of various other components may be reduced by increasing the surface area of the elements without necessarily increasing their cross-sectional dimensions. It is believed that this can be particularly useful when the frequency of the signal makes the skin depth small compared to the cross-sectional dimensions of the components. For example, a cross-sectional dimension of a current carrying conductor (in a plane perpendicular to the direction of current flow) could be increased by changing it from a circular shape to a square shape or other shape containing a plurality of angles. Two further examples of such coaxial elements are shown in FIGS. 36(*a*) and 36(*b*) wherein coaxial elements 1132 and 1142, respectively include central conductors 1134 and 1144 which have been modified from a square and circular configuration to modified configurations with indentations so as to increase their surface areas.

Figure 37:
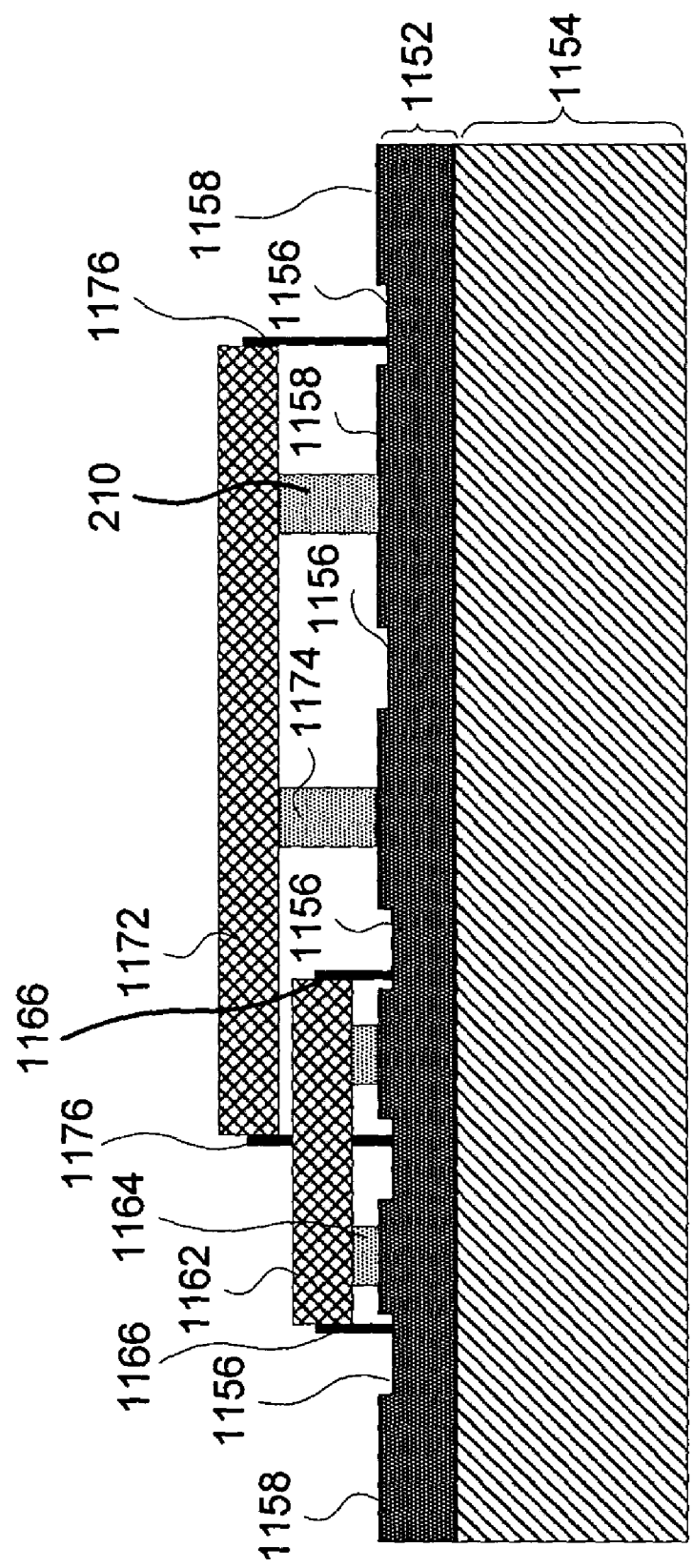
FIG. 37 depicts a side view of an integrated circuit with connection pads that are used for connecting internal signals (e.g. clock signals) to low dispersions transmission lines for communication with other portions of the integrated circuit.

FIG. 37 depicts a side view of another embodiment of the present invention where an integrated circuit 1152 is formed on a substrate 1154 (e.g. silicon) with contact pads 1156 exposed through a protective layer 1158 located on the top of the integrated circuit. The contact pads may be pads for connection to other devices or alternatively may be pads for top side intra-connection for linking separate parts of the integrated circuit. For example, the intra-connects (and inter-connects) may be pads for distributing high frequency clock signals (e.g. 10 GHz) to different locations within the integrated circuit via a low dispersion transmission line such as a coaxial capable or waveguide. Two coaxial transmission lines 1162 and 1172 are illustrated as connecting some of the pads to one another. The outer conductors of the coaxial lines are supported by stands or pedestals 1164 and 1174 and the connections to the pads are made by wires 1166 and 1176. In alternative embodiments the connections to the pads may be made by not only the wires but also by bring at least a portion of the coaxial shielding in contact with or into closer proximity with the surface of the integrated circuit. In some embodiments, the coaxial structures may be supported by the central wires and any grounding connections only while in other embodiments pedestals or the like may be used. In some implementations coaxial structures may be preformed and picked and placed at desired locations on the integrated circuits or alternatively the EFAB process may be performed directly onto the upper surface of the integrated circuit. Some implementations of such microdevice to IC integration are set forth in U.S. Provisional Patent Application No. 60/379,133 which is described briefly hereafter and is incorporated herein in its entirety. Of course in other embodiments some pads may be for connection between components of the IC while some other pads may be for connections to other components. In some embodiments, the coaxial lines may have lengths specially tailored so that differences between clock signals reaching different portions of a chip, or even different chips, may be controlled.

Figure 38A:
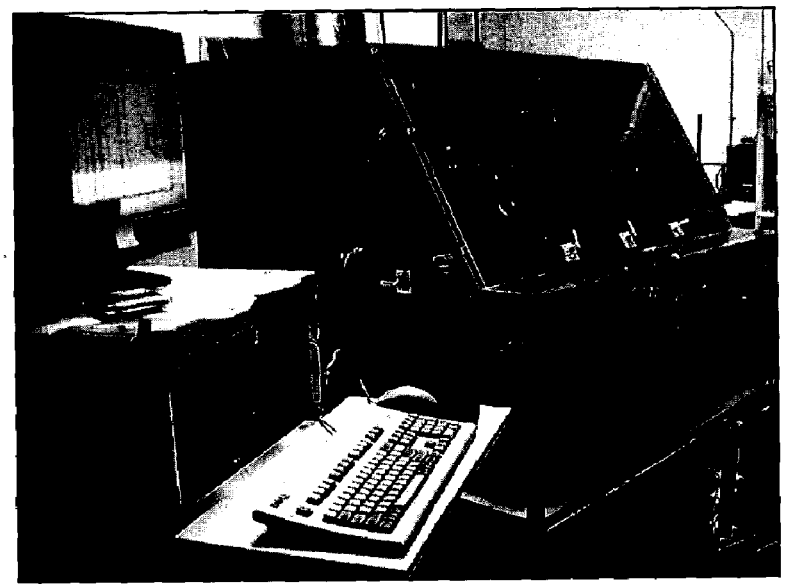
FIGS. 38(a) and 38(b) illustrate first and second generation computer controlled electrochemical fabrication systems (i.e. EFAB™ Microfabrication systems) that may be used in implementing the processes set forth herein.
Figure 38B:
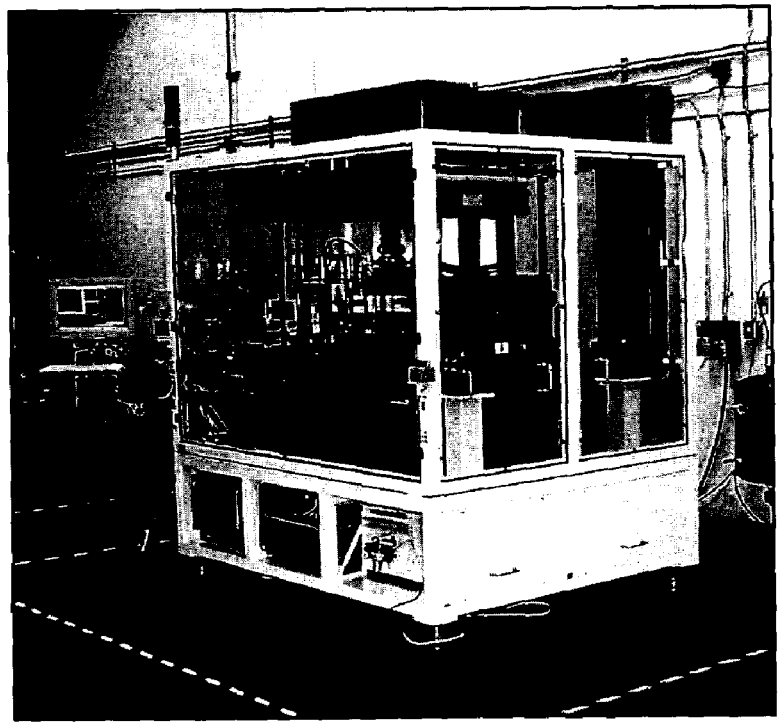

FIGS. 38(*a*) and 38(*b*) illustrate first and second generation computer controlled electrochemical fabrication systems (i.e. EFAB™ Microfabrication systems) produced by MEMGen. These systems may be used in implementing the processes set forth herein and in forming devices/structures set forth herein. As presently configured these systems include selective deposition and blanket deposition stations, a planarization station, various cleaning and surface activation stations, inspection stations, plating bath circulation subsystems, atmosphere control systems (e.g. temperature control and air filtering system), and a transport stage for moving the substrate relative to the various stations (i.e. for providing Z, X, and Y motion). Other systems may include one or more selective etching stations, one or more blanket etching stations, one or more seed layer formation stations (e.g. CVD or PVD deposition stations), selective atmosphere control systems (e.g. for supplying specified gases globally or within certain work areas), and maybe even one or more rotational stages for aligning the substrate and/or selected stations.

In some embodiments, it is possible to build a number of similar components on a single-substrate where the multiple components may be used together on the substrate or they may be diced from one another and applied to separate secondary substrates as separate components for use on different circuit/component boards. In other embodiments the electrochemical processes of various embodiments set forth herein may be used in a generic way to form various distinct components simultaneously on a single substrate where the components may be formed in their final positions and with many if not all of their desired interconnections. In some embodiments single or multiple identical or distinct components may be formed directly onto integrated control circuits or other substrates that include premounted components. In some embodiments, it may be possible to form entire systems from a plurality of monolithically formed and positioned components.

In still further embodiments, the devices or groups of devices may be formed along with structures that may be used for packaging the components. Such packaging structures are set forth in U.S. Patent Application No. 60/379,182 which is described in the table of patent application set forth hereafter. This incorporated application teaches several techniques for forming structures and hermetically sealable packages. Structures may be formed with holes that allow removal of a sacrificial material. After removal of the sacrificial material, the holes may be filled in a variety of ways. For example, adjacent to or in proximity to the holes a meltable material may be located which may be made to flow and seal the holes and then resolidify. In other embodiments the holes may be plugged by locating a plugging material in proximity to but spaced from the openings and after removal of sacrificial material then causing the plugging material to bridge the gaps associated with the holes and seal them either via a solder like material or other adhesive type material. In still other embodiments, it may be possible to perform a deposition to fill the holes, particularly if such a deposition is essentially a straight line deposition process and if underneath the holes a structural element is located that can act as a deposition stop and build up point from which the deposit can build up to plug the holes.

Though the application has focused the bulk of its teachings on coaxial transmission lines and coaxial filters, it should be understood that these structures may be used as fundamental building blocks of other structures. As such, RF and microwave components of various embodiments may include one or more of a microminiature coaxial component, a transmission line, a low pass filter, a high pass filter, a band pass filter, a reflection-based filter, an absorption-based filter, a leaky wall filter, a delay line, an impedance matching structure for connecting other functional components, one of a class of antennas, a directional coupler, a power combiner (e.g., Wilkinson), a power splitter, a hybrid combiner, a magic TEE, a frequency multiplexer, or a frequency demultiplexer. The antennas include pyramidal (i.e., smooth wall) feedhorns, scalar (corrugated wall) feedhorns, patch antennas, and the like, and linear, planar, and conformable arrays of such elements—components that can efficiently transfer microwave power from the microminiature transmission line into free space. EFAB produced microminiature coax will also enable new components with multiple functionalities. The combination of power combining (or splitting) and frequency multiplexing (or demultiplexing) could readily be combined in a single microminiature-coax structure having multiple input and output ports.

An example of the application of coaxial transmission lines in accordance with an embodiment of the invention is exemplified by application to a four-port transmission-line hybrid coupler.

Hybrids are one of the oldest and most useful of all passive microwave components. As the name implies, they combine two functions into one component. The two functions are power splitting and phase shifting. When constructed from waveguide, coax, or other broadband transmission line, hybrids generally operate on the principles of current division at a junction and constructive and destructive interference of the dominant spatial mode in the line.

Figure 39:
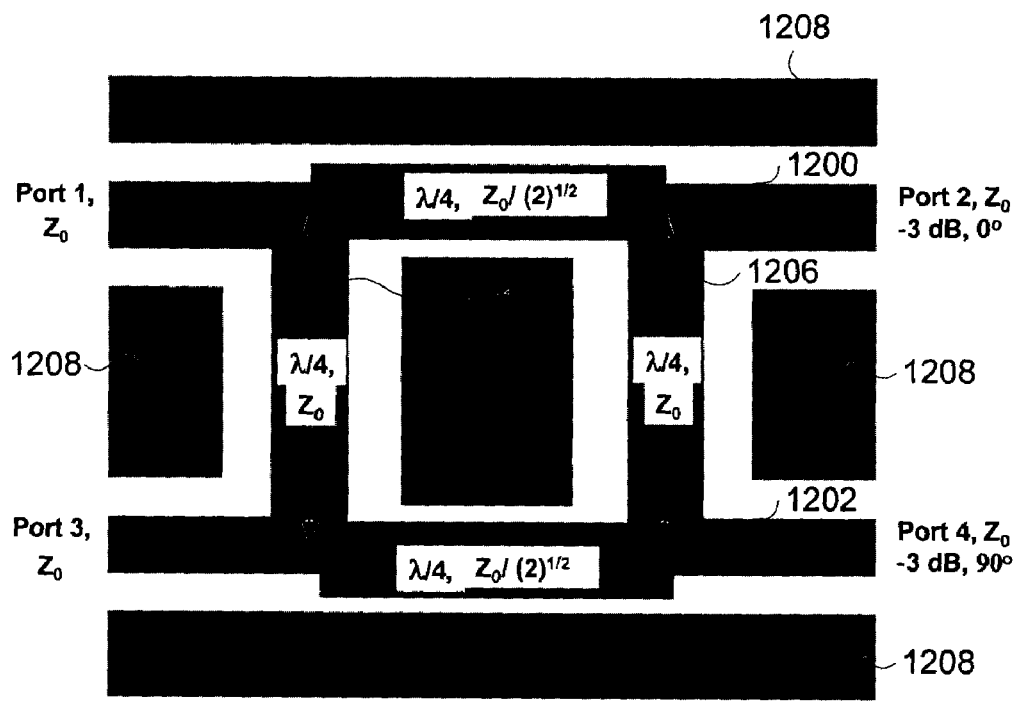
FIG. 39 depicts a plan view of a conventional four port hybrid coupler.

The classic four-port transmission-line hybrid architecture is shown in FIG. 39(a). From its architecture, it is called a "two-branch-line" coupler because it can be thought of as "through" lines 1200, 1202 (port 1 to port 2, and port 3 to port 4) with two vertical "branches" 1204, 1206 coupling them. These through lines and branches are formed by the inner conductors of coaxial elements which are surrounded by shielding conductors 1208. These shielding conducting elements are sized relative to the sizes of the inner conductors to give desired characteristic impedances. These shielding conductors may shield individual inner conductors or, to achieve higher compaction, a portion of single shielding element may be used to shield portions of multiple inner conductors. The further description of the hybrid depends on how it delivers a signal entering the input port 1 to the output port 2, and the two coupled ports, 3 and 4. The goal is generally to suppress all of the power flow into the coupled port 3. The most useful power split is generally 3 dB, or 50%, between the through port 2 and the coupled port 4. As shown in FIG. 39 the phase differences between ports 2 and 4 is 90°. This phase difference is very common in coherent communications and radar receivers in the feed network of the I (in phase) and Q (quadrature) channels.

By the principles of wave interference of single modes, the phase conditions at all three output ports can be met exactly by making the electrical lengths of the four central sections of line in FIG. 1 equal to λ/4. Then by transmission-line circuit theory, the −3-dB amplitude conditions is met when the vertical (branch) sections have characteristic impedance $Z_0$ and the horizontal sections between the branches have a characteristic impedance of $Z_0/(2)^{1/2}$. The ends of the horizontal sections have characteristic impedance of $Z_0$, which is generally 50 Ω by RF-industry standards Although simple in principle and very useful in practice, the "branch-line" coupler must be physically large because of the λ/4 requirements on the electrical length. For example, at the center of S band (2–4 GHz)—a popular band for communications and radar—the free-space wavelength is 10 cm or approximately 4 inches. So λ/4 is 1 inch, and the size of the hybrid will then be at least 1×1 inch not counting the feed lines and connectors.

Quadrature hybrids have been a standard component in the field of microwave network design. Because of their physical size, machining has been the preferred fabrication technique and machine shop techniques persist to this day with CNC-control having overtaken human-operation of required milling machines, particularly in production operation.

Starting in the 1960s hybrids began to be manufactured by microstripline techniques. This was the beginning of the era of microwave integrated circuit (MIC) technology, which allowed batch fabrication and led to much more affordable and integrable hybrids. However, the microstrip hybrid was a trade-off since its performance was not as good the best waveguide or coaxial components, as microstripline is inherently more lossy than waveguide or coax and also suffers from cross-talk between different lines lying on a common substrate. To mitigate cross talk, the different microstrip lines must have large physical separation, so the "real estate" occupied by the final hybrid is not much less than that of the waveguide or coaxial design.

Figure 40:
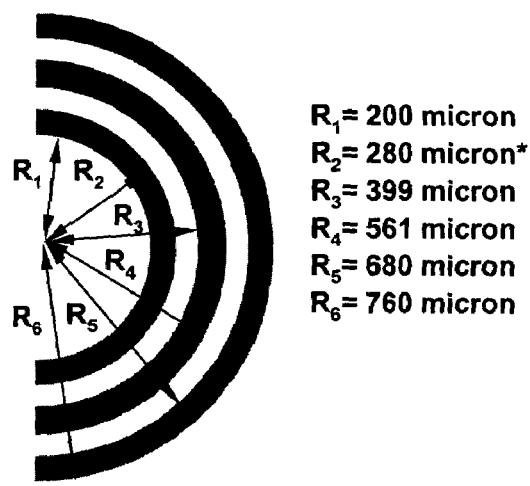
FIG. 40 depicts a plan view of a curve in a coaxial line along with dimensions.

Using electrochemical fabrication, superior coaxial structures can be fabricated that will enable superior hybrid couplers. One such structure is a curved bend having very small radius of curvature. Full-wave simulations show that curved bends have extremely low insertion loss and return loss if fabricated from single-mode coaxial line having no change in its cross section. An example bend and its dimensions are illustrated in FIG. 40. The electrical length around the bend is $\pi*R_c=\pi*480$ μm=1.508 mm and a wall thickness of 80 μm is assumed. Machining has a difficult time making such bends with a small radius of curvature because of the finite size of the end mill or other cutting tool used. Microstripline bends can not be made with a small radius of curvature because of the propensity to launch substrate modes. Such modes always exist in microstrip and, once launched, represent irreversible loss and coupling to adjacent microstrip lines sharing the same substrate. Small-radius bends are also difficult to create starting with a straight section of round coaxial line because the outer conductor is pulled in tension and the inner conductor in compression leading to metal fatigue and cracking of the metal.

Figure 41:
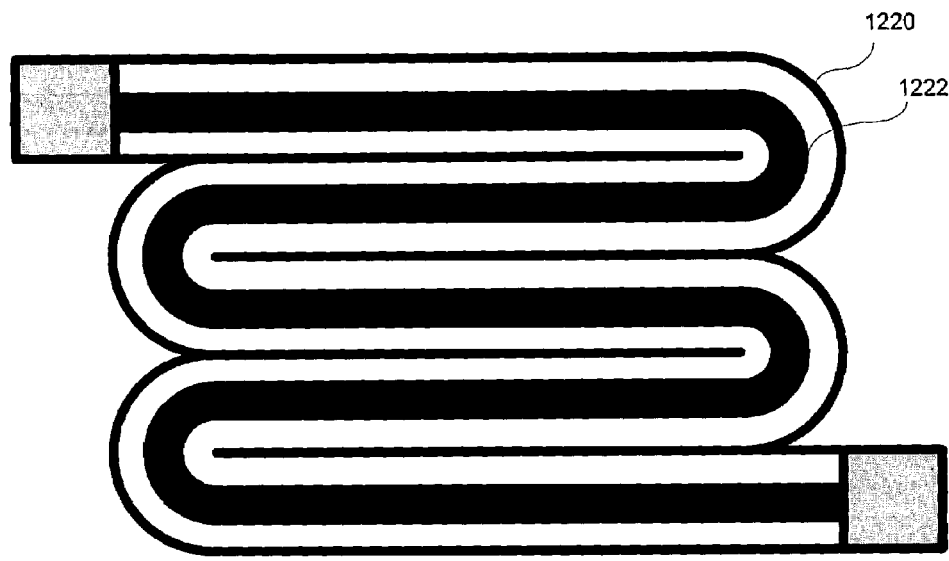
FIG. 41 depicts a plan view of a section of coaxial line having shared outer conductors along portions of the transmission line.

Given the ability to form small-radius, low-loss bends, long sections of transmission lines can be greatly reduced in physical extent by serpentine (i.e., snake-like) winding as illustrated in FIG. 41. This figure shows a plan view of a section of coaxial line having inner conductor 1222 and outer conductor 1220. One outer wall of each coaxial line can be shared between each adjacent parallel sections. As the skin depth of the RF current is so small (a few microns), this common wall can be made extremely thin. In fact in some components, the walls between lines may be reduced to a conductive mesh where the mesh has openings that have the above noted attributes.

The compact low-loss bends lead to another key advantage of an electrochemically (i.e., monolithically) produced hybrid, which is miniaturization. FIG. 41 shows how each λ/4 section of the branch-line hybrid 1212 can be made with serpentine sections to significantly reduce the overall area occupied by the hybrid compared to the conventional, straight-line one 1210. Full-wave simulations show that an excellent performance can be obtained with a branch-line compressed to a linear length of λ/12 (electrical length remains λ/4) which yields a factor of 9 compaction in area. Further compaction may also be possible.

The serpentine sections of the branch-line coupler are preferably formed in accordance with the techniques previously described. To facilitate removal of sacrificial material during fabrication, the outer shield portion of the coaxial elements may include apertures for facilitating the entry of chemical etchant to the space within the shielding structure or outer conductor.

The size and location of the apertures are preferably selected so that etching can effectively occur while minimizing losses or other disturbances in RF performance of the components or network. The apertures preferably have a small size relative to the wavelength to minimize RF losses. For example, the size may be selected such that the apertures appear to dominant coaxial mode like a waveguide having a cutoff frequency significantly higher than the mode frequency (e.g. 2 times, 5 times, 10 times, 50 times, or greater). The apertures may be located on the sides of components (e.g. transmission lines and the like) or on the tops or bottoms. They may be located uniformly along the length of a component or they may be located in groups.

Dielectric materials may be incorporated during the layer formation process to entirely fill the gaps between inner and outer conductors or to alternatively occupy relatively small selected regions between the inner and outer conductors for mechanical support. If the dielectric is relative thin (?), it may be possible to incorporate its use in the layer-by-layer E-FAB process without need for producing seed layers or the like over the dielectric material. This avoids the problem of "mushrooming" of subsequent deposited material to form bridges over the dielectric. Alternatively, bulk or selective dielectric incorporation may be achieved by back filling after layer formation is complete and etching of the sacrificial material is completed or partially completed.

In some embodiments the components may be sealed (hermetically or otherwise) or environmentally maintained or operated in such a manner so as to reduce presence of or collection of moisture or other problematic materials in critical regions.

Figure 42:
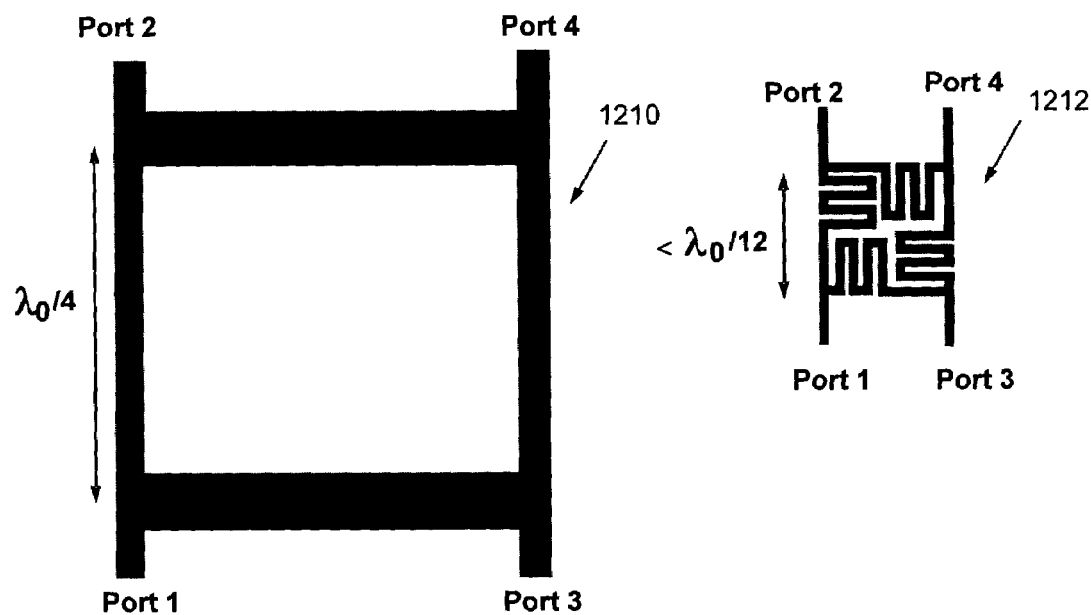
FIG. 42 shows how each λ/4 section of a branch-line hybrid can be made with serpentine sections to significantly reduce the overall area occupied by the hybrid compared to the conventional, straight-line version.

The branch line coupler illustrated in FIGS. 39 and 42 is laid out in a horizontal plane, in other implementations the serpentine structure may be stacked vertically on the substrate, or may be comprised of a combination of vertical and horizontal elements. In addition, multiple such structures may be formed on a single substrate in a batch manner and then separated prior to final assembly. Should we say something about truly 3D structures here?

Figure 43A:
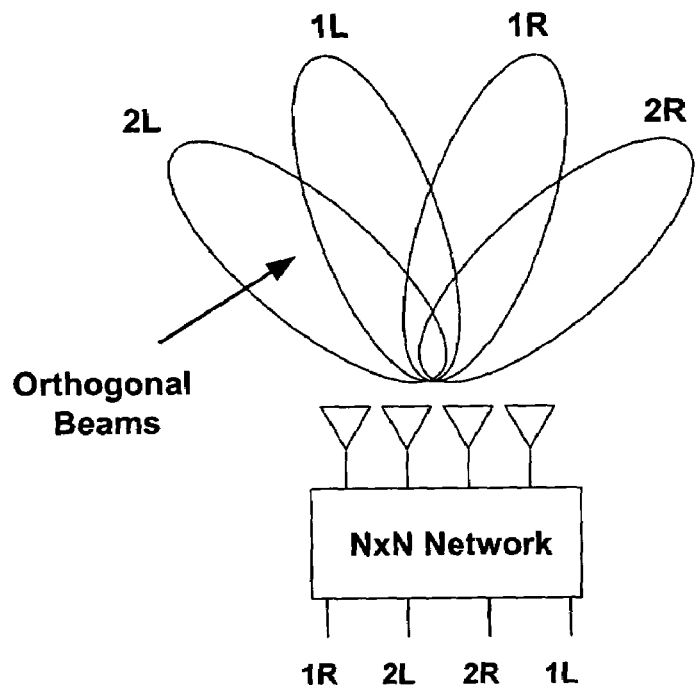
FIG. 43(a) shows a collection of 4 orthogonal beams from a 4-element linear array.

One application of the branch line coupler or hybrid of FIG. 39(b) is a Butler matrix. A Butler matrix is a passive network that may be used as feed for an antenna array. The array produces orthogonal radiation patterns (i.e., beams) in space from a one- or two-dimensional array of N antenna elements, where N is a power of 2. By "orthogonal", it is meant that the beams barely overlap such that they collectively fill a large region of space. In the ideal case, this region comprises the full 2π steradians of solid angle above the plane of the antenna array. A collection of 4 orthogonal beams from a 4-element linear array is shown notionally in FIG. 43(a).

Figure 43B:
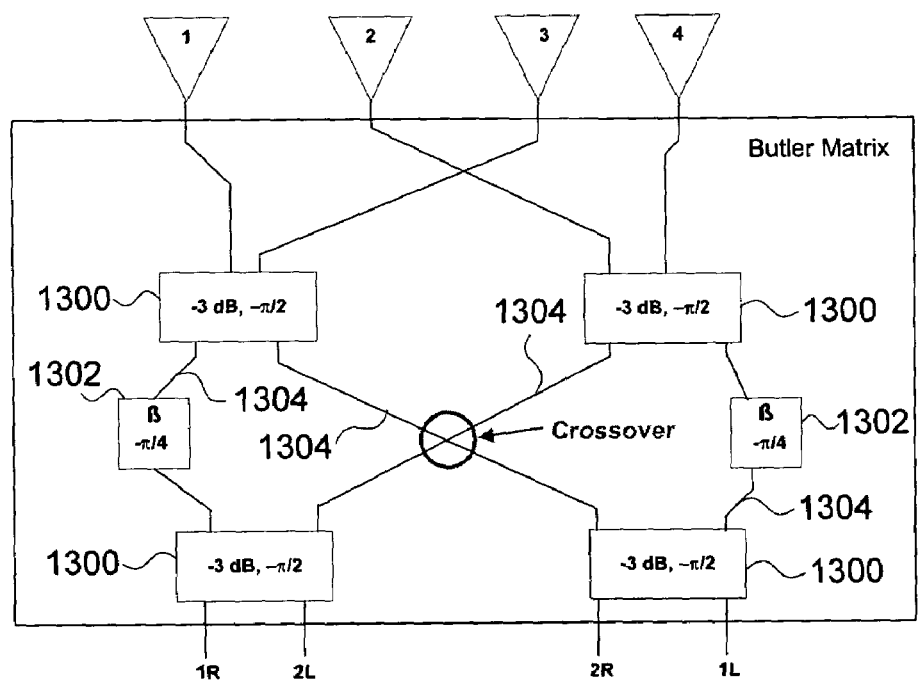
FIG. 43(b) shows a Butler array whose antenna elements have signals generated by a circuit using hybrid branch line couplers and two phase shifters.

The Butler matrix is essentially a one-to-one map between an input transmission-line port and an orthogonal beam. Steering of the beam is controlled by routing the input signal to the desired input port. This drive control may be effectively obtained by locating a power amplifier at each input and turning the power amplifiers on and off as desired thereby. An example of a circuit using hybrid branch line couplers of the type described above to generate the signals for antenna elements of a Butler array is shown in FIG. 43(b). The circuit includes four 90°, 3-dB hybrid couplers 1300, two 45° phase shifters 1302 and precise lengths of transmission-line interconnects 1304. The phase shifters are typically formed from a length of transmission line chosen to produce the desired path shifts. For example, to produce a π/4 phase shift, a length of ⅛λ is used, while to produce a −π/4 phase shift, a length of ⅞λ is used. It is noted that the crossover illustrated in FIG. 43(*b*) is simply an instance of lines crossing without being coupled. As such the crossover lines are configured such that one overlays the other. This overlaying may be achieved by forming additional layers of structure or potentially by reducing the height of the individual lines at and near the cross-over point. This narrowing of lines at the cross-over point may be achieved while maintaining unchanged characteristic impedance by adjusting the both the size of the inner width of the outer conductor and the outer width of the inner conductor. A narrowing of the transmission lines 1332, 1334 each having an outer conductor 1336 and an inner conductor 1338, near a crossover point 1330 is illustrated in FIG. 44.

Figure 43C:
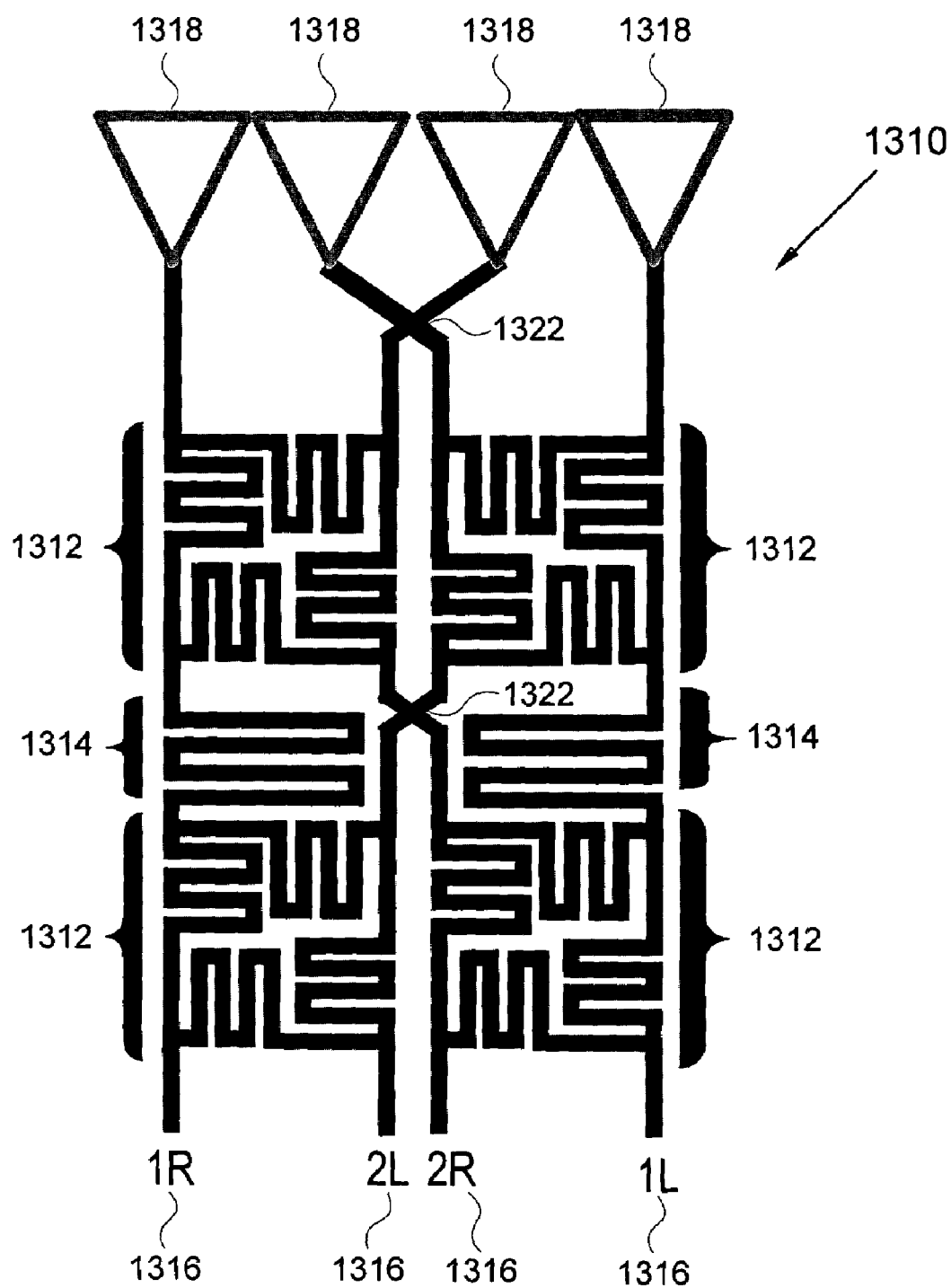
FIG. 43(c) provides a schematic representation of a four element Butler matrix antenna array using four serpentine hybrid couplers, two delay lines, and possessing two cross-overs, and four inputs, and four antenna elements (e.g. patch antennae).
Figure 44:
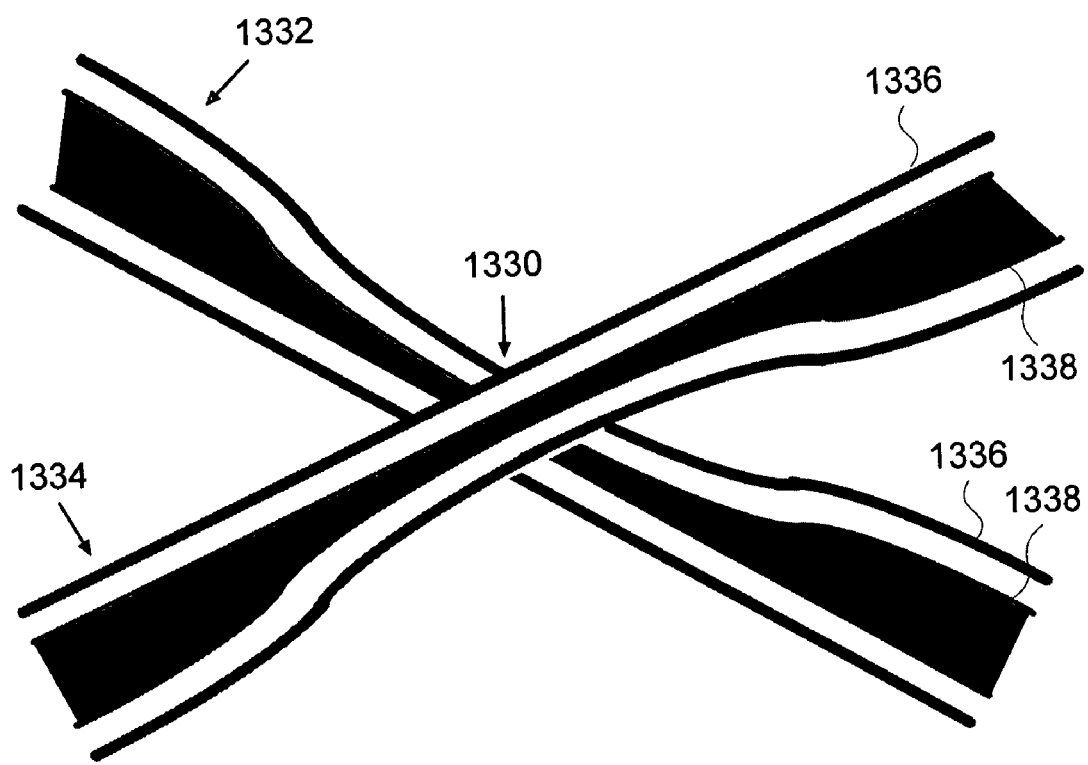
FIG. 44 illustrates a cross-over point of narrowing transmission lines which each have an outer conductor and an inner conductor.

FIG. 43(*c*) provides a schematic representation of a four element Butler matrix antenna array 1310 using four serpentine hybrid couplers 1312, two delay lines 1314, 2 crossovers 1322, 4 inputs 1316, and 4 antenna elements 1318 (e.g. patch antennae).

Figure 45:
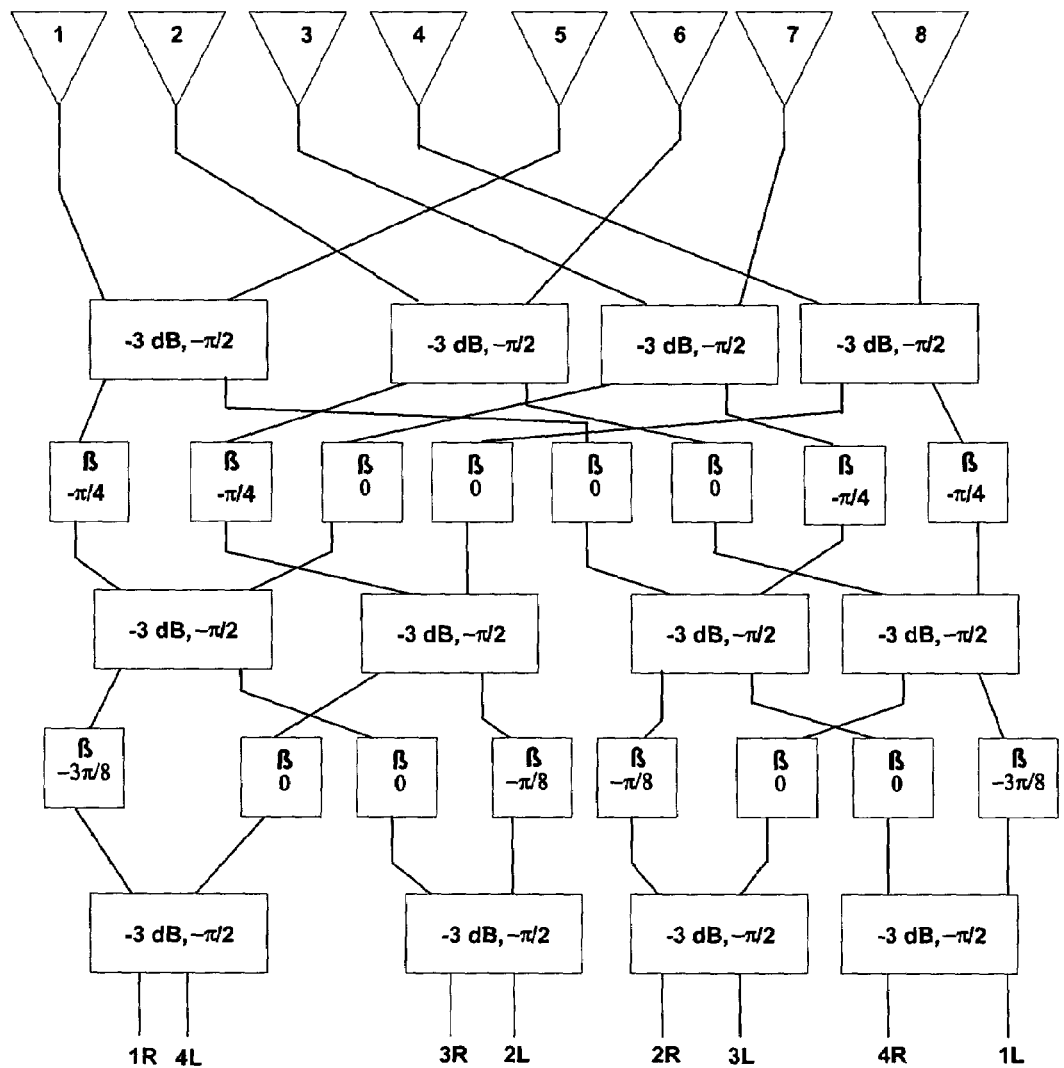
FIG. 45 provides a schematic representation of an eight input, eight antenna Butler matrix array that uses 12 hybrids, 16 phase shifters (eight of which actually produce a shift), and 8 antennae.

FIG. 45 provides a schematic representation of an eight input, eight-antenna Butler matrix antenna array that uses 12 hybrids, 16 phase shifters (eight of which actually produce a shift). As can be seen in the Figure the array also includes multiple crossovers.

The numbers of the passive components of the Butler matrix scale with the number of beams desired, such that to produce N orthogonal beams, the number of hybrids required is $(N/2)\log_2 N$. This scaling rule is analogous to the determination of the number of complex multiplications required to carry out a N-element Fourier transform. Brute force requires $N^2$ such multiplications, while the fast Fourier transform (FFT) reduces this to $N \log_2 N$. For this reason, the Butler matrix is sometimes referred to as the beam-forming analog of the FFT. Like the FFT, it greatly reduces the number of components required to make a beam-forming antenna, particularly when N is large and/or the array is two-dimensional.

The performance of conventional Butler matrix antenna arrays suffers with respect to both beam quality and bandwidth. When the amplitude and phase split of the hybrids is not exactly 3 dB and 90°, respectively, the beam quality begins to degrade, particularly in the sidelobes. The coax will mitigate this problem by using the inherent accuracy of E-FAB to produce hybrids with very low spread in amplitude or phase shift between the two output ports.

The bandwidth drawback is rather fundamental. From its very architecture, the Butler matrix should work perfectly at a given design frequency but then its beams will begin to "squint" at higher or lower frequencies. Squint means that the beams steer in radiation direction into space. Although limiting, this drawback is not the primary reason that Butler matrices have not been able to meet performance requirements in microwave systems. Rather, it is the precision issue mentioned above.

A Butler matrix using microminiature coax hybrids as described herein provides several advantages. First, the hybrids, phase shifters, the inter-connects and input and output ports may all be fabricated on the same substrate simultaneously using fabrication techniques as described above and may be also be fabricated in batch (i.e. multiple copies at a time). Further, since non-uniformities in the amplitude and phase shift of the hybrids cause a significant increase in power in the (undesired) sidelobes relative to the (desired) main lobe, the high uniformity achieved through some embodiments of the fabrication processes described herein largely eliminates non-uniformities. As a result, hybrids having a uniformity of 0.1 dB and 10 in amplitude and phase may be produced by these embodiments which largely eliminate the beam quality problems.

Figure 46:
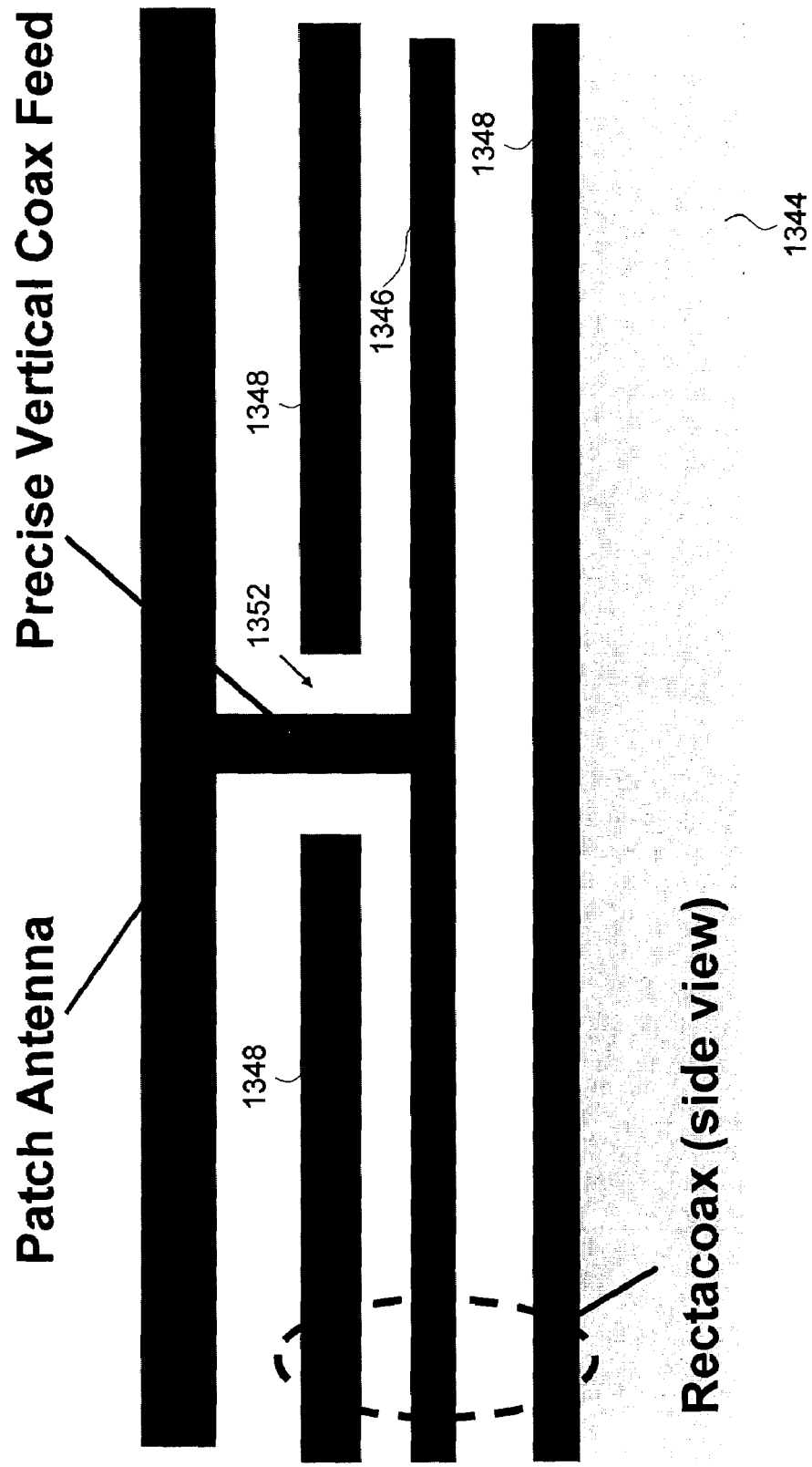
FIG. 46 provides an illustration of how a patch antenna radiating element may be attached to a coaxial feed element.

FIG. 46 provides an illustration of how a patch antenna radiating element may be generated by E-FAB monolithically with a coaxial feed element. The coaxial feed element 1342 (e.g. transmission line) is shown located above a substrate 1344. In some alternative embodiments the coaxial element may be spaced from the substrate. The coaxial feed element includes an inner conductor 1346 located between elements of an outer conductive shield 1348 (e.g. a shield with rectangular or square cross-sectional configuration) that includes a through hole 1352. An extension 1354 of the coaxial inner conductors extends from the through hole out to a planar patch antenna 1356. The vertical extension of through the hole, for example may be 100–500 microns. The size of the hole is dictated by the parasitic impedance caused by the center conductor interacting electromagnetically with the hole. The length and width of the patch is preferably in the ⅜–½λ, where λ is the wavelength in free space. Beneath the patch antenna a ground plane is preferably located. This ground plane need not be completely planar and need not be completely solid but instead may be in the form a compact array of conductive elements. The coaxial elements forming the hybrid couplers and delay lines may form all or a portion of this ground plane.

In some embodiments, small regions of dielectric (e.g. Teflon or polystyrene) may be used to help support the patches (e.g. at the corners of the patches).

If the right side of the coaxial element of FIG. 46 carries signals to and/or from the antenna, then the short length of coaxial line on the left side is preferably used to impedance-match the drive (or receive) electronics to the patch.

Figure 47:
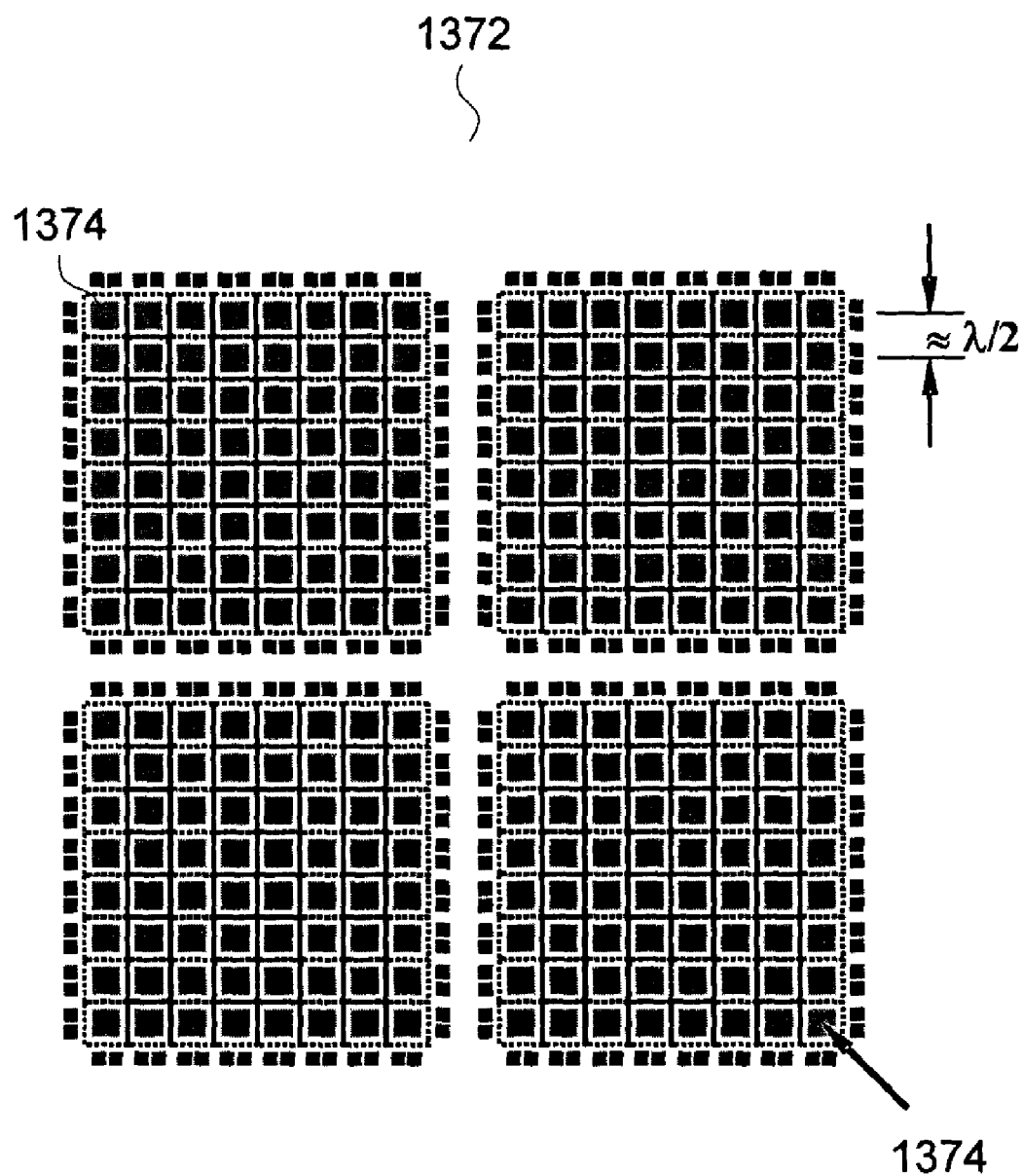
FIG. 47 depicts a substrate on which a batch of four 8 by 8 antenna arrays is formed.

FIG. 47 depicts a substrate on which a batch of four 8 by 8 antenna arrays are formed. After formation, the substrate may be diced and the arrays separated and processing then finished (completion of packaging, wire bonding, and the like). The substrate 1372 may be a wafer containing integrated circuits on to which electrochemical fabrication is to be used to build up RF components to complete formation of an RF system. The antennae 1374 may be formed above other RF components (e.g. components needed to form a Butler array).

According to some embodiments delay lines may be made in extremely compact form by causing various portions of the lines to wrap around and lay adjacent to and even share shielding conductors with adjacent line portions. In some embodiments, these lines may lay in a common plane while in other embodiments they may take a three dimensional layout by stacking lines above one another. In still other embodiments, these elements may take on spiraling patterns and the like.

Other embodiments of the present invention may involve the formation and use of waveguides and waveguide components. Some embodiments may involve the formation of discrete components that may be combined manually or automatically while may involve the formation of entire systems such as signal distribution networks and the like.

The patent applications and patents set forth below are hereby incorporated by reference herein as if set forth in full. The gist of each patent application or patent is included in the table to aid the reader in finding specific types of teachings. It is not intended that the incorporation of subject matter be limited to those topics specifically indicated, but instead the incorporation is to include all subject matter found in these applications. The teachings in these incorporated applications can be combined with the teachings of the instant application in many ways: For example, enhanced methods of producing structures may be derived from the combination of teachings, enhanced structures may be obtainable, enhanced apparatus may be derived, and the like.

U.S. patent application Ser. No. 09/488,142, filed Jan. 20, 2000, and entitled "An Apparatus for Electrochemical Fabrication Comprising a Conformable Mask" is a divisional of the application that led to the above noted '630 patent. This application describes the basics of conformable contact mask plating and electrochemical fabrication including various alternative methods and apparatus for practicing EFAB as well as various methods and apparatus for constructing conformable contact masks.

U.S. patent application Ser. No. 60/415,374, filed on Oct. 1, 2002, and entitled "Monolithic Structures Including Alignment and/or Retention Fixtures for Accepting Components" is generally directed to a permanent or temporary alignment and/or retention structures for receiving multiple components are provided. The structures are preferably formed monolithically via a plurality of deposition operations (e.g. electrodeposition operations). The structures typically include two or more positioning fixtures that control or aid in the positioning of components relative to one another, such features may include (1) positioning guides or stops that fix or at least partially limit the positioning of components in one or more orientations or directions, (2) retention elements that hold positioned components in desired orientations or locations, and (3) positioning and/or retention elements that receive and hold adjustment modules into which components can be fixed and which in turn can be used for fine adjustments of position and/or orientation of the components.

U.S. patent application Ser. No. 60/464,504, filed on Apr. 21, 2003, and entitled "Methods of Reducing Discontinuities Between Layers of Electrochemically Fabricated Structures" is generally directed to various embodiments providing electrochemical fabrication methods and apparatus for the production of three-dimensional structures from a plurality of adhered layers of material including operations or structures for reducing discontinuities in the transitions between adjacent layers. Some embodiments improve the conformance between a size of produced structures (especially in the transition regions associated with layers having offset edges) and the intended size of the structure as derived from original data representing the three-dimensional structures. Some embodiments make use of selective and/or blanket chemical and/or electrochemical deposition processes, selective and or blanket chemical and/or electrochemical etching process, or combinations thereof. Some embodiments make use of multi-step deposition or etching operations during the formation of single layers.

U.S. patent application Ser. No. 60/468,979, filed on May 7, 2003, and entitled "EFAB With Selective Transfer Via Instant Mask" is generally directed to three-dimensional structures that are electrochemically fabricated by depositing a first material onto previously deposited material through voids in a patterned mask where the patterned mask is at least temporarily adhered to a substrate or previously formed layer of material and is formed and patterned onto the substrate via a transfer tool patterned to enable transfer of a desired pattern of precursor masking material. In some embodiments the precursor material is transformed into masking material after transfer to the substrate while in other embodiments the precursor is transformed during or before transfer. In some embodiments layers are formed one on top of another to build up multi-layer structures. In some embodiments the mask material acts as a build material while in other embodiments the mask material is replaced each layer by a different material which may, for example, be conductive or dielectric.

U.S. patent application Ser. No. 60/469,053, filed on May 7, 2003, and entitled "Three-Dimensional Object Formation Via Selective Inkjet Printing & Electrodeposition" is generally directed to three-dimensional structures that are electrochemically fabricated by depositing a first material onto previously deposited material through voids in a patterned mask where the patterned mask is at least temporarily adhered to previously deposited material and is formed and patterned directly from material selectively dispensed from a computer controlled dispensing device (e.g. an ink jet nozzle or array or an extrusion device). In some embodiments layers are formed one on top of another to build up multi-layer structures. In some embodiments the mask material acts as a build material while in other embodiments the mask material is replaced each layer by a different material which may, for example, be conductive or dielectric.

U.S. patent application Ser. No. 10/271,574, filed on Oct. 15, 2002, and entitled "Methods of and Apparatus for Making High Aspect Ratio Microelectromechanical Structures" is generally directed to various embodiments of the invention presenting techniques for forming structures (e.g. HARMS-type structures) via an electrochemical extrusion (ELEX™) process. Preferred embodiments perform the extrusion processes via depositions through anodeless conformable contact masks that are initially pressed against substrates that are then progressively pulled away or separated as the depositions thicken. A pattern of deposition may vary over the course of deposition by including more complex relative motion between the mask and the substrate elements. Such complex motion may include rotational components or translational motions having components that are not parallel to an axis of separation. More complex structures may be formed by combining the ELEX™ process with the selective deposition, blanket deposition, planarization, etching, and multi-layer operations of EFAB™.

U.S. patent application Ser. No. 60/435,324, filed on Dec. 20, 2002, and entitled "EFAB Methods and Apparatus Including Spray Metal or Powder Coating Processes", is generally directed to various embodiments of the invention presenting techniques for forming structures via a combined electrochemical fabrication process and a thermal spraying process. In a first set of embodiments, selective deposition occurs via conformable contact masking processes and thermal spraying is used in blanket deposition processes to fill in voids left by selective deposition processes. In a second set of embodiments, selective deposition via a conformable contact masking is used to lay down a first material in a pattern that is similar to a net pattern that is to be occupied by a sprayed metal. In these other embodiments a second material is blanket deposited to fill in the voids left in the first pattern, the two depositions are planarized to a common level that may be somewhat greater than a desired layer thickness, the first material is removed (e.g. by etching), and a third material is sprayed into the voids left by the etching operation. The resulting depositions in both the first and second sets of embodiments are planarized to a desired layer thickness in preparation for adding additional layers to form three-dimensional structures from a plurality of adhered layers. In other embodiments, additional materials may be used and different processes may be used.

U.S. patent application Ser. No. 60/429,483, filed on Nov. 26, 2002, and entitled "Multi-cell Masks and Methods and Apparatus for Using Such Masks to Form Three-Dimensional Structures" is generally directed to multilayer structures that are electrochemically fabricated via depositions of one or more materials in a plurality of overlaying and adhered layers. Selectivity of deposition is obtained via a multi-cell controllable mask. Alternatively, net selective deposition is obtained via a blanket deposition and a selective removal of material via a multi-cell mask. Individual cells of the mask may contain electrodes comprising depositable material or electrodes capable of receiving etched material from a substrate. Alternatively, individual cells may include passages that allow or inhibit ion flow between a substrate and an external electrode and that include electrodes or other control elements that can be used to selectively allow or inhibit ion flow and thus inhibit significant deposition or etching.

U.S. patent application Ser. No. 60/429,484, filed on Nov. 26, 2002, and entitled "Non-Conformable Masks and Methods and Apparatus for Forming Three-Dimensional Structures" is generally directed to electrochemical fabrication used to form multilayer structures (e.g. devices) from a plurality of overlaying and adhered layers. Masks, that are independent of a substrate to be operated on, are generally used to achieve selective patterning. These masks may allow selective deposition of material onto the substrate or they may allow selective etching of a substrate where after the created voids may be filled with a selected material that may be planarized to yield in effect a selective deposition of the selected material. The mask may be used in a contact mode or in a proximity mode. In the contact mode the mask and substrate physically mate to form substantially independent process pockets. In the proximity mode, the mask and substrate are positioned sufficiently close to allow formation of reasonably independent process pockets. In some embodiments, masks may have conformable contact surfaces (i.e. surfaces with sufficient deformability that they can substantially conform to surface of the substrate to form a seal with it) or they may have semi-rigid or even rigid surfaces. Post deposition etching operations may be performed to remove flash deposits (thin undesired deposits).

U.S. patent application Ser. No. 10/309,521, filed on Dec. 3, 2002, and entitled "Miniature RF and Microwave Components and Methods for Fabricating Such Components" is generally directed to RF and microwave radiation directing or controlling components provided that may be monolithic, that may be formed from a plurality of electrodeposition operations and/or from a plurality of deposited layers of material, that may include switches, inductors, antennae, transmission lines, filters, and/or other active or passive components. Components may include non-radiation-entry and non-radiation-exit channels that are useful in separating sacrificial materials from structural materials. Preferred formation processes use electrochemical fabrication techniques (e.g. including selective depositions, bulk depositions, etching operations and planarization operations) and post-deposition processes (e.g. selective etching operations and/or back filling operations).

U.S. patent application Ser. No. 60/468,977, filed on May 7, 2003, and entitled "Method for Fabricating Three-Dimensional-Structures Including Surface Treatment of a First Material in Preparation for Deposition of a Second Material" is generally directed to a method of fabricating three-dimensional structures from a plurality of adhered layers of at least a first and a second material wherein the first material is a conductive material and wherein each of a plurality of layers includes treating a surface of a first material prior to deposition of the second material. The treatment of the surface of the first material either (1) decreases the susceptibility of deposition of the second material onto the surface of the first material or (2) eases or quickens the removal of any second material deposited on the treated surface of the first material. In some embodiments the treatment of the first surface includes forming a dielectric coating over the surface while the deposition of the second material occurs by an electrodeposition process (e.g. an electroplating or electrophoretic process).

U.S. patent application Ser. No. 10/387,958, filed on Mar. 13, 2003, and entitled "Electrochemical Fabrication Method and Apparatus for Producing Three-Dimensional Structures Having Improved Surface Finish" is generally directed to an electrochemical fabrication process that produces three-dimensional structures (e.g. components or devices) from a plurality of layers of deposited materials wherein the formation of at least some portions of some layers are produced by operations that remove material or condition selected surfaces of a deposited material. In some embodiments, removal or conditioning operations are varied between layers or between different portions of a layer such that different surface qualities are obtained. In other embodiments varying surface quality may be obtained without varying removal or conditioning operations but instead by relying on differential interaction between removal or conditioning operations and different materials encountered by these operations.

U.S. patent application Ser. No. 10/434,494, filed on May 7, 2003, and entitled "Methods and Apparatus for Monitoring Deposition Quality During Conformable Contact Mask Plating Operations" is generally directed to a electrochemical fabrication (e.g. EFAB) processes and apparatus are disclosed that provide monitoring of at least one electrical parameter (e.g. voltage) during selective deposition where the monitored parameter is used to help determine the quality of the deposition that was made. If the monitored parameter indicates that a problem occurred with the deposition, various remedial operations may be undertaken to allow successful formation of the structure to be completed.

U.S. patent application Ser. No. 10/434,289, filed on May 7, 2003, and entitled "Conformable Contact Masking Methods and Apparatus Utilizing In Situ Cathodic Activation of a Substrate" is generally directed to a electroplating processes (e.g. conformable contact mask plating and electrochemical fabrication processes) that includes in situ activation of a surface onto which a deposit will be made are described. At least one material to be deposited has an effective deposition voltage that is higher than an open circuit voltage, and wherein a deposition control parameter is capable of being set to such a value that a voltage can be controlled to a value between the effective deposition voltage and the open circuit voltage such that no significant deposition occurs but such that surface activation of at least a portion of the substrate can occur. After making electrical contact between an anode, that comprises the at least one material, and the substrate via a plating solution, applying a voltage or current to activate the surface without any significant deposition occurring, and thereafter without breaking the electrical contact, causing deposition to occur.

U.S. patent application Ser. No. 10/434,294, filed on May 7, 2003, and entitled "Electrochemical Fabrication Methods With Enhanced Post Deposition Processing" is generally directed to a electrochemical fabrication process for producing three-dimensional structures from a plurality of adhered layers is provided where each layer comprises at least one structural material (e.g. nickel) and at least one sacrificial material (e.g. copper) that will be etched away from the structural material after the formation of all layers have been completed. A copper etchant containing chlorite (e.g.

Enthone C-38) is combined with a corrosion inhibitor (e.g. sodium nitrate) to prevent pitting of the structural material during removal of the sacrificial material. A simple process for drying the etched structure without the drying process causing surfaces to stick together includes immersion of the structure in water after etching and then immersion in alcohol and then placing the structure in an oven for drying.

U.S. patent application Ser. No. 10/434,295, filed on May 7, 2003, and entitled "Method of and Apparatus for Forming Three-Dimensional Structures Integral with Semiconductor Based Circuitry" is generally directed to a enhanced electrochemical fabrication processes that-can form three-dimensional multi-layer structures using semiconductor based circuitry as a substrate. Electrically functional portions of the structure are formed from structural material (e.g. nickel) that adheres to contact pads of the circuit. Aluminum contact pads and silicon structures are protected from copper diffusion damage by application of appropriate barrier layers. In some embodiments, nickel is applied to the aluminum contact pads via solder bump formation techniques using electroless nickel plating. In other embodiments, selective electroless copper plating or direct metallization is used to plate sacrificial material directly onto dielectric passivation layers. In still other embodiments, structural material deposition locations are shielded, then sacrificial material is deposited, the shielding is removed, and then structural material is deposited.

U.S. patent application Ser. No. 10/434,315, filed on May 7, 2003, and entitled "Methods of and Apparatus for Molding Structures Using Sacrificial Metal Patterns" is generally directed to molded structures, methods of and apparatus for producing the molded structures. At least a portion of the surface features for the molds are formed from multilayer electrochemically fabricated structures (e.g. fabricated by the EFAB™ formation process), and typically contain features having resolutions within the 1 to 100 µm range. The layered structure is combined with other mold components, as necessary, and a molding material is injected into the mold and hardened. The layered structure is removed (e.g. by etching) along with any other mold components to yield the molded article. In some embodiments portions of the layered structure remain in the molded article and in other embodiments an additional molding material is added after a partial or complete removal of the layered structure.

U.S. patent application Ser. No. 10/434,493, filed on May 7, 2003, and entitled "Electrochemically Fabricated Structures Having Dielectric or Active Bases and Methods of and Apparatus for Producing Such Structures" is generally directed to multilayer structures that are electrochemically fabricated on a temporary (e.g. conductive) substrate and are thereafter bonded to a permanent (e.g. dielectric, patterned, multi-material, or otherwise functional) substrate and removed from the temporary substrate. In some embodiments, the structures are formed from top layer to bottom layer, such that the bottom layer of the structure becomes adhered to the permanent substrate, while in other embodiments the structures are form from bottom layer to top layer and then a double substrate swap occurs. The permanent substrate may be a solid that is bonded (e.g. by an adhesive) to the layered structure or it may start out as a flowable material that is solidified adjacent to or partially surrounding a portion of the structure with bonding occurs during solidification. The multilayer structure may be released from a sacrificial material prior to attaching the permanent substrate or it may be released after attachment.

U.S. patent application Ser. No. 10/434,103, filed on May 7, 2003, and entitled "Electrochemically Fabricated Hermetically Sealed Microstructures and Methods of and Apparatus for Producing Such Structures" is generally directed to multilayer structures that are electrochemically fabricated from at least one structural material (e.g. nickel), at least one sacrificial material (e.g. copper), and at least one sealing material (e.g. solder). In some embodiments, the layered structure is made to have a desired configuration which is at least partially and immediately surrounded by sacrificial material which is in turn surrounded almost entirely by structural material. The surrounding structural material includes openings in the surface through which etchant can attack and remove trapped sacrificial material found within. Sealing material is located near the openings. After removal of the sacrificial material, the box is evacuated or filled with a desired gas or liquid. Thereafter, the sealing material is made to flow, seal the openings, and resolidify. In other embodiments, a post-layer formation lid or other enclosure completing structure is added.

U.S. patent application Ser. No. 10/434,497, filed on May 7, 2003, and entitled "Multistep Release Method for Electrochemically Fabricated Structures" is generally directed to multilayer structures that are electrochemically fabricated from at least one structural material (e.g. nickel), that is configured to define a desired structure and which may be attached to a substrate, and from at least one sacrificial material (e.g. copper) that surrounds the desired structure. After structure formation, the sacrificial material is removed by a multi-stage etching operation. In some embodiments sacrificial material to be removed may be located within passages or the like on a substrate or within an add-on component. The multi-stage etching operations may be separated by intermediate post processing activities, they may be separated by cleaning operations, or barrier material removal operations, or the like. Barriers may be fixed in position by contact with structural material or with a substrate or they may be solely fixed in position by sacrificial material and are thus free to be removed after all retaining sacrificial material is etched.

Various other embodiments of the present invention exist. Some of these embodiments may be based on a combination of the teachings herein with various teachings incorporated herein by reference. Some embodiments may not use any blanket deposition process and/or they may not use a planarization process. Some embodiments may involve the selective deposition of a plurality of different materials on a single layer or on different layers. Some embodiments may use blanket deposition processes that are not electrodeposition processes. Some embodiments may use selective deposition processes on some layers that are not conformable contact masking processes and are not even electrodeposition processes. Some embodiments may use the non-conformable contact mask or non-contact masking 60/429,483, 497, filed on Nov. 26, 2002.

Some embodiments may use nickel as a structural material while other embodiments may use different materials such as copper, gold, silver, or any other electrodepositable materials that can be separated from the a sacrificial material. Some embodiments may use copper as the structural material with or without a sacrificial material. Some embodiments may remove a sacrificial material while other embodiments may not. In some embodiments the sacrificial material may be removed by a chemical etching operation, an electrochemical operation, or a melting operation. In some embodiments the anode may be different from the conformable contact mask support and the support may be a porous structure or other perforated structure. Some embodiments may use multiple conformable contact masks with different patterns so as to deposit different selective patterns of material on different layers and/or on different portions of a single layer. In some embodiments, the depth of deposition will be enhanced by pulling the conformable contact mask away from the substrate as deposition is occurring in a manner that allows the seal between the conformable portion of the CC mask and the substrate to shift from the face of the conformal material to the inside edges of the conformable material.

In view of the teachings herein, many further embodiments, alternatives in design and uses of the instant invention will be apparent to those of skill in the art. As such, it is not intended that the invention be limited to the particular illustrative embodiments, alternatives, and uses described above but instead that it be solely limited by the claims presented hereafter.

We claim:

1. A coaxial RF or microwave component that guides or controls a desired radiation, comprising:
   a. at least one RF or microwave radiation entry port in a conductive structure;
   b. at least one RF or microwave radiation exit port in the conductive structure;
   c. at least one passage substantially bounded on the sides by the conductive structure through which RF or microwave radiation passes when traveling from the at least one entry port to the at least one exit port;
   d. a central conductor extending along a length of the at least one passage from the entry port to the exit port; and
   wherein the conductive structure includes one or more apertures which extend from the passage to an outer region, wherein the apertures have cross-sectional dimensions that are no larger than the greater of 1/10 of a wavelength of the desired radiation or 200 microns, wherein the apertures are not intended to pass a significant amount of the desired radiation, and wherein the apertures are provided at locations where an electric field at the surface of the conductive structure when in use is less than about 20% of its maximum value within the passage.

2. The component of claim 1 wherein at least some of the apertures are used to remove a sacrificial material.

3. The component of claim 1 wherein at least some of the apertures are used to receive a dielectric that aids in retaining a desired relative position between the central conductor and the conductive structure.

4. The component of claim 1 wherein the conductive structure and the central conductor are monolithic.

5. The component of claim 1 wherein at least a portion of the central conductor or the conductive structure comprises material formed from a plurality of successively deposited and planarized layers.

6. The component of claim 1 wherein at least a portion of the central conductor or the conductive structure comprises material formed by a plurality of electrodeposition operations.

7. The component of claim 1 wherein a cross-sectional dimension of the passage perpendicular to the propagation direction of the radiation along the passage is less than about 1 mm.

8. The component of claim 7 wherein a cross-sectional dimension of the passage perpendicular to the propagation direction of the radiation along the passage is less than about 0.5 mm.

9. The component of claim 8 wherein a cross-sectional dimension of the passage perpendicular to a propagation direction of the radiation along the passage is less than about 0.2 mm.

10. The component of claim 1 wherein at least a portion of the passage has a generally rectangular shape.

11. The component of claim 1 wherein at least a portion of the central conductor has a generally rectangular shape.

12. The component of claim 1 wherein the passage extends along a three-dimensional path.

13. The component of claim 12 wherein the three-dimensional path comprises a three-dimensional spiral.

14. The component of claim 1 wherein the component comprises a hybrid coupler.

15. The component of claim 1 wherein the component comprises a delay line.

16. The component of claim 1 wherein the component comprises an antenna.

17. The component of claim 16 wherein the antenna comprises an antenna array.

18. The component of claim 16 wherein the antenna is fed by or feeds a Butler matrix.

19. The component of claim 16 wherein the antenna array comprises a patch antenna array.

20. The component of claim 16 wherein the antenna array is fed by signals propagated through a Butler matrix having multiple inputs and wherein each input to the Butler matrix is controlled by a power amplifier.

21. The component of claim 1 wherein the at least one passage comprises a serpentine form.

22. The component of claim 21 wherein the serpentine form comprises a single shared conductive shielding structure located between at least two different portions of the conductive structure.

23. The component of claim 1 wherein the at least one passage comprises at least two passages and wherein the at least two passages are located adjacent one another wherein the two passages are separated by a single conductive shielding structure.

24. The component of claim 1 wherein the conductive structure is at least in part formed using one or more of the following operations:
   a. selectively electrodepositing a first conductive material and electrodepositing a second conductive material, wherein one of the first or second conductive materials is a sacrificial material and the other is a structural material which forms at least a part of the conductive structure;
   b. electrodepositing a first conductive material, selectively etching the first conductive material to create at least one void, and electrodepositing a second conductive material to fill the at least one void, wherein at least one of the first or second conductive materials forms at least a part of the conductive structure;
   c. electrodepositing at least one conductive material, depositing at least one flowable dielectric material, and depositing a seed layer of conductive material in preparation for formation of a next layer of material, wherein the conductive material forms at least a part of the conductive structure; or
   d. selectively electrodepositing a first conductive material, then electrodepositing a second conductive material, then selectively etching one of the first or second conductive materials, and then electrodepositing a third conductive material, wherein at least one of the first, second, or third conductive materials is a sacrificial material and at least one of the remaining two conductive materials is a structural material which forms at least part of the conductive structure.

25. The component of claim 1 wherein the conductive structure is at least in part formed using one or more of the following operations:
   a. separating at least one sacrificial material from at least one structural material which forms at least a part of the conductive structure;
   b. separating a first sacrificial material from (a) a second sacrificial material and (b) at least one structural material to create a void, then filling at least a portion of the void with a dielectric material, and thereafter separating the second sacrificial material from the structural material and from the dielectric material, wherein the structural material forms at least part of the conductive structure; or
   c. filling a void in a structural material with a magnetic or conductive material embedded in a flowable dielectric material and thereafter solidifying the dielectric material, wherein the structural material forms at least part of the conductive structure.

26. The component claim 1, wherein the component comprises one or more of a low pass filter, a high pass filter, a band pass filter, a reflection base filter, an absorption based filter, a leaky wall filter, a delay line, an impedance matching structure for connecting other functional components, an antennae, a feedhorn, a directional coupler, or a combiner.

27. The component of claim 1, wherein the component comprises one or more of a microminiature coaxial component, a transmission line, a low pass filter, a high pass filter, a band pass filter, a reflection-based filter, an absorption-based filter, a leaky wall filter, a delay line, an impedance matching structure for connecting other functional components, a directional coupler, a power combiner, a power splitter, a hybrid combiner, a magic TEE, a frequency multiplexer, or a frequency demultiplexer, a pyramidal feedhorn antenna, and/or a scalar feedhorn antenna.

28. A method of manufacturing a microdevice, comprising:
   a. forming a plurality of adhered layers of material, wherein the forming of each layer of material comprises,
      i. deposition of at least a first material;
      ii. deposition of at least a second material; and
      iii. planarization of the first and second materials to a common level; and
   b. removing of at least a portion of the first or second material after formation of the plurality of layers;
   wherein a structure resulting from the formation and the removal provides at least one structure that can function as one or more of an RF or microwave control, guidance, transmission, or reception component for a desired radiation, and comprises:
      a. at least one RF or microwave radiation entry port in a conductive structure;
      b. at least one RF or microwave radiation exit port in the conductive structure;
      c. at least one passage substantially bounded on the sides by the conductive structure through which RF or microwave radiation passes when traveling from the at least one entry port to the at least one exit port;
      d. central conductor extending along a length of the at least one passage from the entry port to the exit port; and
   wherein the conductive structure includes one or more apertures which extend from the passage to an outer region, wherein the apertures have cross-sectional dimensions that are no larger than the greater of $1/10$ of a wavelength of the desired radiation or 200 microns and wherein the apertures are not intended to pass a significant amount of the desired radiation.

29. The method of claim 28 wherein the apertures are provided at locations where an electric field at the surface of the conductive structure when in use is less than about 20% of its maximum value within the passage.

30. The method of claim 28 wherein one of the first and second materials comprises a sacrificial metal and the other of the first and second materials comprises a structural metal and wherein the sacrificial metal is removed after formation of the plurality of layers.

31. A method of manufacturing a circuit for supplying signals to a passive array of N antenna elements to produce a plurality of beams, comprising:
   a. depositing a plurality of layers of material to form $(N/2)\log_2 N$ four port hybrid couplers from a plurality of adhered layers each comprising four microminiature coaxial elements, each coaxial element extending between a respective pair of ports of the hybrid coupler such that a pair of coaxial elements is coupled to each port; and
   b. connecting at least some of the hybrid couplers to other hybrid couplers via phase shifting components to form a Butler matrix.

32. The method of claim 31, wherein the deposition of each layer of material comprises:
   a. selective deposition of at least a first material;
   b. deposition of at least a second material;
   c. planarization of the first and second materials to a common level,
   wherein a plurality of layers are deposited, and
   wherein at least a portion of the first or second material is removed after deposition of the plurality of layers.

33. A Butler matrix for supplying signals to a passive array of N antenna elements to produce a plurality of beams, comprising $(N/2)\log_2 N$ four port hybrid couplers wherein each of the four hybrid couples comprise four microminiature coaxial elements, a first of the four coaxial elements extending between two of four ports, and a second of the coaxial elements extending between the other two of the four ports, while the remaining two coaxial elements extend between the first and second coaxial elements, wherein at least a portion of the length of least one of the coaxial elements is arranged in a serpentine form.

34. The Butler matrix of claim 33, wherein the serpentine form comprises a single shared shield structure between at least portions of adjacent central conductor segments of one or more coaxial elements.

* * * * *